US012748088B2

(12) United States Patent
Haick et al.

(10) Patent No.: US 12,748,088 B2
(45) Date of Patent: Sep. 29, 2026

(54) METHOD AND SYSTEM FOR DETECTION AND ANALYSIS OF CHEMICAL COMPOUNDS IN A SAMPLE SUBJECTED TO A CHROMATOGRAPHIC SEPARATION ON A LAYERED SEPARATING MEDIUM

(71) Applicant: TECHNION RESEARCH & DEVELOPMENT FOUNDATION LIMITED, Haifa (IL)

(72) Inventors: Hossam Haick, Haifa (IL); Arnab Maity, Haifa (IL)

(73) Assignee: TECHNION RESEARCH & DEVELOPMENT FOUNDATION LIMITED, Haifa (IL)

(*) Notice: Subject to any disclaimer, the term of this patent is extended or adjusted under 35 U.S.C. 154(b) by 421 days.

(21) Appl. No.: 18/578,754

(22) PCT Filed: May 3, 2022

(86) PCT No.: PCT/IL2022/050460
§ 371 (c)(1),
(2) Date: Jan. 12, 2024

(87) PCT Pub. No.: WO2023/012778
PCT Pub. Date: Feb. 9, 2023

(65) Prior Publication Data

US 2024/0337630 A1 Oct. 10, 2024

Related U.S. Application Data

(60) Provisional application No. 63/228,107, filed on Aug. 1, 2021.

(51) Int. Cl.
*G01N 30/95* (2006.01)
*G01N 30/92* (2006.01)
(Continued)

(52) U.S. Cl.
CPC ............. *G01N 30/95* (2013.01); *G01N 30/92* (2013.01); *H05K 1/16* (2013.01); *H05K 3/125* (2013.01); *H05K 2201/10151* (2013.01)

(58) Field of Classification Search
CPC ........ C09D 11/30; C09D 11/52; G01N 30/92; G01N 30/95; H05K 1/147; H05K 1/16;
(Continued)

(56) References Cited

U.S. PATENT DOCUMENTS 11,506,580 B2 * 11/2022 Lee ...................... G01N 27/333
2016/0146755 A1 * 5/2016 Crooks ............ G01N 27/44756 436/171

FOREIGN PATENT DOCUMENTS

WO 2013040636 A1 3/2013

OTHER PUBLICATIONS

Nakhleh et al; Diagnosis and Classification of 17 Diseases from 1404 Subjects via Pattern Analysis of Exhaled Molecules, ACS Nano 11 (1), pp. 112-125 .(2017). DOI: 10.1021/acsnano.6b04930.

(Continued)

*Primary Examiner* — Dirk R Bass
(74) *Attorney, Agent, or Firm* — The Roy Gross Law Firm, LLC; Roy D. Gross

(57) ABSTRACT

A method and system in the present invention allow to detect and analyse chemical compounds in a sample subjected to chromatographic separation on a layered medium. The system comprises a detector comprising an array of sensors printed on each layer of the separating medium, and providing information on the presence and properties of the tested compounds in the sample. The machine-learning methods used in the method of the invention are shown to be the methods of choice when analysing the spectrometry data, for example μGC data, in a variety of scenarios and in a variety of applications, including real-time molecular
(Continued)

analysis. These machine-learning methods can effectively learn the spectroscopic and chromatographic models taking into account various kinetic and thermodynamic parameters and by that constitute an advantageous alternative to traditional spectroscopic and chromatographic analytical methods.

20 Claims, 73 Drawing Sheets

(51) Int. Cl.
*H05K 1/16* (2006.01)
*H05K 3/12* (2006.01)

(58) Field of Classification Search
CPC . H05K 2201/0323; H05K 2201/10151; H05K 3/1216; H05K 3/125
See application file for complete search history.

(56) References Cited

OTHER PUBLICATIONS

Broza et al; "Combined Volatolomics for Monitoring of Human Body Chemistry", Scientific Reports 4, 4611 (2014). DOI: 10.1038/srep04611.
Hossain et al; Biocompatible, large-format, inkjet printed heterostructure MoS2-graphene photodetectors on conformable substrates. Npj 2D Mater. Appl. 1, 28 (2017). DOI: 10.1038/s41699-017-0034-2.
Santra,et al; "CMOS integration of inkjet-printed graphene for humidity sensing". Sci. Rep., 5, 17374 (2015). DOI: 10.1038/srep17374.
Sriprachuabwong et al.; "Inkjet-printed graphene-PEDOT:PSS modified screen printed carbon electrode for biochemical sensing". J. Mater. Chem., 22, 5478 (2012). DOI: doi.org/10.1039/C2JM14005E.
Arapov et al; "Inkjet printing of graphene". Faraday Discuss. 173,pp. 323-336 (2014). DOI: 10.1039/C4FD00067F.
Secor et al; "Enhanced Conductivity, Adhesion, and Environmental Stability of Printed Graphene Inks with Nitrocellulose". Chem. Mater., 29, pp. 2332-2340 (2017). DOI: 10.1021/acs.chemmater.7b00029.
Gharaghani et al; " A three-dimensional origami microfluidic device for paper chromatography: Application to quantification of Tartrazine and Indigo carmine in food samples" Journal of Chromatography A 1621. (2020) https://doi.org/10.1016/j.chroma.2020.461049.
Li Qun Xu et al; "Dopamine-Induced Reduction and Functionalization of Graphene Oxide Nanosheets" Macromolecules 43, pp. 8336-8339. (2010). DOI: 10.1021/ma101526k.
Lou et al; "Low-Voltage Origami-Paper-Based Electrophoretic Device for Rapid Protein Separation" analytical Chemistry. 86, pp. 12390-12397. (2014). dx.doi.org/10.1021/ac503976c.
Shiroma et al; "Separation and electrochemical detection of paracetamol and 4-aminophenol in a paper-based microfluidic device" Analytica Chimica Acta 725 pp. 44-50 . (2012). doi:10.1016/j.aca.2012.03.011.
Ge et al; "A disposable paper-based electrochemical sensor with an addressable electrode array for cancer screening". Chem. Commun., 48, pp. 9397-9399. (2012). DOI: 10.1039/c2cc34887j.
PCT International Search Report for International Application No. PCT/IL2022/050460, mailed Jul. 19, 2022, 5pp.
PCT Written Opinion for International Application No. PCT/IL2022/050460, mailed Jul. 19, 2022, 9pp.

* cited by examiner

1 – Mercapto hexanal
2 – Mercapto benzoic acid
3 – Diethanolamine
4 – Ethyl amine
5 – 2-Amino-4-chlorobenzoic acid $$G = a + b\left(1 - exp^{-\frac{t}{c}}\right) + \frac{e}{c}exp\left[\left(t_{max}\frac{c-e}{ce}\right) - \frac{t}{e}\right]$$

Hidden LSTM layer 200

Hidden LSTM layer 150

Hidden LSTM layer 50

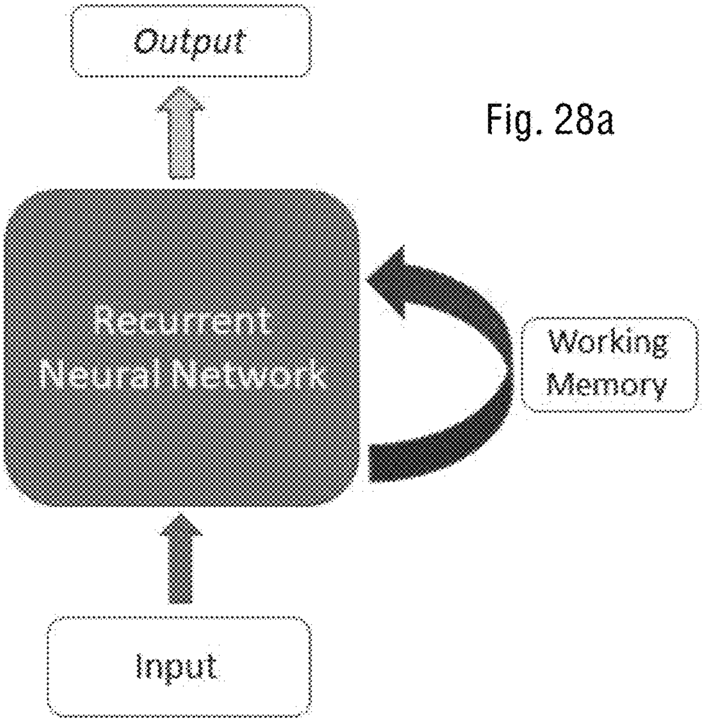
Fig. 28a
Fig. 28b
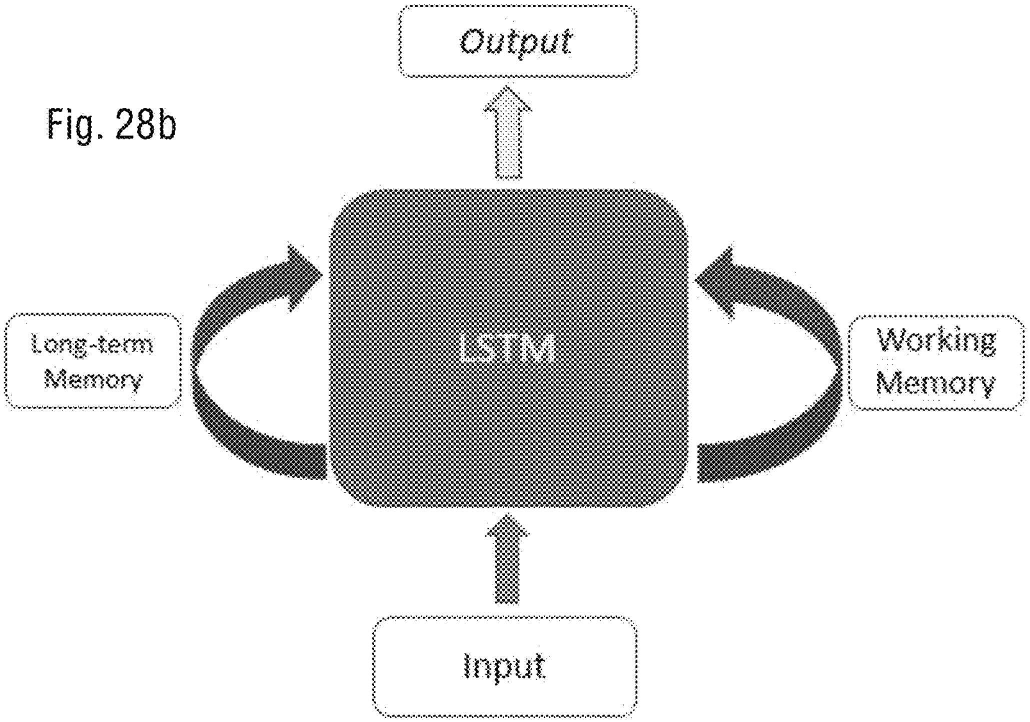

2:1 enantiomeric mixture

1:2 enantiomeric mixture

| | S(+) | R(-) | 1:1 | 2:1 | 1:2 |
|---|---|---|---|---|---|
| S(+) | 98 | | | | |
| R(-) | | 99 | | | |
| 1:1 | | | 100 | | |
| 2:1 | | | | 97 | |
| 1:2 | | | | | 97.5 |

Fig. 40e o-Xylene m-Xylene p-Xylene

1:1:1 o:m:p-xylene isomer mixture

2:1:1 o:m:p-xylene isomer mixture

1:2:1 o:m:p-xylene isomer mixture

1:1:2 o:m:p-xylene isomer mixture

| | O | m | p | 1:1:1 | 2:1:1 | 1:2:1 | 1:1:2 |
|---|---|---|---|---|---|---|---|
| O | 98 | | | | | | |
| M | | 99 | | | | | |
| p | | | 100 | | | | |
| 1:1:1 | | | | 97 | | | |
| 2:1:1 | | | | | 97.5 | | |
| 1:2:1 | | | | | | 96.5 | |
| 1:1:2 | | | | | | | 99.5 |

Fig. 41h

METHOD AND SYSTEM FOR DETECTION AND ANALYSIS OF CHEMICAL COMPOUNDS IN A SAMPLE SUBJECTED TO A CHROMATOGRAPHIC SEPARATION ON A LAYERED SEPARATING MEDIUM

CROSS REFERENCE TO RELATED APPLICATIONS

This application is a National Phase of PCT Patent Application No. PCT/IL2022/050460 having International filing date of May 3, 2022 which claims the benefit of priority of U.S. Provisional Patent Application No. 63/228,107, filed Aug. 1, 2021, the contents of which are all incorporated herein by reference in their entirety.

TECHNICAL FIELD

The present application relates to a method and system for detection and analysis of chemical compounds in a sample subjected to a chromatographic separation on a layered separating medium.

BACKGROUND

Analytical and chemical sensing tools encompass a wide range of instrumentation whose principal purpose is to analyse chemical makeup of a sample and quantity of each component within a sample1. These tools have been going endless expansion in monitoring and control mechanisms in a wide variety of uses in pharmaceutical, chemical, oil refineries, clinical, and food processing laboratories. As of today, these tools exhibit a varying degree of complexity, from comprehensive laboratory-based instrumentation to portable handheld sensor systems. New methods empowered by new materials, physics principles, biochemistry designs, or data science abound, exhibiting a constant improvement of these former established methods.

As of today, choice of sensing tool depends on intended goal of analysis, the compound(s) being targeted, and the setting mode. On the one side, large laboratory-based or even compact spectrometry or spectroscopy offers comprehensive analysis, quantitation, and identification of wide range of chemical compounds, and are highly suited to discovery studies of small inorganic and/or organic molecules. These tools are bulky and demands extensive sample pre-preparation and trained people, therefore, that are not suitable for onsite and/or direct sample analysis. On the other side of scale, low-cost sensors, whether as selective/lock-and-key devices or cross-reactive arrays in conjugation with pattern recognition methods can be tuned to respond to specific substances and/or as chemical fingerprints of mixtures. Nevertheless, current sensing technologies provide almost one single superposed response pattern, disregarding whether targeted samples contain single compound or a complex mixture of compounds. For the latter, countless possible combination of each component in a mixture, which need to be tested and trained for a reliable prediction in real sample analysis, complicates and decreases reliable prediction in real sample analysis.

For each of two sensing categories, detection of intriguing chemical molecules, such as chiral molecules, is rather difficult mission to achieve. This could be due to insufficient chiral atmosphere at host device, which, sometimes, is not enough to resolve a racemic/enantiomeric mixture easily. Use of helical geometry or chiral centre at sensor side could provide opposite directional mode of change of sensor resistance for pure enantiomeric compound. However, it remains challenging to analyse a mixture (racemic/enantiomeric) as the change of sensor resistance suppress each other due to superposition of two opposite effect.

It is also an issue of circular dichroism spectroscopic chiral recognition when polarisation of light (left/right) provides no significant rotation in presence of racemic mixture due to similar compensation effect. It is also very common that sensor exhibit same directional change with different sensitivity for two opposite handed molecules, thereby a highly challenging task to recognize wide range mixed enantiomer. Studies have tried to overcome this challenge by preceding the sensors with a chromatography column, viz. a stationary phase that separate gas-mixture to individual components and releasing them one-by-one to sensor. Nevertheless, this approach still suffers from similar drawbacks to those of conventional spectrometry. Altogether, these inherent problems limit scope of sensors for application in broader perspective and could be the reason for not achieving same success rate as spectrometry.

For high-impact applications that could be adopted by businesses, government, and individuals there is a need for a disruptive miniaturised or wearable spectrometry approach that could be suspended as stickers everywhere in our daily life (indoor, outdoor, building, human body, plants, etc.) to analyse widest spectrum of chemical compounds in a local environment, exactly as lab spectrometer do. Such system would bring remarkable proliferation both as individual systems as well as network of systems that communicate between them and probably other mobile devices over large surface areas to identify health risks, optimize agricultural production, and manage supply chains.

With present technological advancement, unmet need of multifunctional sensor in every sphere of life demands extensive research motivation. In fact, sensors and detectors are becoming essential part from human physiological monitoring to Mars exploration. Especially wearable and flexible sensors and electronics are gaining much attention as potential next generation electronic skin device for direct monitoring of various physiological parameters (such as, volatile organic compounds (VOC) emission from skin to detect various diseases, heart-beat monitoring, assessment of various liquid biomarkers from sweat/saliva/tears), epidermal vibration monitoring for sound recognition from throat, physical stimuli monitoring of limbs (temperature, humidity, strain, pressure, texture, shape sensation).

In living organism, the detection capability of various VOCs using olfactory receptor is far superior to present day electronic noses. Some recent works suggest the integration of these smell sensitive organic receptors with the artificial electronic materials could be an effective way to construct bio-hybrid sensing network. However, there are issues with long term operation, reliability, reproducibility, strict bio-friendly environment, and poor understanding about the direct replicating a whole biological smell system. Till now gas chromatography, nuclear and mass spectrometry are proven to be useful to discriminate and detect complex VOC mixture, however, it is bulky, time-consuming and demands extensive sample pre-preparation and trained people. Therefore, there is a strong and long-felt need to introduce methods capable of handling any amount of generated spectrometry data in a fast and efficient way without substantial expenses.

While the gas chromatography, nuclear and mass spectrometry are not suitable for onsite sample analysis directly from a patients' skin, breath, or other physiological samples, the room temperature operable electronic sensors arrays using carbon nanotube, 2D materials and noble metal nanoparticles can do. They are small, low power and ideal for both onsite analysis and wearable settings.

Non-invasive monitoring and early diagnosis of various diseases by wearable flexible devices opens new frontiers for distant and real time healthcare monitoring in non-clinical settings. Human skin bears a ton of information about overall physical condition of the body through skin volatile organic compounds, heartbeat, sweat components [1-2]. Therefore, monitoring of these physiological parameters with wearable/skin implantable format would be a game changer for early diagnosis of cancer, kidney/liver diseases, diabetes. Although gas chromatography is the gold standard for correctly estimating the chemical/organic compound from patients' sample, however, it is impractical to use as wearable format due to large device size and complex procedure.

Recently 2D layered material-based printed electronics (such as, graphene, transition metals, dichalcogenide) brings a lot of research and industrial attention due to their excellent mechanical flexibility in conjunction with tuneable electronic properties. However, significant industrialisations of these sensor materials are still a challenge due to the poor selectivity that causes inaccurate estimations of complex VOC mixture, greater device to device variation that restricts large scale fabrications, stringent clean room environment that increases the cost, inadequate similarity with traditional silicon electronics that restricts integration capability.

In conventional VOC sensor array measurements, each sensor in the array exhibits a certain exponential transient reaction kinetics which is the superposition of the response profile of multiple VOCs present in the mix condition, thus, it is challenging for analysing the VOC contents when the number of VOCs become higher. In particular, for real human physiological samples from breath, blood, urine and skin, the confounding and background VOCs are very large in number. Therefore, a cost effective, robust, scalable, sustainable, wearable, highly reliable technological advancement and maturity is needed for continuous monitoring of various volatile chemical/organic compounds released by human body to assess various diseases in early stage or monitoring the disease progression/remission during treatment completely non-invasively. This is also highly important for recent SARS-COV-2 virus detection and rapid isolation in cross-border and airports using breath-biopsy-chromatography analyser which could be much faster the conventional nucleic acid amplification tests (NAATs), antigen test and serology test.

SUMMARY

The present invention relates to a method for detection and analysis of chemical compounds in a sample, wherein said method comprises:

(1) subjecting the sample to chromatographic separation on a layered separating medium;

(2) detection of chemical compounds in the sample separated on the layers of said separating medium with a detector, said detector comprises an array of sensors printed on each layer of said separating medium and generates data, said data comprises a string or an array of measurement results from each said sensor on each said layer of the separating medium, said string or array of the measurement results is an input for an external memory; and (3) processing said data in the external memory by applying a machine-learning method on said measurement results to output a single bit whose value is '0' or '1', or an array of bits, or an array of integers, or an array of complex numbers, wherein said single bit, or said array of bits, or said array of integers, or said array of complex numbers corresponds to an estimated frequency, voltage, sensor conductance, electrical resistance, time of chromatographic elution, or mass-to-charge ratio, and to maximum availability or amplitude of the input, thereby providing information on the presence and properties of said compounds in the sample.

In one embodiment, said layered separating medium is a layered cellulose paper or layered nitrocellulose film. The layered separating medium may be optionally patterned. Non-limiting examples of the layered separating medium are origami or kirigami folded layer-by-layer paper or film with embedded electronics. In a specific embodiment, the origami or kirigami paper comprises a quality paper in a flexible and foldable origami or kirigami format.

In a certain embodiment, the sensors are screen-printed or inject-printed on each layer of said separating medium. In some embodiments, the physico-chemical separation is a chromatographic separation.

Non-limiting examples of said detector are a micro-gas chromatograph, miniaturised dispersive optical spectrometer, fibre-coupled optical spectrometer, micro-electromechanical system (MEMS)-based spectrometer, plasmon-enhanced Raman spectrometer, on-chip plasmonic spectrometer, piezoelectric crystal detector, and a spin-induced mass spectrometer. Said detector may further comprise one or more microfabricated components. The microfabricated components are selected from capillary or chip-based microcapillary separation columns, a source of carrier gas, pre-concentrator-injector, micro- and/or nano-optical components, MEMS components, microfluidics components, pumps, filters, and valves. The detector may yet further comprise hardware and software for instrument control, data acquisition, and analysis.

Non-limiting examples of the sensors are:

(a) thermal conductivity sensors;

(b) surface acoustic wave (SAW) sensors;

(c) chemiresistor array sensors;

(d) chemicapacitive array sensors; and (e) nanocantilever sensors.

In a particular embodiment, said sensors further comprise at least one chemical or biomolecular layer immobilised on top of said sensors and capable of binding or adsorbing said compounds from the sample. Said at least one chemical layer may comprise chemical functional groups selected from amines, alkenes, alkynes, phosphines, azides, cycloalkenes, cycloalkynes, cyclopropanes, isonitriles, vinyl boronic acid, tetrazine, maleimide, alcohols, thiols, conjugated dienes, copper acetylide, nitrones, aldehydes, ketones, alkoxyamines, hydroxylamine, hydrazine, hydrazide, isothiocyanate, carbodiimide, and carboxylic acids or derivative thereof, such as esters, anhydrides, N-hydrosuccinimide (NHS), tosyl and acyl halides. Said at least one chemical or biomolecular layer may specifically comprise cyclodextrin, 2,2,3,3-tetrafluoropropyloxy-substituted phthalocyanine or derivatives thereof, or said chemical or biomolecular layer comprises capturing biological molecules, such as primary, secondary antibodies or fragments thereof against certain proteins to be detected, or their corresponding antigens, enzymes or their substrates, short peptides, specific polynucleotide sequences, which are complimentary to the sequences of DNA to be detected, aptamers, receptor proteins or molecularly imprinted polymers. Selectivity of the sensors can be altered by changing the chemical identity of said at least one chemical or biomolecular layer.

In a specific embodiment, the compounds contained in the sample are selected from:

hydrocarbons;

alcohols;

enantiomers, spatial and structural isomers of organic compounds;

industrial solvents, such as trichloroethylene;

fuel oxygenates, such as methyl tert-butyl ether (MTBE);

by-products produced by chlorination in water treatment, such as chloroform;

petroleum fuels, hydraulic fluids, paint thinners, and dry-cleaning agents;

common ground-water contaminants;

isoprene, terpenes, pinene isomers and sesquiterpenes;

regulated ozone-depleting chlorinated hydrocarbons;

food toxins, such as aflatoxin, and shellfish poisoning toxins, such as saxitoxin or microcystin;

neurotoxic compounds, such as methanol, manganese glutamate, nitrix oxide, tetanus toxin or tetrodotoxin, Botox, oxybenzone, Bisphenol A, or butylated hydroxyanisole;

explosives, such as picrates, nitrates, trinitro derivatives, such as 2,4,6-trinitrotoluene (TNT), 1,3,5-trinitro-1,3,5-triazinane (RDX), trinitroglycerine, N-methyl-N-(2,4,6-trinitrophenyl) nitramide (nitramine or tetryl), pentaerythritol tetranitrate (PETN), nitric ester, azide, derivates of chloric and perchloric acids, fulminate, acetylide, and nitrogen rich compounds, such as tetrazene, octahydro-1,3,5,7-tetranitro-1,3,5,7-tetrazocine (HMX), peroxide, such as triacetone trioxide, C4 plastic explosive and ozonidesor, or an associated compound of said explosives, such as a decomposition gases or taggants, and biological pathogens, such as a respiratory viral or bacterial pathogen, an airborne pathogen, a plant pathogen, a pathogen from infected animals or a human viral pathogen.

In a further embodiment, the external memory is a mobile device, wearable gadget, smartphone, smartwatch, desktop computer, server, remote storage, internet storage or internet cloud. The external memory may also comprise a processor, a microcontroller or a memory-storing controller suitable for storing executable instructions, which when executed by the processor cause the processor to perform the machine-learning method on the measurement results.

In yet further embodiment, said string or said array of measurements from each said sensor on each said layer of the layered separating medium are generated from a spectrogram or chromatogram of the sample.

In another embodiment, the machine-learning method is suitable for employing a neural network selected from a fully connected neural network, a convolutional neural network, a recurrent neural network, a ResNet neural network and a neural network with attention heads. The machine-learning method may further comprise training of a neural network, on which said method is employed. In still another embodiment, the input is further treated with a wavelet transform with the different number of hidden long short-term memory layers (LSTM) of a neural network.

In another aspect of the present invention, a method for inkjet-printing of electronics and sensors on each layer of said layered separating medium comprises applying inkjet-print grade graphene oxide heterostructures to the layers of the layered separating medium and reducing said graphene oxide heterostructures with dopamine to obtain reduced graphene oxide (rGO) heterostructures. This method does not use any aggressive chemicals or reducing agents. The reducing agent in this method is dopamine, which forms poly-dopamine through self-polymerisation during the reduction reaction of GO and is thereby also suitable for use as a capping agent. Catechol groups of poly-dopamine-coated rGO are suitable for oxidation to a quinone form in weak alkaline condition and further for functionalisation with thiol or amine containing compounds either by Michel addition or Schiff-based mechanism.

The present invention describes specific embodiments of a method for processing micro-gas chromatography data of a sample containing compounds subjected to separation on an origami or kirigami paper, said data generated with a micro-gas chromatograph comprising an array of chemical sensors inkjet-printed on each layer of said origami paper, and providing information on the presence and properties of said compounds in the sample, wherein said method comprises:

(1) Subjecting the sample to chromatographic separation on said origami or kirigami paper and testing the sample with said micro-gas chromatograph to generate a string or an array of measurements from each said sensor on each said layer of the origami or kirigami paper, said string or array of the measurement results is an input for an external memory; and (2) Applying a machine-learning method on said measurement results in the external memory to output a single bit whose value is '0' or '1', or an array of bits, or an array of integers, or an array of complex numbers, wherein said single bit, or said array of bits, or said array of integers, or said array of complex numbers corresponds to an estimated frequency, voltage, sensor conductance, electrical resistance, time of chromatographic elution, or mass-to-charge ratio, and to maximum availability or amplitude of the input, thereby providing information on the presence and properties of said compounds in the sample.

In a further aspect, a detector for processing spectrometry data of a sample containing compounds subjected to a chromatographic separation on a layered separating medium, comprises an array of sensors printed on each layer of said layered separating medium, and providing information on the presence and properties of said compounds in the sample. The detector is suitable for generating chemical and physical data on detection and separation of tested chemical compounds from a sample containing said compounds on the layers of said layered separating medium. In a certain embodiment, the detector is configured to generate a string or an array of measurements from each said sensor on each said layer of the layered separating medium. The detector may further comprise one or more microfabricated components and/or embedded electronics. Non-limiting examples of said microfabricated components are capillary or chip-based microcapillary separation columns, a source of carrier gas, pre-concentrator-injector, MEMS components, micro- and/or nano-optical components, microfluidics components, pumps, filters, and valves. The detector may further comprise hardware and software for instrument control, data acquisition, and analysis. In a specific embodiment, the detector is selected from a micro-gas chromatograph, miniaturised dispersive optical spectrometer, fibre-coupled optical spectrometer, MEMS-based spectrometer, plasmon-enhanced Raman spectrometer, on-chip plasmonic spectrometer, piezoelectric crystal detector, and spin-induced mass spectrometer. In a particular embodiment, the detector is embedded in the layered separating medium. In some embodiments, the detector is in a form of a paper card with embedded electronics.

In yet further aspect of the present invention, a system for detection and analysis of chemical compounds in a sample subjected to a chromatographic separation on a layered separating medium, said system comprises:

(a) the layered separating medium for chromatographic separation of the compounds contained in the sample and for providing physical support of an embedded electronics and detector;
(b) the detector comprising an array of sensors printed on each layer of said separating medium, and providing information on the presence and properties of said compounds in the sample;
(c) the embedded electronics printed on each layer of said separating medium; and
(d) an external memory.

In some embodiment, communication between the sensors and the external memory of the system of the present invention is either passive or active, or combination thereof. When the communication between the sensors and the external memory is passive, the system is configured to perform a spectral encoding of information using a single radiative structure with multiple resonators each of which is dedicated either to a bit encoding or to a sensor readout. When the communication between the sensors and the external memory is active, the system is configured to carry out a parallel route for powering and communicating between the sensors and external memory using a semiconductor device.

The aforementioned embedded electronics may comprise at least one of the following components:

(1) a voltage source connected to said detector and said sensors via a microelectronic circuit for supplying electric current to said detector and sensors;
(2) an integrated or CMOS current amplifier connected to said voltage source for amplification of an electric current obtained from said detector and said sensors;
(3) an analogue-to-digital converter (ADC) with in-built digital input/output card connected to said current amplifier for outputting the converted signal to the external memory; and
(4) a wired or wireless connection module for connecting said system to said external memory.

The connection module may be wireless for wireless connection of said system with the external memory. The external memory may comprise another wireless connection module connecting said system to a user interface via a digital-to-analogue converter (DAC). In some embodiments, both wireless connection modules are either Bluetooth or NFC, thereby providing wireless communication between the sensors and the readout module for up to 20 m. If these two modules are Wi-Fi, the connection between them can be established for up to 200 m, while the GSM may provide the worldwide communication.

In another embodiment, the system of the present invention further comprises at least one of: (i) a feedback control microcontroller unit (MCU) for energy level adjustment and de-trapping via an external or integrated gate electrode; (ii) a harvester for harvesting energy of the system; (iii) a power management unit (PMU) for transforming said harvested energy and powering an analogue read-out of the sensors; (iv) an analogue front-end; and (v) a gate electrode for discharging parasitic electric current. In a particular embodiment, the system further comprises a remote powering with miniaturised receiver antenna.

The system may further comprise at least one radio-frequency identification (RFID) out-input tag for remote readout and zero-power operation, each RFID tag connected to said embedded electronics via an electric circuit for receiving or transmitting a signal. In a particular embodiment, this RFID system further comprises:

(1) a diode input-output separator to separate polarities in said circuit; and
(2) an integrated circuit for storing and processing said signal, and for modulating and demodulating radio-frequency (RF) signals.

In still another embodiment, the external memory is a mobile device, wearable gadget, smartphone, smartwatch, desktop computer, server, remote storage, internet storage or internet cloud. The external memory may comprise a processor, a microcontroller or a memory-storing controller suitable for storing executable instructions, which when executed by the processor cause the processor to perform the machine-learning method on the measurement results.

Various embodiments may allow various benefits and may be used in conjunction with various applications. The details of one or more embodiments are set forth in the accompanying figures and the description below. Other features, objects and advantages of the described techniques will be apparent from the description and drawings and from the claims

BRIEF DESCRIPTION OF THE DRAWINGS

Disclosed embodiments will be understood and appreciated more fully from the following detailed description taken in conjunction with the appended figures. The drawings included and described herein are schematic and are not limiting the scope of the disclosure. It is also noted that in the drawings, the size of some elements may be exaggerated and, therefore, not drawn to scale for illustrative purposes. The dimensions and the relative dimensions do not necessarily correspond to actual reductions to practice of the disclosure.

FIGS. 1*a*-1*d* show the butterfly wing and an enlarged area of this wing that constitutes a structurally layered pattern used in the layered separating medium of the present invention.

FIG. 9*a* shows the silver nanowire electrodes printed on paper, and FIG. 9*b* shows the sensor layout after graphene printing including the chiral/achiral FDrGO ink printed among silver nanowire based multijunction printed electrodes (4×5 matrix where each black pixel in the array signifies the specific ligand modified FDrGO).

FIG. 9*c* shows the magnification of one of the sensor layers with 20 ligands after graphene printing from FIG. 9*b*.

FIGS. 9*d*-9*e* show the micro-processor-based computing unit with nanowires printed on the same paper.

FIG. 16*a* shows the typical direct exposure sensing performance for methanol (6.9-13.8 ppb), and FIG. 16*b* shows other alcohol mixtures (methanol (M), ethanol (E) and isopropanol (I) for 6.9 ppb in pure (e.g., 6.9:0:0) and multiplied in the mixture in the ratio of 1:0:0, 0:1:0, 0:0:1, 2:1:1, 1:2:1, 1:1:2. FIG. 16*c* shows the comparative sensing performance of typical 1:1:1 mix vapours (E:M:I) for the direct exposure and the μGC-based detector exposure of the present invention at the second layer.

FIGS. 28*a*-28*b* illustrate the comparison of the typical RNN vs LSTM.

FIG. 40*e* shows the classification efficiency of each ratio of the enantiomers of 2-butanol with the accuracy of approximately 94% from the trained model.

FIGS. 41*a*-41*c* show the synthetic image colormaps of three structural isomers of xylene (ortho, meta and para), respectively. FIGS. 41*d*-41*g* show the images of xylene's different isomer mixtures.

FIG. 41*h* shows the classification efficiency of each xylene's isomers ratio from the trained model with the accuracy of about 94%.

DETAILED DESCRIPTION

Figure 1A:
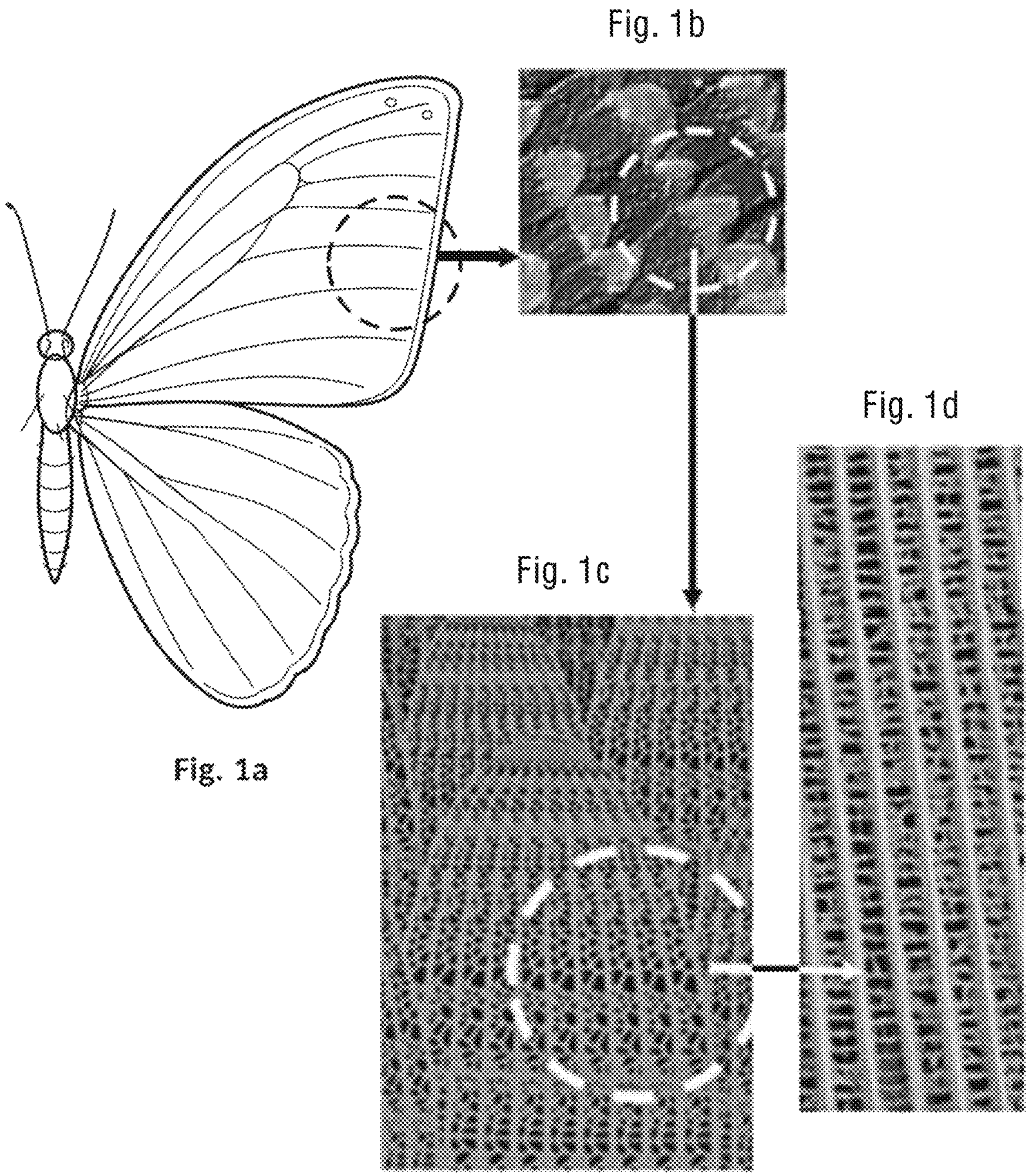

In the following description, various aspects of the present application will be described. For purposes of explanation, specific configurations and details are set forth in order to provide a thorough understanding of the present application. However, it will also be apparent to one skilled in the art that the present application may be practiced without the specific details presented herein. Furthermore, well-known features may be omitted or simplified in order not to obscure the present application.

The term "comprising", used in the claims, is "open ended" and means the elements recited, or their equivalent in structure or function, plus any other element or elements which are not recited. It should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising x and z" should not be limited to devices consisting only of components x and z. Also, the scope of the expression "a method comprising the steps x and z" should not be limited to methods consisting only of these steps.

Unless specifically stated, as used herein, the terms "about" and "approximately" are understood as within a range of normal tolerance in the art, for example within two standard deviations of the mean. In one embodiment, the term "about" means within 10% of the reported numerical value of the number with which it is being used, preferably within 5% of the reported numerical value. For example, the term "about" can be immediately understood as within 10%, 9%, 8%, 7%, 6%, 5%, 4%, 3%, 2%, 1%, 0.5%, 0.1%, 0.05%, or 0.01% of the stated value. In other embodiments, the term "about" can mean a higher tolerance of variation depending on for instance the experimental technique used. Said variations of a specified value are understood by the skilled person and are within the context of the present invention. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges, for example from 1-3, from 2-4, and from 3-5, as well as 1, 2, 3, 4, 5, or 6, individually. This same principle applies to ranges reciting only one numerical value as a minimum or a maximum. Unless otherwise clear from context, all numerical values provided herein are modified by the term "about". Other similar terms, such as "substantially", "generally", "up to" and the like are to be construed as modifying a term or value such that it is not an absolute. Such terms will be defined by the circumstances and the terms that they modify as those terms are understood by those of skilled in the art. This includes, at very least, the degree of expected experimental error, technical error and instrumental error for a given experiment, technique or an instrument used to measure a value.

As used herein, the term "and/or" includes any and all combinations of one or more of the associated listed items. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached to", "connected to", "coupled with", "contacting", etc., another element, it can be directly on, attached to, connected to, coupled with or contacting the other element or intervening elements may also be present. In contrast, when an element is referred to as being, for example, "directly on", "directly attached to", "directly connected to", "directly coupled" with or "directly contacting" another element, there are no intervening elements present. It will also be appreciated by those of skill in the art that references to a structure or feature that is disposed "adjacent" another feature may have portions that overlap or underlie the adjacent feature.

The term "compound/s", "tested compound/s" or "chemical compound/s" used in the present application are entirely equivalent and encompass virtually any chemical and biomolecular compound, including but not limited to organic compounds, volatile organic compounds (VOCs), biochemicals, etc. By common definition, "chemical compound is any substance composed of identical molecules (that can be biomolecules as well) consisting of atoms of two or more chemical elements". Non-limiting examples of chemical compounds being tested in the present invention and then included in a library of micro-GC patterns of the present invention are:

hydrocarbons;

alcohols;

enantiomers and structural isomers of organic compounds;

industrial solvents, such as trichloroethylene;

fuel oxygenates, such as methyl tert-butyl ether (MTBE);

by-products produced by chlorination in water treatment, such as chloroform;

petroleum fuels, hydraulic fluids, paint thinners, and dry-cleaning agents;

common ground-water contaminants;

isoprene, terpenes, pinene isomers and sesquiterpenes;

regulated ozone-depleting chlorinated hydrocarbons;

food toxins, such as aflatoxin, and shellfish poisoning toxins, such as saxitoxin or microcystin;

neurotoxic compounds, such as methanol, manganese glutamate, nitrix oxide, tetanus toxin or tetrodotoxin, Botox, oxybenzone, Bisphenol A, or butylated hydroxyanisole;

explosives, such as picrates, nitrates, trinitro derivatives, such as 2,4,6-trinitrotoluene (TNT), 1,3,5-trinitro-1,3,5-triazinane (RDX), trinitroglycerine, N-methyl-N-(2,4,6-trinitrophenyl) nitramide (nitramine or tetryl), pentaerythritol tetranitrate (PETN), nitric ester, azide, derivates of chloric and perchloric acids, fulminate, acetylide, and nitrogen rich compounds, such as tetrazene, octahydro-1,3,5,7-tetranitro-1,3,5,7-tetrazocine (HMX), peroxide, such as triacetone trioxide, C4 plastic explosive and ozonidesor, or an associated compound of said explosives, such as a decomposition gases or taggants, and biological pathogens, such as a respiratory viral or bacterial pathogen, an airborne pathogen, a plant pathogen, a pathogen from infected animals or a human viral pathogen.

Figure 2:
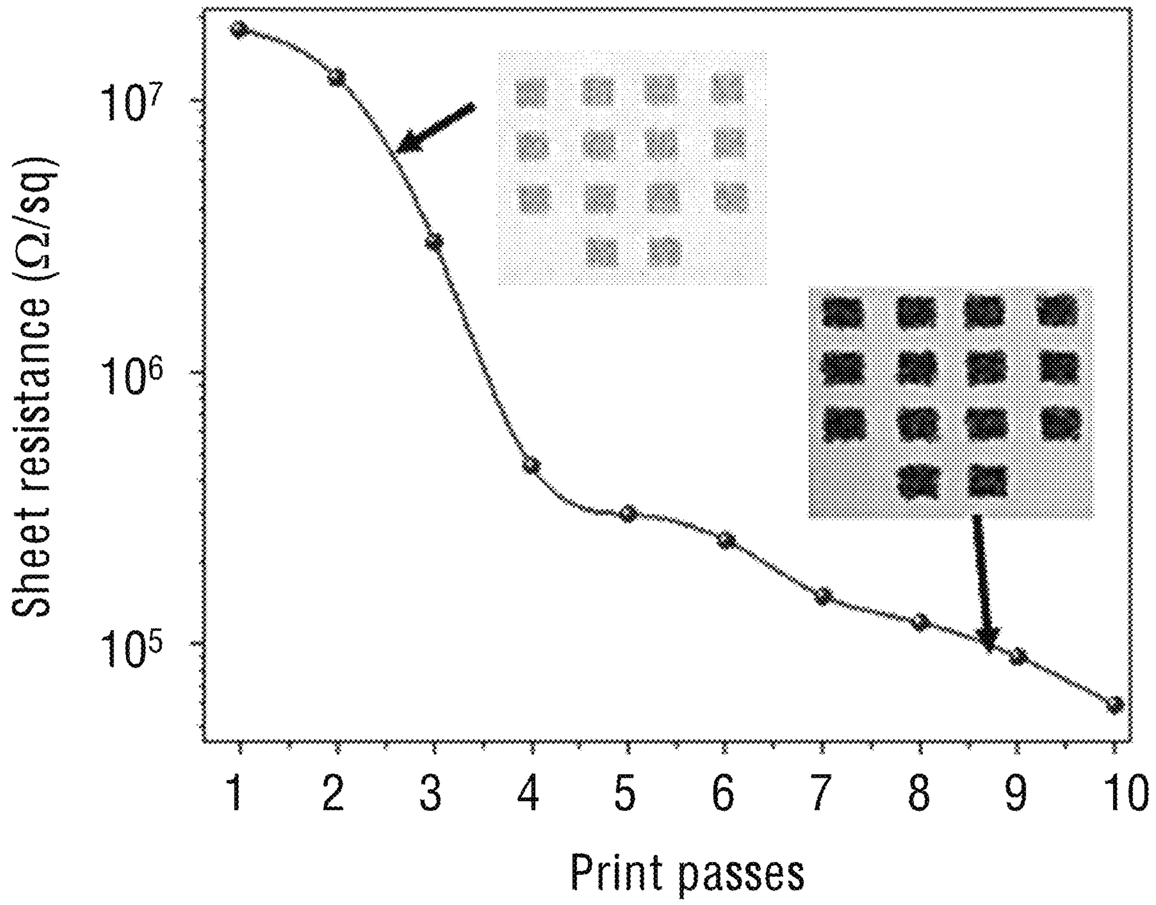
FIG. 2 shows the typical resistance variation upon various print passes of graphene sensors on free-standing films made of cellulose fibres with inkjet-printed components for effective semi-separation and instantaneous detection of various molecules from a complex analyte mixture FIGS. 3*a*-3*b* schematically show a comparison of sensing profile with FIG. 3*a* shows the origami-based architecture of the present invention for simultaneous sensing and separation by generating multiple peaks of each individual volatile organic compound (VOC) component in the mixture, and FIG. 3*b* showing conventional measurements where superposition of multiple VOCs provides exponential response kinetics.

The present invention relates to design and examination of spatiotemporal nano/micro-structural arrangement that is inspired by origami, kirigami and also bio-inspired by a butterfly wing for endowing real-time and miniaturised sensors with capabilities of miniaturised spectrometers towards complex structural and chiral molecules. FIGS. 1*a*-1*d* show the butterfly wing and an enlarged area of this wing that constitutes a structurally layered pattern used in the layered separating medium of the present invention. Principal notion of this approach relies on time-space resolved analysis of spectrometry data via hierarchically stacked geometrical configuration layers of functionalised array of sensors. Non-limiting example of the material used in the printed sensors of the present invention is graphene. The sensors are either inject-printed or screen-printed on the layered separating medium. FIG. 2 shows the typical resistance variation upon various print passes of graphene sensors on free-standing films made of cellulose fibres with inkjet-printed components for effective semi-separation and instantaneous detection of various molecules from a complex analyte mixture.

In one aspect, the present invention directs at a method and system for detection and analysis of chemical compounds in a sample, wherein said method comprises:

(1) Subjecting the sample to the chromatographic separation on a layered separating medium;

(2) Detection of chemical compounds in the sample separated on the layers of said separating medium with a detector, said detector comprises an array of sensors printed on each layer of said separating medium and generates data, said data comprises a string or an array of measurement results from each said sensor on each said layer of the separating medium, said string or array of the measurement results is an input for an external memory; and (3) Processing said data in the external memory by applying a machine-learning method on said measurement results to output a single bit whose value is '0' or '1', or an array of bits, or an array of integers, or an array of complex numbers, wherein said single bit, or said array of bits, or said array of integers, or said array of complex numbers corresponds to an estimated frequency, voltage, sensor conductance, electrical resistance, or time of chromatographic elution, mass-to-charge ratio, nuclear magnetic resonance shift, and to maximum availability or amplitude of the input, thereby providing information on the presence and properties of said compounds in the sample.

Throughout the description, the terms "spintronics spectroscopy" or "spintronics spectrometry" are used to refer to any spectroscopic technique or instrument, relatively, based on measuring the intrinsic spin of electron and its associated magnetic moment, in addition to its fundamental electronic charge, in solid-state devices. The field of spintronics spectroscopy concerns spin-charge coupling in physical systems. Spintronics fundamentally differs from traditional electronics in that, in addition to charge state, electron spins are exploited as a further degree of freedom, with implications in the efficiency of data storage and transfer. Spintronic systems are of particular interest in the field of quantum computing and miniaturised spectroscopic devices, for example, nano-nuclear magnetic resonance spectrometer or spin-induced mass spectrometer.

Throughout the description, the terms "MEMS-based spectroscopy" or "MEMS-based spectrometry" are used to refer to any spectroscopic technique or instrument, relatively, that uses a special discrete-time measuring principle which makes it possible to scan a spectrum with a single highly sensitive detector only by the rotational movement of the integrated micro-electro-mechanical system (MEMS) grating.

Throughout the description, the term "piezoelectric crystal detector" refers to the detector that detects the mass of chemical vapours absorbed into chemically selective coatings. It comprises an array of surface acoustic wave (SAW) sensors designed to detect changes in propagation characteristics of acoustic waves near the surface of a piezoelectric material, such as quartz.

In one embodiment, the layered separating medium is a layered cellulose paper or layered nitrocellulose film. The layered separating medium may be optionally patterned, and may be in a form of origami or kirigami, as will be explained below. In some embodiments, the physico-chemical separation is a chromatographic separation as will also be explained below.

In a particular embodiment, a method for processing micro-gas chromatography data of a sample containing chemical compounds subjected to separation on an origami or kirigami paper, said data generated with a micro-gas chromatograph comprising an array of sensors inkjet-printed on each layer of said origami or kirigami paper, and providing information on the presence and properties of said chemical compounds in the sample, comprises:

(1) Subjecting the sample to chromatographic separation on said origami or kirigami paper and testing the sample with said micro-gas chromatograph to generate a string or an array of measurements from each said sensor on each said layer of the origami or kirigami paper, said string or array of the measurement results is an input for an external memory; and (2) Applying a machine-learning method on said measurement results in the external memory to output a single bit whose value is '0' or '1', or an array of bits, or an array of integers, or an array of complex numbers, wherein said single bit, or said array of bits, or said array of integers, or said array of complex numbers corresponds to an estimated frequency, voltage, sensor conductance, or time of chromatographic elution, and to maximum availability or amplitude of the input, thereby providing information on the presence and properties of said chemical compounds in the sample.

Throughout the description, the term "micro-gas chromatograph" (μGC) is used to refer to any field portable versions of a GC comprising one or more microfabricated components, selected from capillary or microcapillary separation columns, a source of carrier gas, pre-concentrator-injector, detector, pump, valves, and filters. The μGC may further comprise software for instrument control, data acquisition, and analysis.

The external memory according to the present invention can be, for example, a mobile device, wearable gadget, smartphone, smart watch, desktop computer, server, remote storage, internet storage, or internet cloud.

In the present invention, the inventors have developed all hybrid electronic sensing system printed on a layered separating medium suitable for separating complex mixtures, for example paper, cellulose or nitrocellulose film, in a flexible origami or kirigami format to conduct spectroscopic measurements in time space resolved hierarchical manner. The developed strategy shows its huge potential for simultaneous separation and discrimination of various complex mix organic compounds (for example, alcohols, ketones, aldehydes, organic acids, hydrocarbons) using layer by layer approach by modulating the mass transport phenomena of wide range VOCs.

Figure 3A:
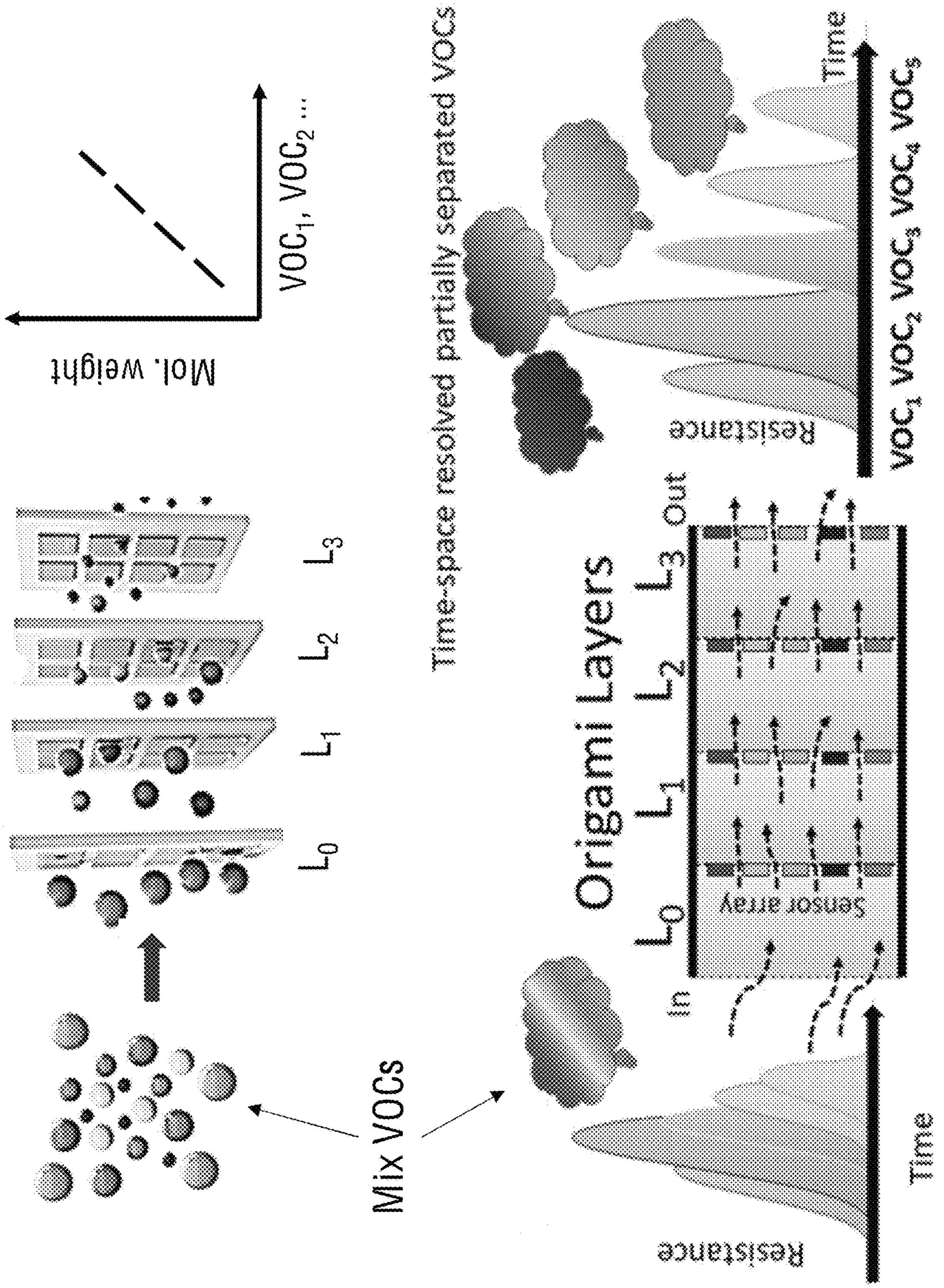
Figure 3B:
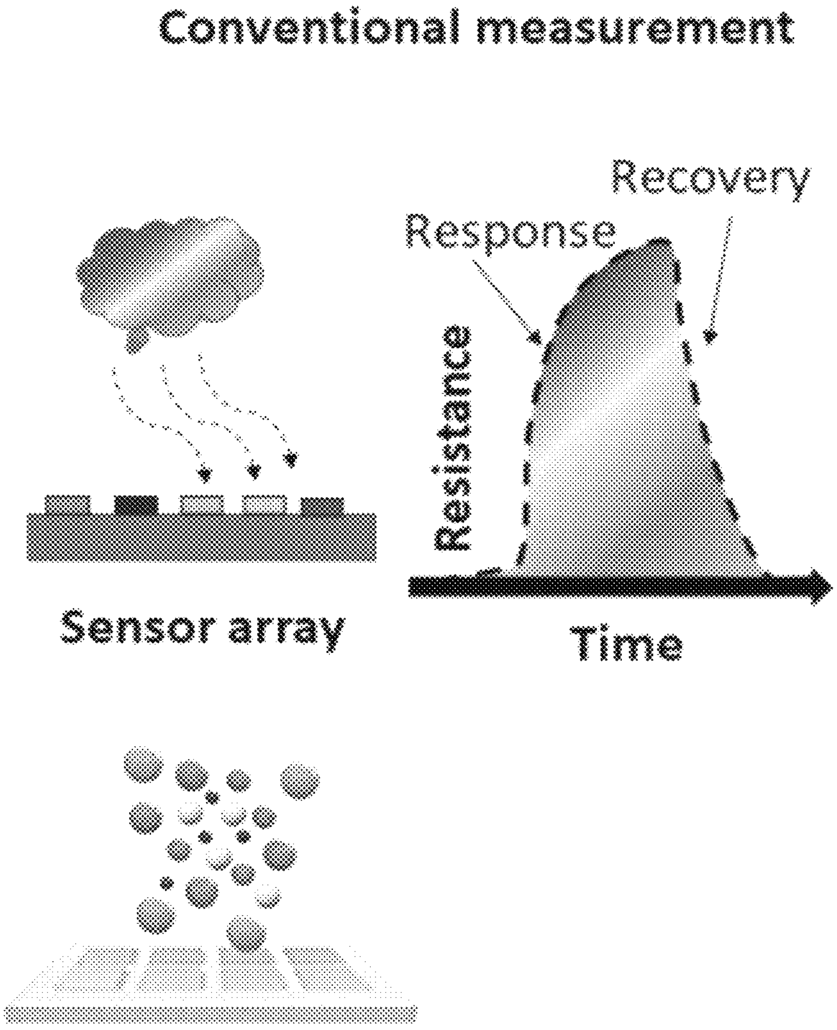
Figure 4A:
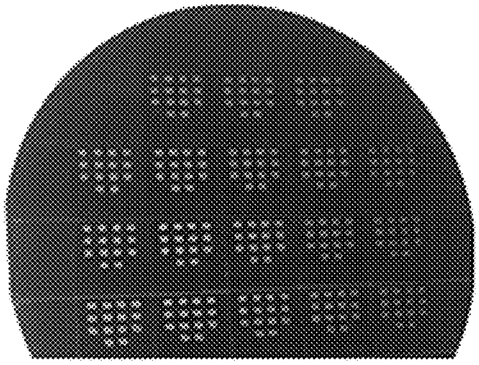
FIGS. 4*a*-4*g* show the photographs of the large-scale printing of the dried hybrid graphene oxide ink (DrGO) on various untreated substrates: (4*a*) $Si/SiO_2$ wafer, (4*b*) Kapton, (4*c*) PDMS rubber polymer, (4*d*) glass, (4*e*) transparent PET, (4*f*) Wattman filter paper, and (4*g*) office paper.
Figure 4B:
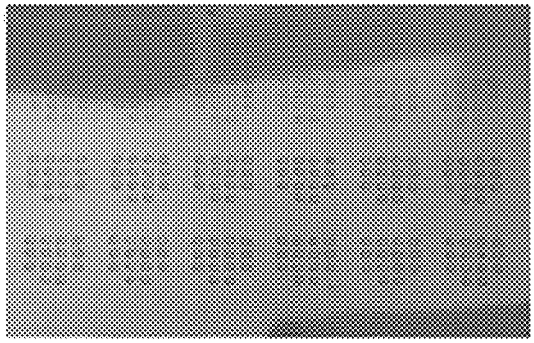
Figure 4C:
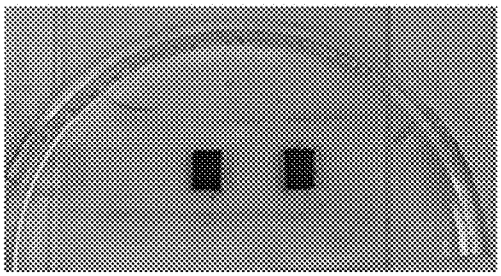
Figure 4D:
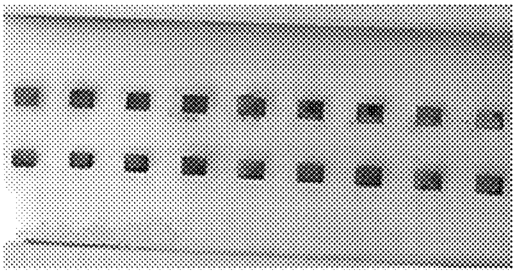
Figure 4E:
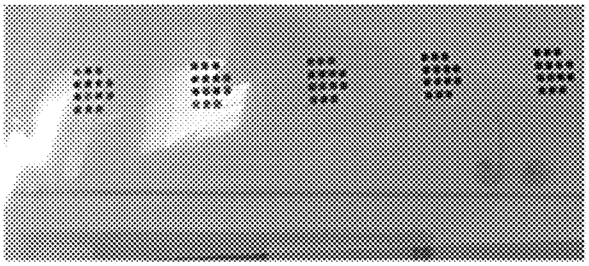
Figure 4F:
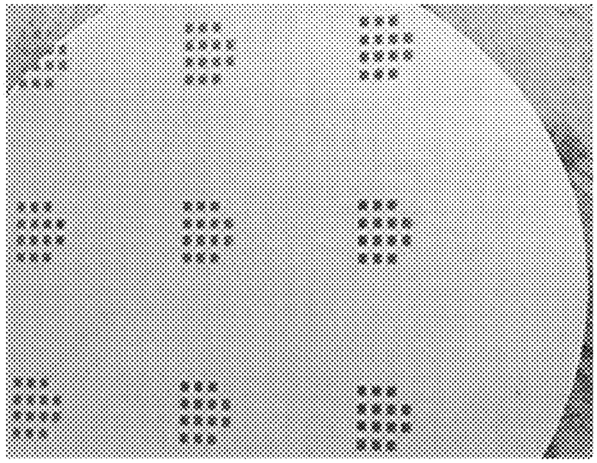
Figure 4G:
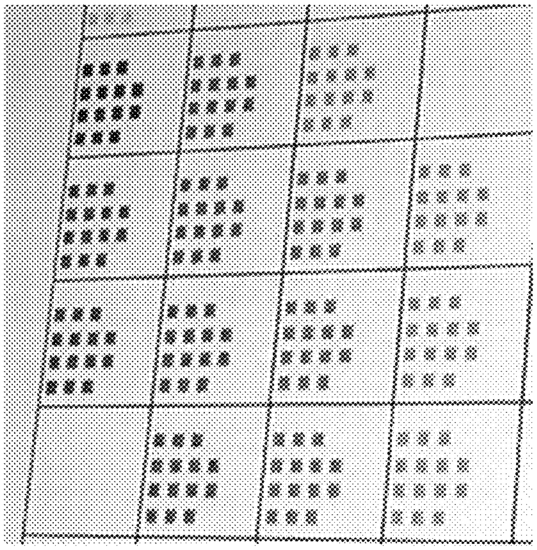

In conventional sensor/sensor array measurements, each sensor in the array exhibits an exponential transient reaction kinetics which is the superposition of the response profile of multiple VOCs present in the mix condition, thus, it is challenging for analysing the VOC contents when the number of VOCs become higher. In this context, time-space resolved approach like a gas chromatography, using printed origami or kirigami architecture, is highly useful for analysing complex VOC mixtures in real applications for performing direct micro-gas chromatography like measurements in skin or other physiological samples in wearable format. FIGS. 3*a*-3*b* schematically show a comparison of sensing profile with FIG. 3*a* showing the origami-based architecture of the present invention for simultaneous sensing and separation by generating multiple peaks of each individual volatile organic compound (VOC) component in the mixture, and FIG. 3*b* showing conventional measurements where superposition of multiple VOCs provides exponential response kinetics.

In the design of the present invention shown in FIG. 3*a*, each (bio) chemical compound that is found within a complex mixture exhibit either different mass transport phenomena (due to their distinct molecular weight) and/or unique spin injection (due to chirality-induced spin-transfer) while passing through porous separating medium. This process induces a non-linear resistance profile with multiple peaks at different moment of time from sensors in each layer's exposure (LE), as shown in FIG. 3*a*. These peaks signify appearance of distinct molecules at certain time moment, identified through simultaneous sensing profiles in each layer. The outcome would be better estimation of complex chemical mixtures than conventional measurements where sensor array is directly exposed to mixed molecules, as shown in FIG. 3*b*, and it exhibits an exponential transient reaction kinetics that express a superposition of response profile of multiple molecules present in mixture.

Process Optimisation of Hybrid-Graphene Ink

In the present invention, the inventors have optimised inkjet-print grade reduced graphene oxide (rGO) heterostructures without using any aggressive chemicals or reducing agents (such as, hydrazine, dimethyl hydrazine, hydroquinone, and NaBH4), stabiliser or binder (for example, Triton x-100, pyrene sulphonic acid, Xanthan gum, ethylene/propylene glycol). In this context, a mussel-inspired bio-adhesive dopamine, a surfactant and reducing agent, has been used to simultaneously reduce the GO and to use as a capping agent by forming the poly-dopamine through self-polymerisation during the reduction reaction of GO for wide range of substrate.

Dopamine is biochemically signified as hormone and neurotransmitter inside the human body and it transforms to poly-dopamine through self-polymerisation in weak alkaline medium. The catechol groups of poly-dopamine coated rGO could be oxidised to quinone form in weak alkaline condition and further could be used to functionalize with thiol or amine containing compounds either by Michel addition or Schiff based mechanism. Then the powder (DrGO) is dried in vacuum for functionalisation. This versatile reaction pathway has been used to nano-engineer the grafting process for tuning the surface chemistry of graphene plane with variety of multiple ligands for constructing inkjet-printed grade sensor array which is connected through printed silver nanowires prepared with a rapid solvothermal chemical route.

The present rGO or rGO-ligand ink formulations do not require any stabilising agent or binder (thus no post printing annealing is required for surfactant/binder removal) and could be readily dispersed in various organic solvents to print the different geometry on rigid, flexible and porous substrates (for example, Si/$SiO_2$, Kapton, glass, PET, silicone rubber and various types of paper) by simply modulating the printer parameters for film deposition in layer-by-layer approach. FIGS. 4*a*-4*g* show the photographs of the large-scale printing of the dried hybrid graphene oxide ink (DrGO) on various untreated substrates: (4*a*) Si/$SiO_2$ wafer, (4*b*) Kapton, (4*c*) PDMS rubber polymer, (4*d*) glass, (4*e*) transparent PET, (4*f*) Wattman filter paper, and (4*g*) office paper. The typical printed features for all these substrates showed excellent uniformity and geometry. The printed pixel geometry shows excellent boundary uniformity without any visible "coffee ring effect". The SEM images of the microdroplet printed features in the inkjet-printed micro pixels forming matrix of about 200 μm inter droplet distance on untreated Si/$SiO_2$ wafer are available on request.

Figure 5:
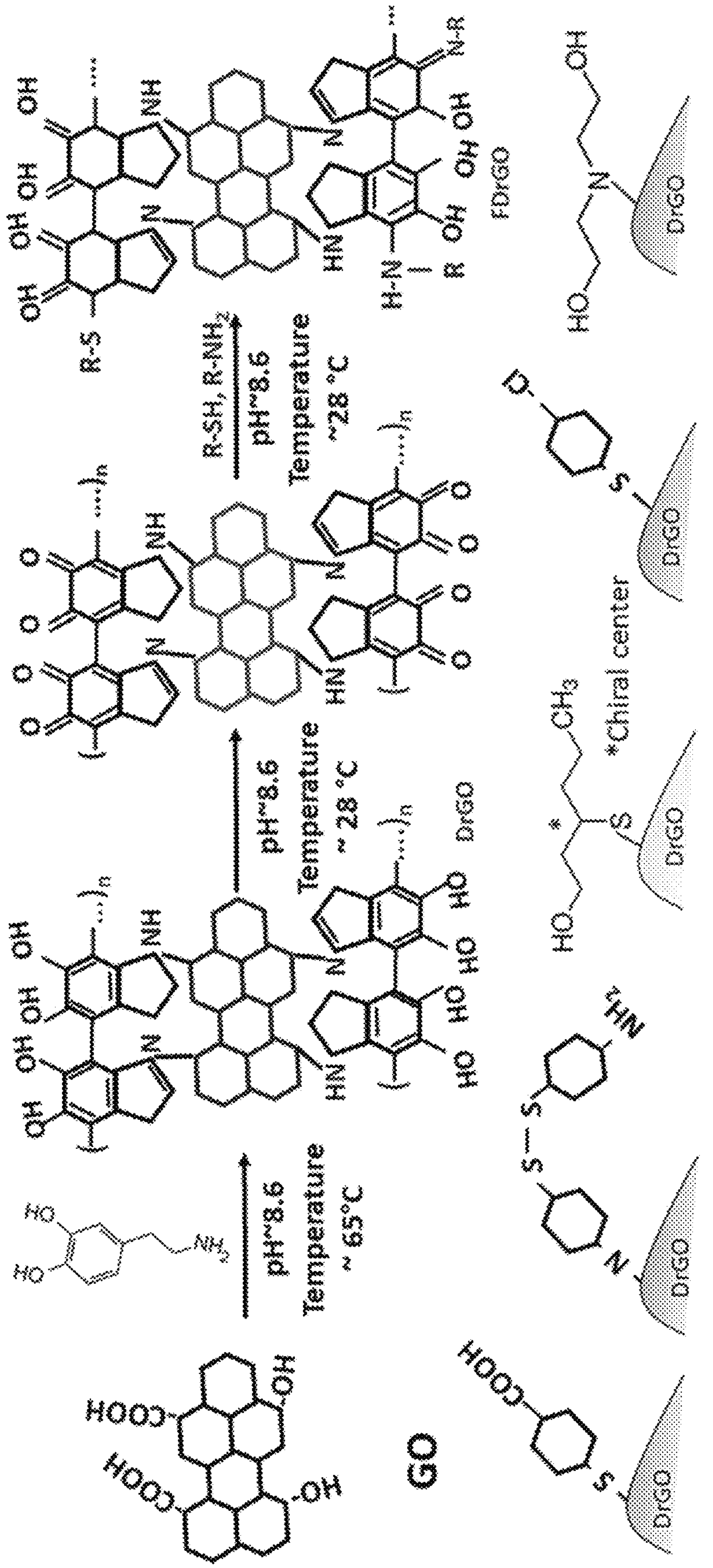
FIG. 5 shows the synthesis strategy of simultaneous reduction, encapsulation, and dispersion of DrGO based hybrid ink and its functionalisation to produce the functionalised product (FDrGO) with various amine/thiol-based ligands.

To get a stable suspension of graphene ink for uniform printing geometry without nozzle blockages, various attempts have been reported. These include use of various stabiliser/surfactant (such as, Triton or pyrene sulfonic acid) for very good dispersion of the ink, adjustment of desired viscosity of the ink without any coffee ring effect, by suitably chosen dispersion medium (such as, terpineol, NMP or alcohol), surface tension matching between substrate and ink droplet by tuning hydrophobicity (such as, spin coating of bis(trimethylsilyl)amine (HMDS) or hydrophilicity (plasma) of the surface, use of binders and additives (such as, PVP, PEDOT: PSS or ethyl cellulose) for improvement of the post printing adhesion between the ink and the substrate. Although the use of stabiliser promotes better graphene stabilisation, removal of the excess of the stabiliser from the ink for getting the better conductivity is tedious. Similarly, use of binder/additives may promote better adhesion for wide range substrate, but again post-printing thermal annealing is needed to remove extra adhesives, and this high temperature treatment is not suitable for various flexible substrate like paper/plastic. In this scenario, dopamine could be a better alternative as this specific material could be used as direct solvent mediumted reducing agent to remove oxygen containing functional group from graphene oxide (GO) to convert into reduced graphene oxide (rGO), as well as it serves as surfactant through the formation of polydopamine by in-situ polymerization on rGO surface. FIG. 5 shows the synthesis strategy and reaction pathway of simultaneous reduction of 2D-graphitic plane (to yield the reduced product rGO), encapsulation (to yield the DrGO product), and dispersion of the DrGO-based hybrid ink and its functionalisation to produce the functionalised product (FDrGO) with various amine/thiol-based ligands (20 different thiol and amine terminating ligands, listed in Table 1 below, with/without chiral centre).

The obtained hybrid system (rGO-polydopamine (DrGO)) is stable in water and various organic solvents (such as, dimethyl formamide (DMF), chloroform) and readily available for inkjet printing without using any additional surfactant, thereby, no need for post-printing high temperature annealing. In addition, due to the presence of catechol group inside the DrGO nano hybrid, the adhesion property is very similar to natural adhesive mussel protein (enriched with amines and catechol group) that has higher affinity to bind with wide range organic/inorganic substrates, such as metal/metal oxides, polymers. This additional inherent adhesion property of the DrGO hybrid could be an excellent alternative for an additive/binder-free printing technology without using any tedious viscosity adjustments, such as, using high boiling point solvent, thus, suitable for printing with wide range substrate application.

Figure 6:
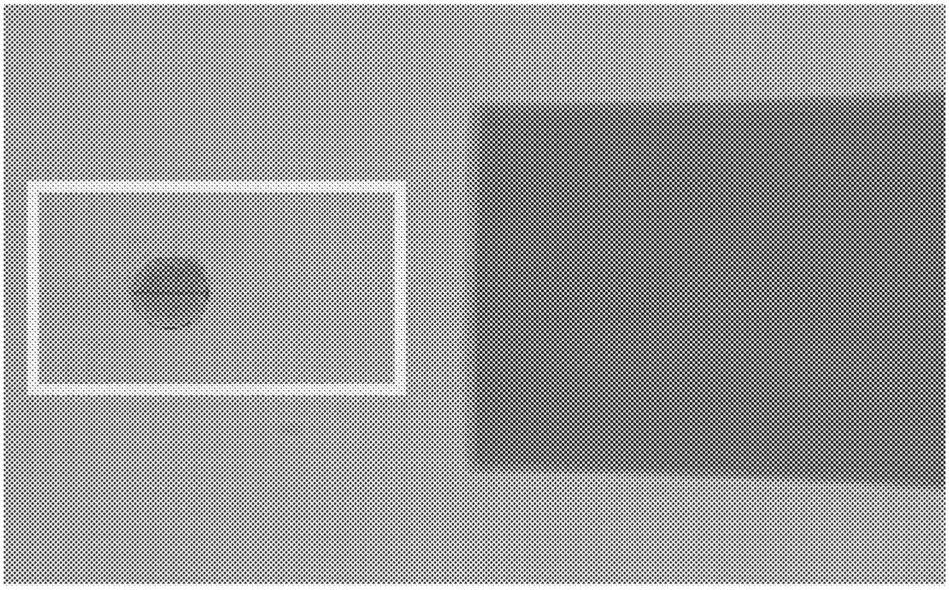
FIG. 6 shows the real time capture footage of DrGO droplet dispersed in DMF without any satellite droplets and therefore printed geometry provides excellent boundary uniformity as discussed above.
Figure 7:
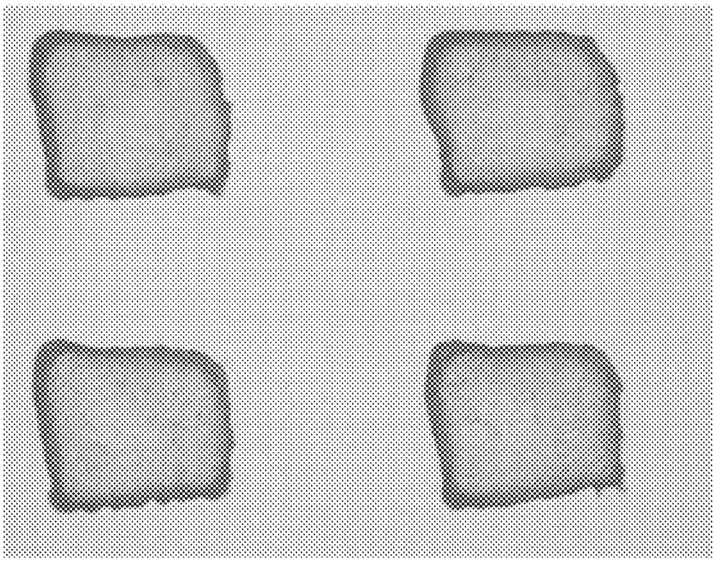
FIGS. 7-8 show the micrograph of the printed geometrical pattern of DrGO ink on untreated silicon wafer using DMF as dispersion medium on oxygen plasma-treated (7) silicon wafer and (8) Kapton.
Figure 8:
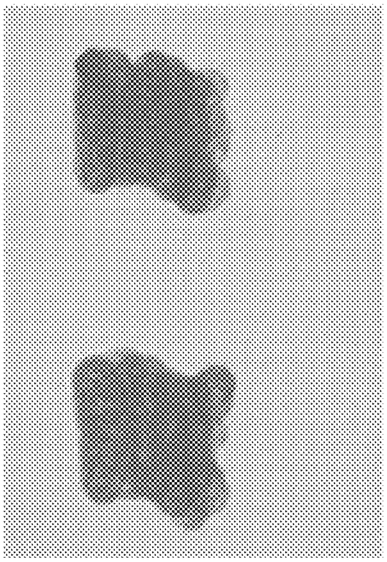

FIG. 6 shows the real time capture footage of DrGO droplet dispersed in DMF without any satellite droplets and therefore printed geometry provides excellent boundary uniformity as discussed above. FIGS. 7-8 show the micrograph of the printed geometrical pattern of DrGO ink on untreated silicon wafer using DMF as dispersion medium on oxygen plasma-treated (7) silicon wafer and (8) Kapton.

Figure 9A:
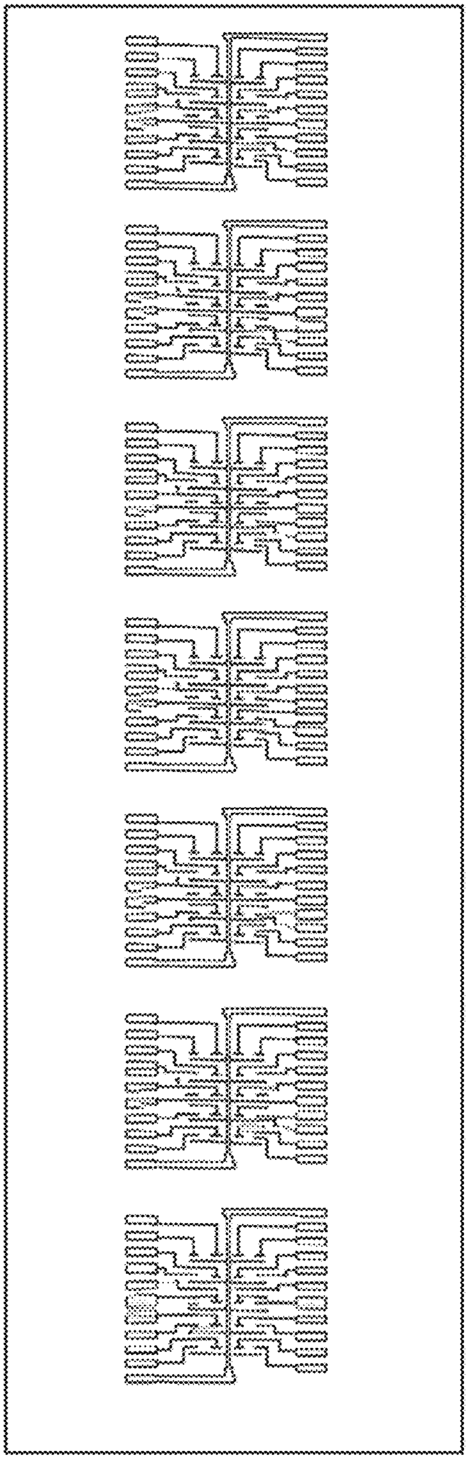
FIGS. 9*a*-9*e* show a mass-scale graphene and silver nanowire printed origami-based e-paper.
Figure 9B:
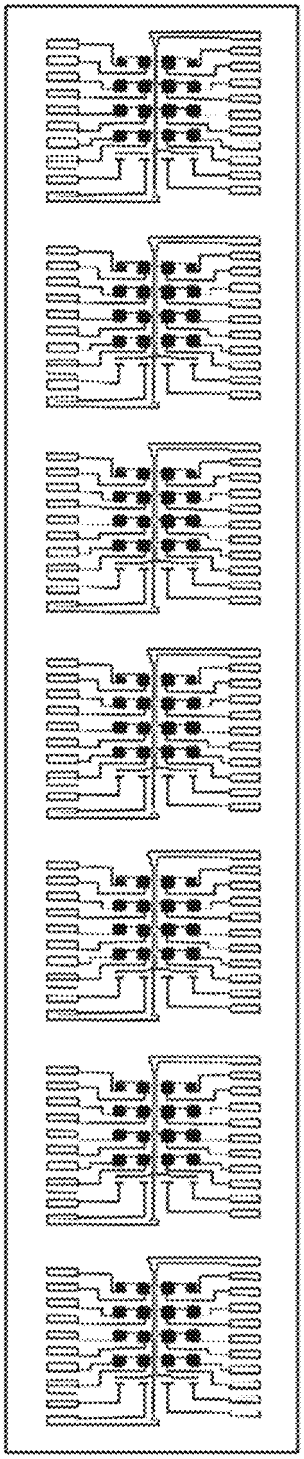
Figure 9C:
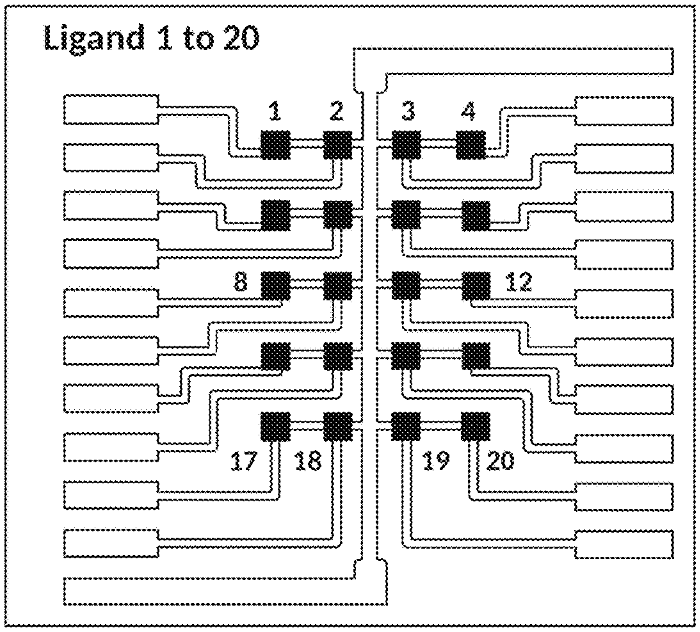
Figure 9D:
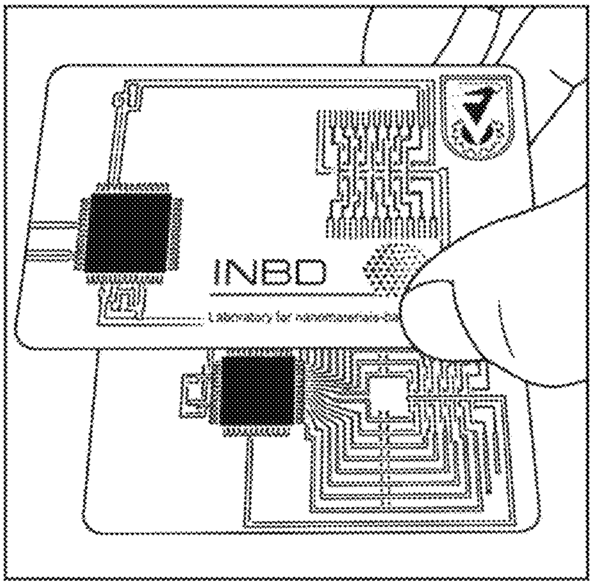
Figure 9E:
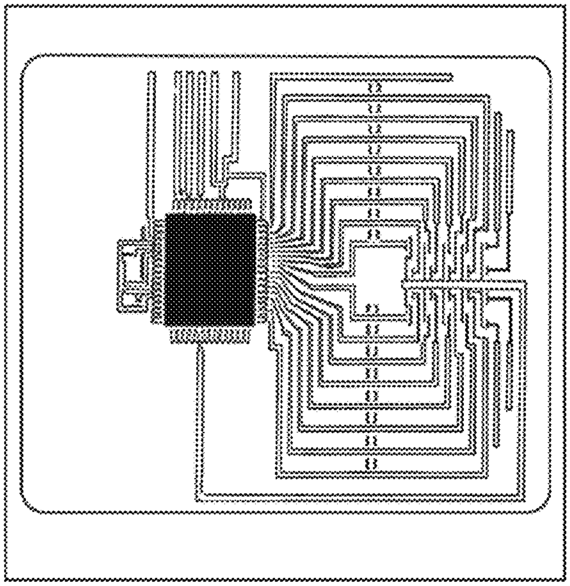
Figure 9F:
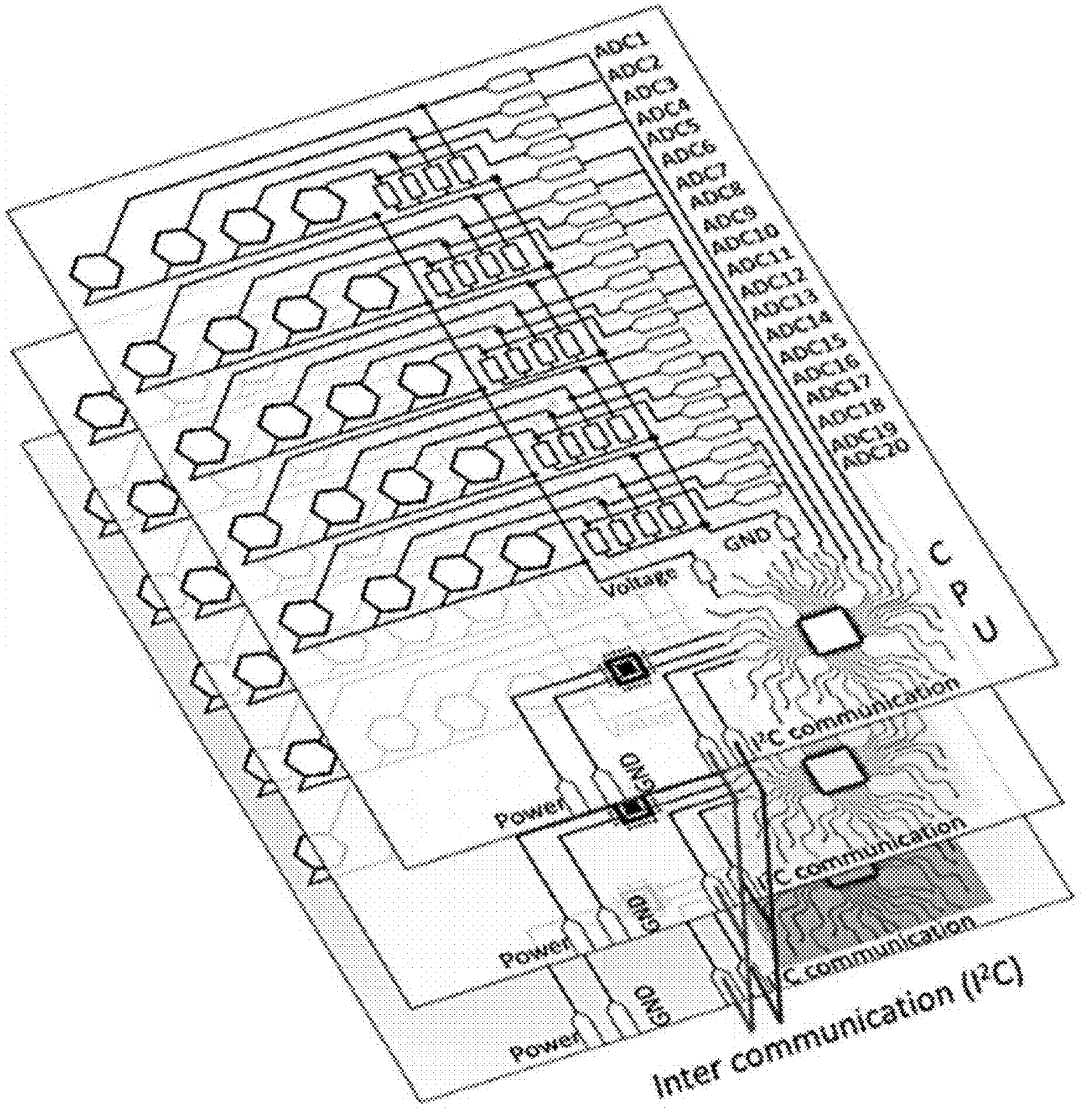
FIG. 9*f* shows the circuit schematic for communicating all printed pixel from the stacked layers.

As prepared cleaned and dried, DrGO powders are then used for grafting reaction to bridge various thiols, amines, and chiral compounds to make FDrGO powders. The functionalised powder (FDrGO) is further redispersed in DMF and sonicated at low power for dispersion of the ink for about 1-2 minutes and subsequently used for inkjet printing on paper. FIGS. 9*a*-9*e* show a mass-scale graphene and silver nanowire printed origami-based e-paper. FIG. 9*a* shows the silver nanowire electrodes printed on paper, and FIG. 9*b* shows the chiral/achiral FDrGO ink printed among silver nanowire based multijunction printed electrodes (4×5 matrix where each black pixel in the array signifies the specific ligand modified FDrGO). FIG. 9*c* shows the magnification of one of the sensor layers with 20 ligands after graphene printing from FIG. 9*b*. Further, FIGS. 9*d*-9*e* show the micro-processor-based computing unit with nanowires printed on the same paper. FIG. 9*f* shows the circuit schematic for communicating all printed pixel from the stacked layers. These are the inkjet-printed sensing heterostructures of the present invention fabricated on paper in the form of origami having a folded layer by layer architecture with embedded electronics.

Table 1 lists thiol and amine terminated various achiral and chiral ligands used for synthesis of the functionalised hybrid multifunctional ink (FDrGO):

| Amine based ligands | Thiol based ligands |
|---|---|
| Aniline | Mercapto propionic acid |
| Diethanolamine | Mercapto hexanol |
| Ethylene diamine | Mercapto ethanol |
| 4-4' di amino diphenyl methane | Mer capto benzoic acid |
| Butylamine | 4 amine phenyldisuplhide |
| Polyethyleneimine | 2-amino 4-chloro benzene thiol |
| 1,4 Phenyladimine | 4-chloro benzene methane thiol |
| Diethylamine | 2-napthalenethiol |
| Oleylamine | 4-tert butylebnezene thiol |
| Cysteine | Hexane thiol |

Table 2 provides a comparative printing approach for the binder- and surfactant-free printing of the present invention with the state-of-art. It shows the benchmarking of the chemicals and components used for traditional inkjet-printed graphene-based materials and for the binder- and surfactant-free printing of the present invention:

| Binders additives | Substrate treatment before print | Post printing annealing | Substrates | Solvent | Device used | Reference |
|---|---|---|---|---|---|---|
| Ethyl cellulose | Yes | Yes | PET | NMP, Terpineol/ CHO | Photodetectors | [3] |
| PVP | Yes | Yes | $Si_3N_4$ | IPA | Gas sensors | [4] |
| PEDOT:PSS | No | No | Carbon | Water | Gas sensors | [5] |
| Plasdone S-630 | No | Yes | Paper | IPA/n-butanol | Conductive inks | [6] |
| Ethyl lactate/octyl acetate/ethylene | Yes | Yes | Nitrocellulose | Glass, Kapton | Conductive inks | [7] |
| Poly-dopamine (surfactant + binder) dual | No | No | Paper, Silicon wafer, Glass, Kapton, PET, PDMS | DMF, IPA | Hybrid ink printed sensor | Present invention |

Figure 10:
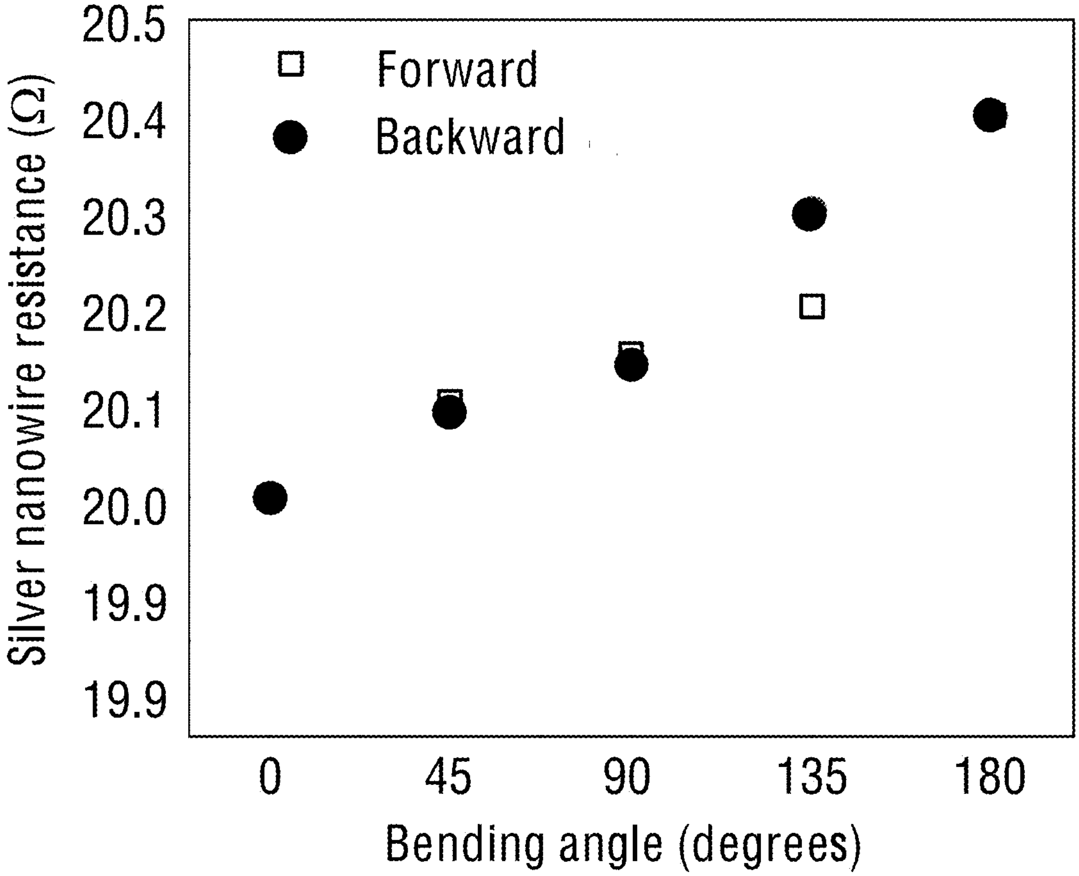
FIG. 10 shows the results of the typical bending experiment demonstrating that the printed network exhibits minimal resistance change for full bending or folding.
Figure 11A:
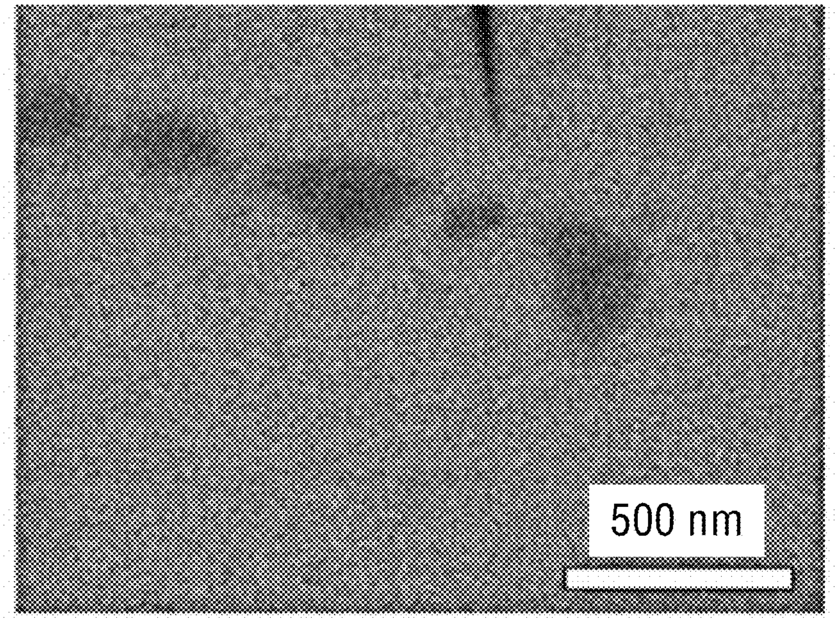
FIGS. 11*a*-11*d* show the SEM image microstructures of the GO, DrGO, thiol-DrGO and amine-DrGO structures, respectively.
Figure 11B:
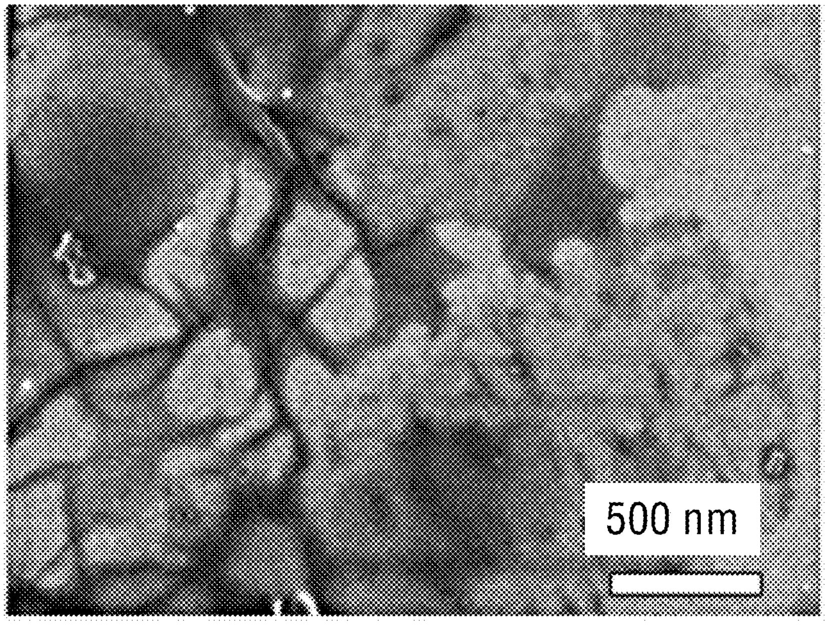
Figure 11C:
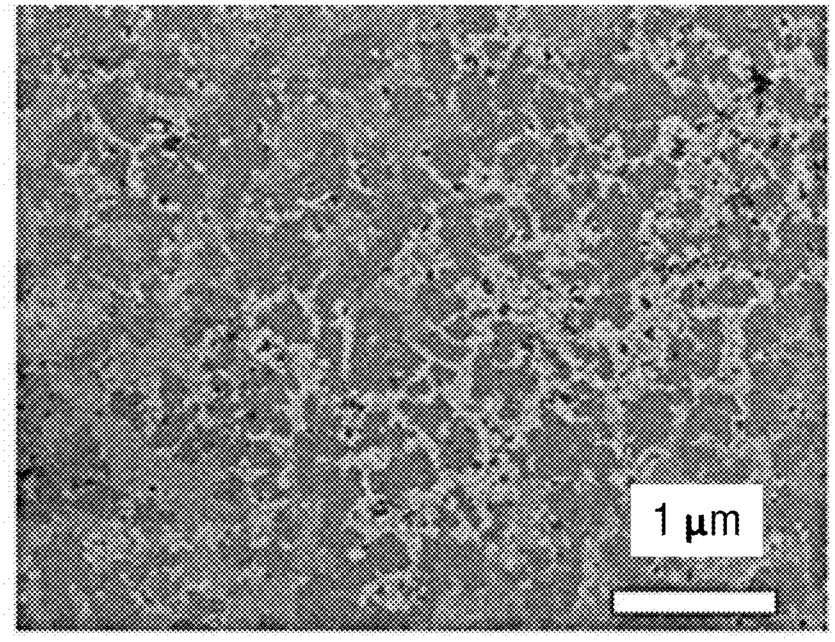
Figure 11D:
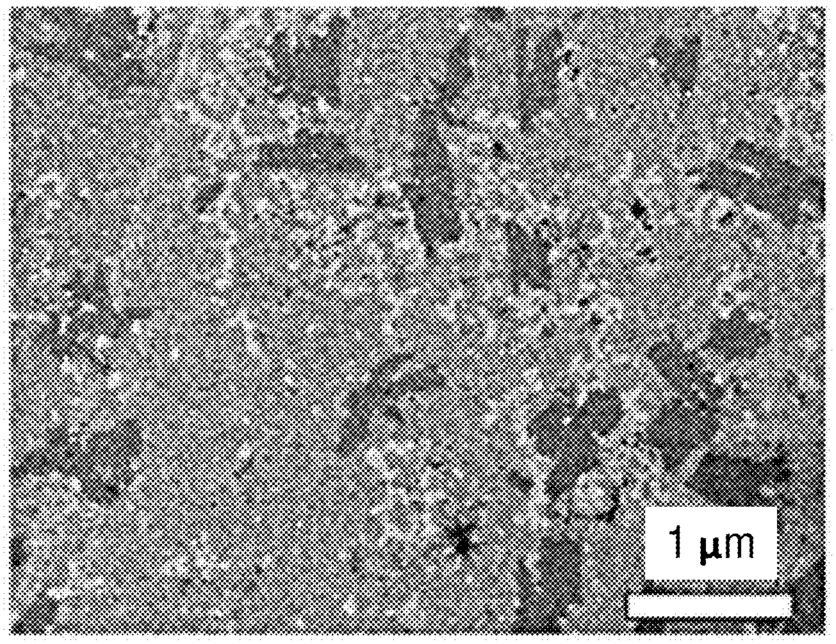

In the printing process of the present invention shown in FIG. 6, the FDrGO hybrid inks dispersed in DMF, were printed directly on free-standing films made of cellulose fibres in form of the 2D-matrix (4×5) sensor array on each layer of the layered medium, as shown on FIG. 9*b*. A silver nanowire based interdigital conducting electrodes were designed and printed to connect all pixels in the matrix. Use of the silver nanowire on paper is highly useful for flexibility, as jetted nanowires could be easily impregnated inside pores of the paper to make uniform conducting network. Individual sensor matrix (4×5 FDrGO array) was then diced and stacked in form of folded layers. FIG. 10 shows the results of the typical bending experiment demonstrating that the printed network exhibits minimal resistance change for full bending or folding.

An exemplary microprocessor-based computational unit is Mega 2560 IC which is suitable for interfacing sensor pixels in a credit card sized printed paper as described above. Schematic of the microprocessor embedded μGC design with I2C inter connection is shown FIG. 9*f*.

Sensors

The sensors used in the present invention are any suitable sensors, which can be used with the detector of the present invention, such as micro-gas chromatograph, miniaturised dispersive optical spectrometer, fibre-coupled optical spectrometer, MEMS-based spectrometer, plasmon-enhanced Raman spectrometer, on-chip plasmonic spectrometer, piezoelectric crystal detector, or spin-induced mass spectrometer, capable of sensing chemical compounds. Non-limiting examples of these sensors are:

(a) thermal conductivity sensors designed to detect the difference in thermal conductivity between the sample and a stream of pure carrier gas passed through a reference cell;

(b) surface acoustic wave (SAW) sensors designed to detect changes in propagation characteristics of acoustic waves near the surface of a piezoelectric material such as quartz;

(c) chemiresistor array sensors comprising gold-thiolate monolayer-protected nanoclusters (MPNs) deposited onto patterned microelectrodes, and designed to detect changes in resistance as a result of absorption of vapor molecules (chemical vapours) by the nanoclusters;

(d) chemicapacitive array sensors comprising two parallel electrodes or interdigitated electrodes, a sensing material, such as a polymer film, either sandwiched between the pair of parallel electrodes or coated on the interdigitated electrode, and designed to detect changes in the capacitance of the sensor as a result of absorption of chemical vapours leading to a swelling of polymer and change in electrical permittivity, as a function of the tested compounds concentration; and (e) nanocantilever sensors comprising a beam resonator structure coated with a sensing material, such as a polymer, that is supported on a rigid support, and designed to detect changes in the resonance frequency as a result of absorption of chemical vapours, proportional to the amount of mass absorbed.

The origami-based sensors layout has advantages of long-range printing capability in mass scale (printing) and synthesis of inkjet grade ligand modified graphene on paper, PET, PDMS etc. Origami/kirigami based paper platforms are getting attention in various applications, such as, sensor, robotics, microfluidics, battery, tissue engineering, microscopy, and artificial muscles. These self-folding structures are emerging at the recent interest due to their capacity to perform certain programmed folding/unfolding motions, 2D planar to 3D transition by manipulating layers, easy integration of printed features in its layer by layer to show multi-functionality in one system. In particular, for wearable electronics and sensors, this integrated platform is highly appealing.

Characterisation and Sensing Study of the FDrGO Structure

Figure 12:
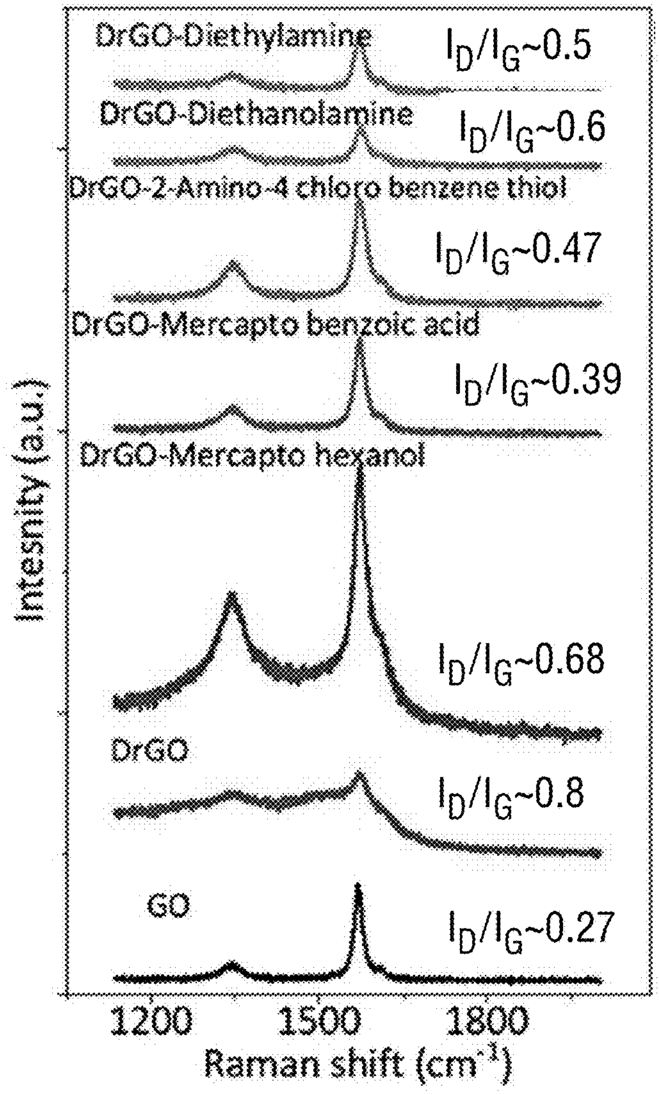
FIG. 12 shows the Raman spectroscopy of the GO, DrGO and various FDrGO samples with calculated $I_D/I_G$ ratio.
Figure 13A:
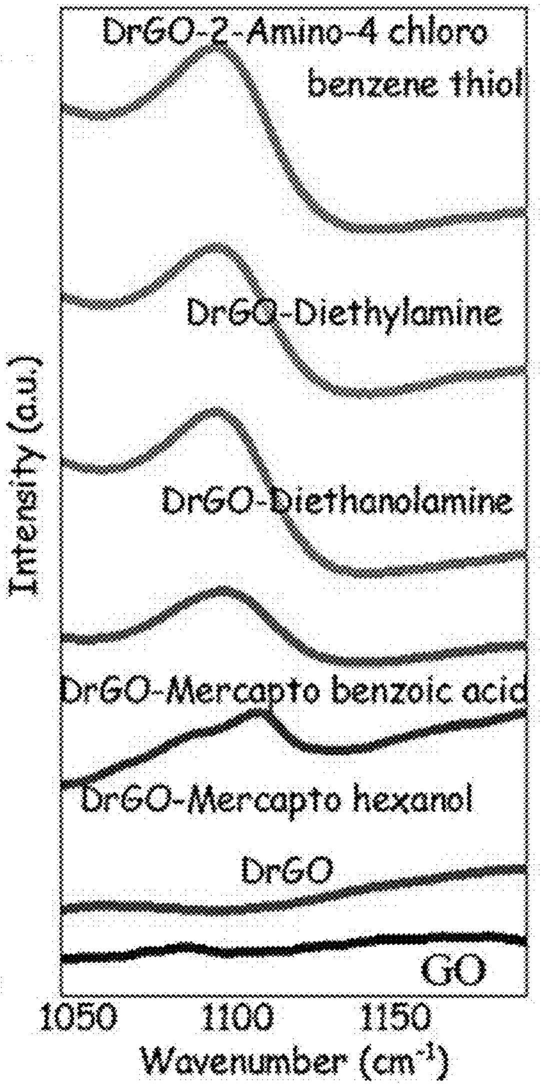
FIG. 13*a*-shows the FTIR spectroscopy for estimation of the surface chemistry loading for various samples.
Figure 13B:
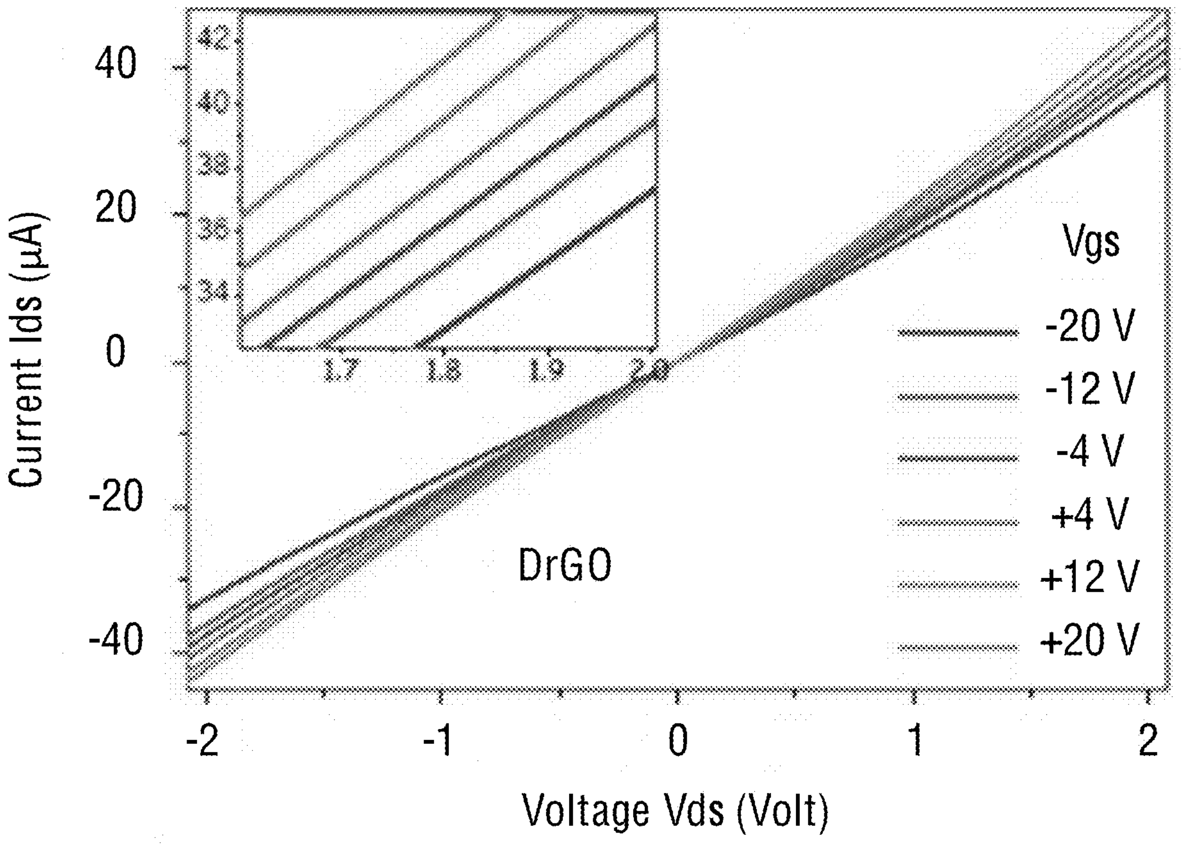
FIG. 13*b* shows the electronic characterization to estimate the I-V properties of the DrGO structure.
Figure 13C:
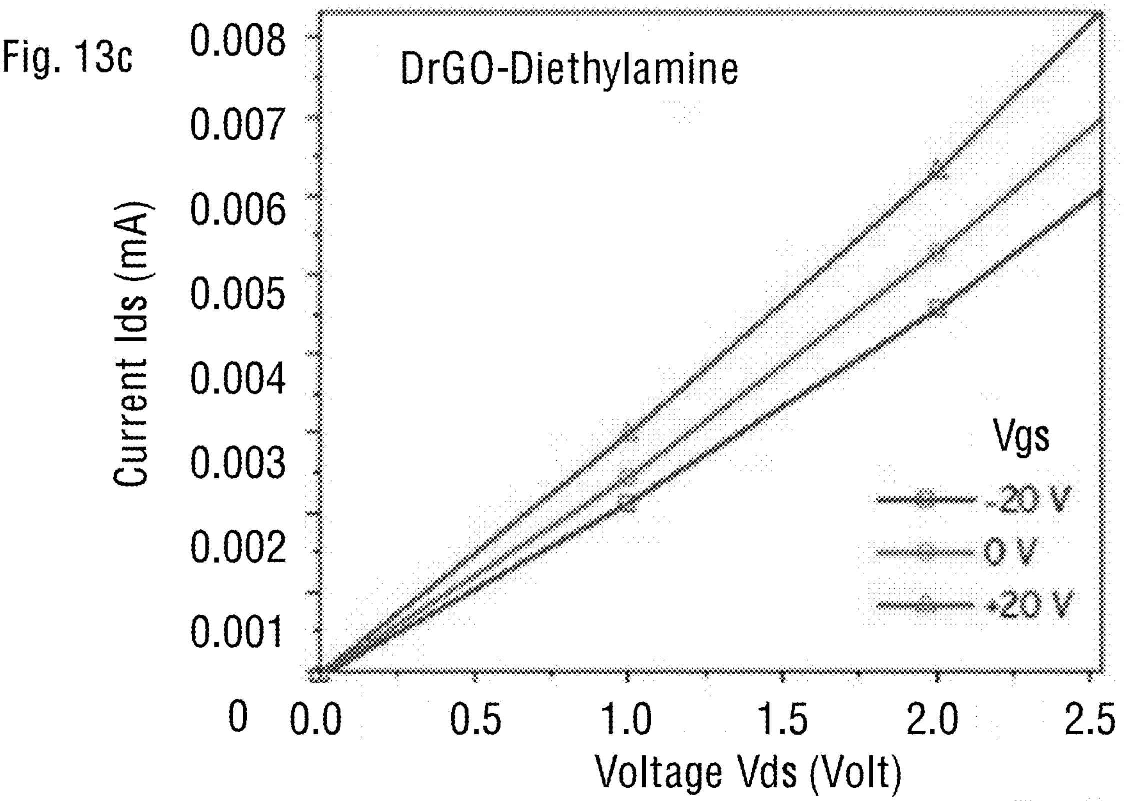
FIGS. 13*c*-13*d* show the electronic characterization to estimate the I-V properties of the FDrGO structures with a typical thiol- and amine-based ligand, respectively.
Figure 13D:
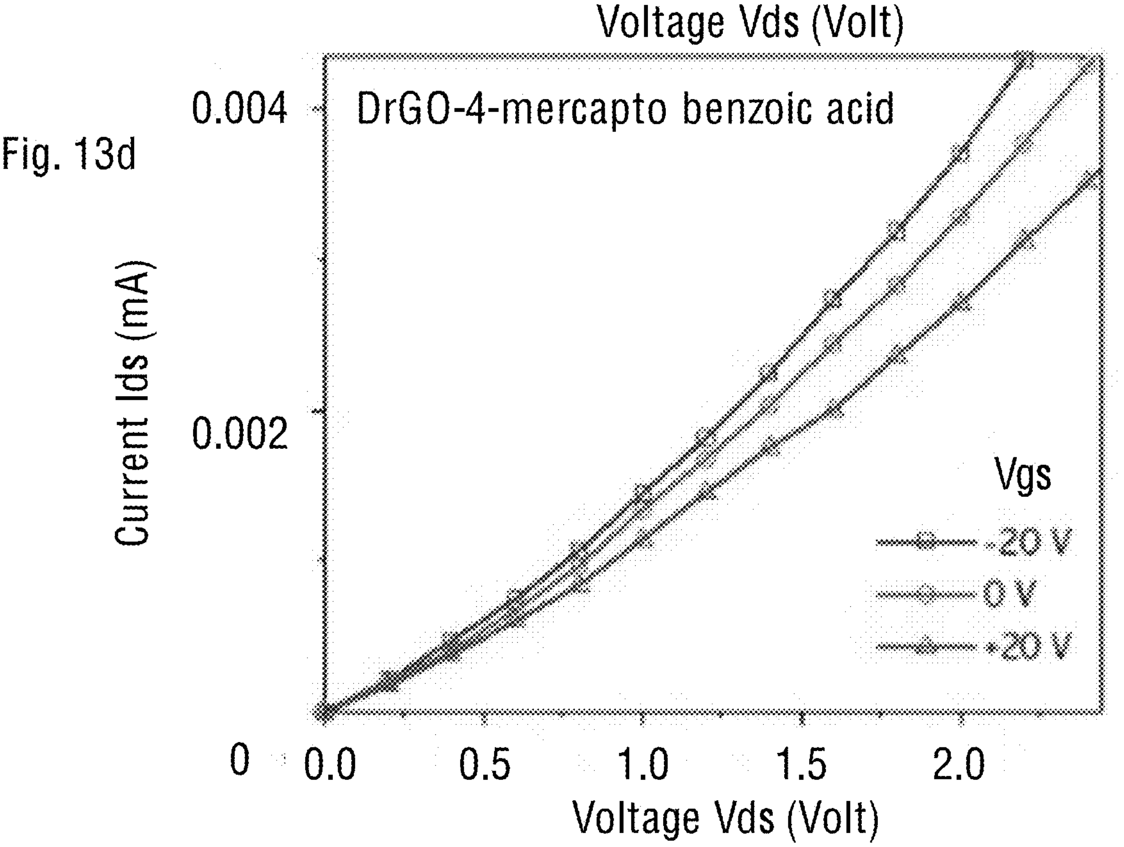
Figure 14A:
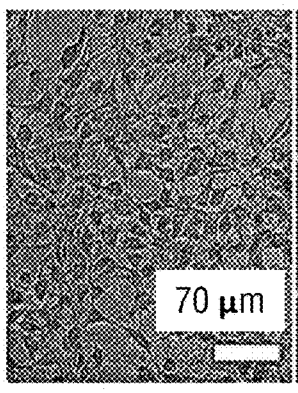
FIGS. 14*a*-14*k* show the typical cytotoxicity evaluation of (14*a*, untreated) human epithelial lung cells using various FDrGO inks (thiol, amines and chiral), such as, mercapto hexanol (14*b*, 14*e*), mercapto benzoic acid (14*c*, 14*f*), diethanolamine (14*d*, 14*g*), diethyl amine (14*h*, 14*j*), and 2-amino-4-chloro-benzoic acid (14*i*, 14*k*), for 10 μg/ml and 100 μg/ml dosage respectively (for treatment 24 hrs).
Figure 14B:
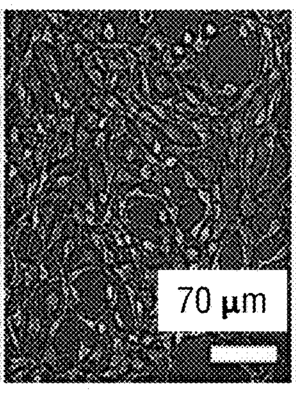
Figure 14C:
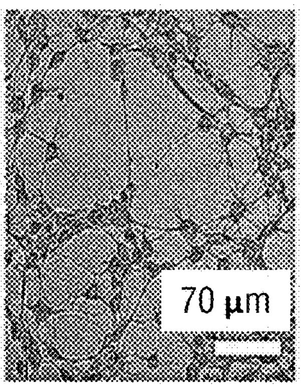
Figure 14D:
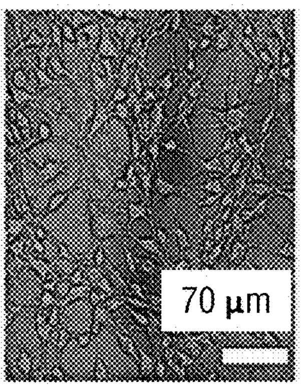
Figure 14E:
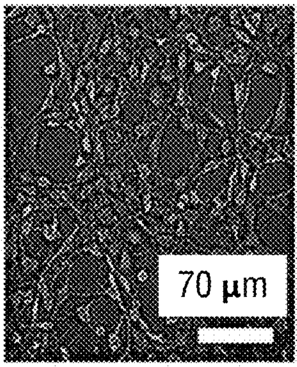
Figure 14F:
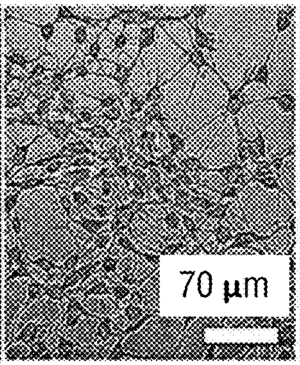
Figure 14G:
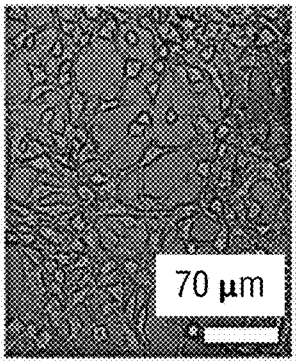
Figure 14H:
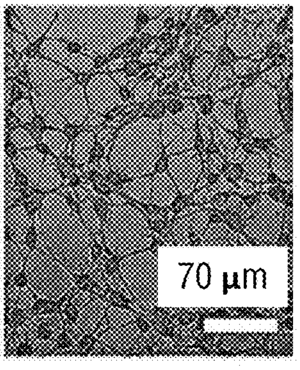
Figure 14I:
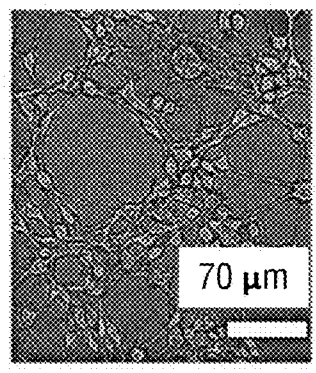
Figure 14J:
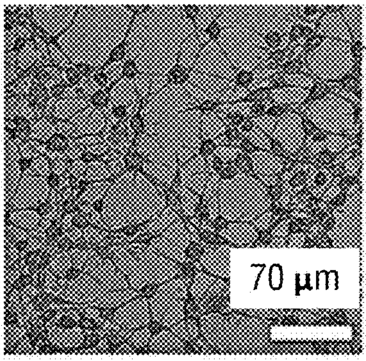
Figure 14K:
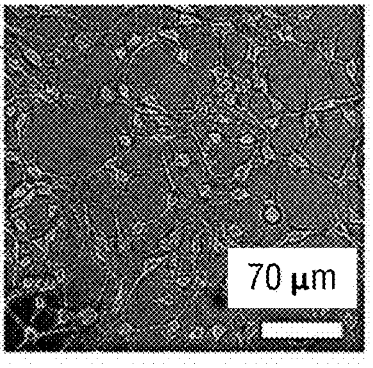

Microscopic (SEM), spectroscopic (Raman, FTIR, NMR), electronic (FET and I-V) data on GO, DrGO, thiol-FDrGO, amine-FDrGO and chiral-DrGO were collected to find morphological, structural, functionalisation status and basic electronic quality of the materials of the present invention. FIGS. 11*a*-11*d* show the SEM image microstructures of the GO, DrGO, thiol-DrGO and amine-DrGO structures, respectively. FIG. 12 shows the Raman spectra of the GO, DrGO and various FDrGO samples with calculated $I_D/I_G$ ratio. FIG. 13*a* shows the FTIR spectra for estimation of the surface chemistry loading for various samples. The corresponding NMT spectra of these samples are available upon request. FIG. 13*b* shows the electronic characterization to estimate the I-V properties of the DrGO structure. FIGS. 13*c*-13*d* show the electronic characterization to estimate the I-V properties of the FDrGO structures with a typical thiol- and amine-based ligand, respectively.

N-type semiconducting properties of DrGO/FDrGOs suggest integration of $N_2$ adatom at graphitic plane during GO-reduction with polydopamine. This has been proved by the DFT analysis of the FDrGO (with 4-mercaptobenzoic acid as a ligand) interaction with S (+)/R (−)-butanol. The DFT analysis was performed using Gaussian 16 software to optimise the molecular structure, as well as the HOMO and LUMO energy of FDrGO with 4-mercaptobenzoic acid) as well as their complexes R- and S-2-butanol molecules. The DFT method was combined with Austin-Frisch-Peterson functional with dispersion (APFD) and the basis set 6-31G (d), including treatments of dispersion effects, which represents the best trade-off between accuracy and computational cost for a relatively large system. The corresponding modelling images are available upon request.

To explain further, the spin polarisation effect of the modified band structure of graphene due to presence of doping or defect was considered. In general, graphene is diamagnetic. However, it shows magnetic behaviour when some foreign atom or defect is present in C—C hexagonal lattice. Due to doping of other element (e.g., $H_2$, $N_2$, F), time reversal symmetry breaks and due to orbital overlap of p electron, the local crystal structure exhibit finite magnetic moment. This make graphene magnetic, which is highly desirable for spintronics and chiral recognition.

In general, during the chiral based charge transfer, the interaction is also accompanied by spin injection which is completely opposite to each enantiomer type. This phenomenon is commonly termed as "chiral induced spin selectivity". Using this unique spin injection, the surface become spin polarised (i.e., majority spin direction is either up or down). Due to the specific spin population, energy band of graphene structure modulates (increased or decreased). This band splitting phenomena is also predicted by quantum mechanical DFT when graphitic structure is doped with various nitrogen-based ligand.

In the present invention, during the reduction reaction of GO and polymerisation reaction of polydopamine, the oxygen containing group from C—C lattice is removed and N-based compound from polydopamine chain is impregnated in C—C lattice. The presence of $N_2$ adatom breaks time and space reversal symmetry, possesses finite magnetic moment, opens the Dirac band gap and becomes n-type.

The DFT analysis for two typical extreme case (considering all the spin configuration in the N-site is either all up or all down) and calculated band gap difference between these two cases show that energy difference is indeed different in magnitude. This distinct band modulation (increase or decrease of band gap) due to specific spin population and polarisation on the surface exhibits opposite directional resistance change (increase/decrease of resistance) for different enantiomer type using CISS mechanism. This result shows a high potential for the next generation spintronics, spin-based logic and spin-based memory/magnet free storage device applications.

Figure 15:
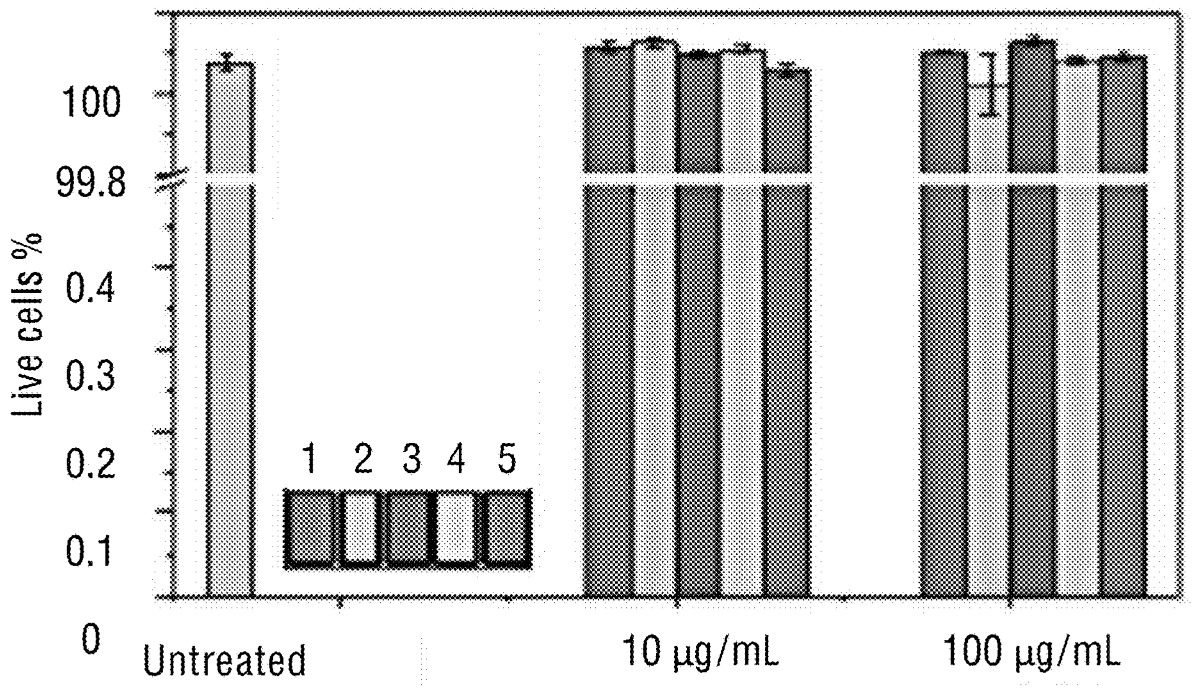
FIG. 15 shows the live cells % for various FDrGO ink concentration and type of dosages after 24 hrs treatment.

Reference is now made to FIGS. 14*a*-14*k* and FIG. 15 demonstrating the cell cytotoxic assessments of the FDrGO samples for human epithelial lung cells that suggests biocompatibility within the applied dose. FIGS. 14*a*-14*k* show the typical cytotoxicity evaluation of (14*a*, untreated) human epithelial lung cells using various FDrGO inks (thiol, amines and chiral), such as, mercapto hexanol (14*b*, 14*e*), mercapto benzoic acid (14*c*, 14*f*), diethanolamine (14*d*, 14*g*), diethyl amine (14*h*, 14*j*), and 2-amino-4-chloro-benzoic acid (14*i*, 14*k*), for 10 μg/ml and 100 μg/ml dosage respectively (for treatment 24 hrs). FIG. 15 shows the live cells % for various FDrGO ink concentration and type of dosages after 24 hrs treatment.

Evaluating Performance of the Detectors

For evaluating performance of the detectors of the present invention, a single layer including functionalised sensors array was examined upon direct exposure to various chemical structural/chiral mixtures, without spatiotemporal part (see FIG. 13*d*).

Figure 16A:
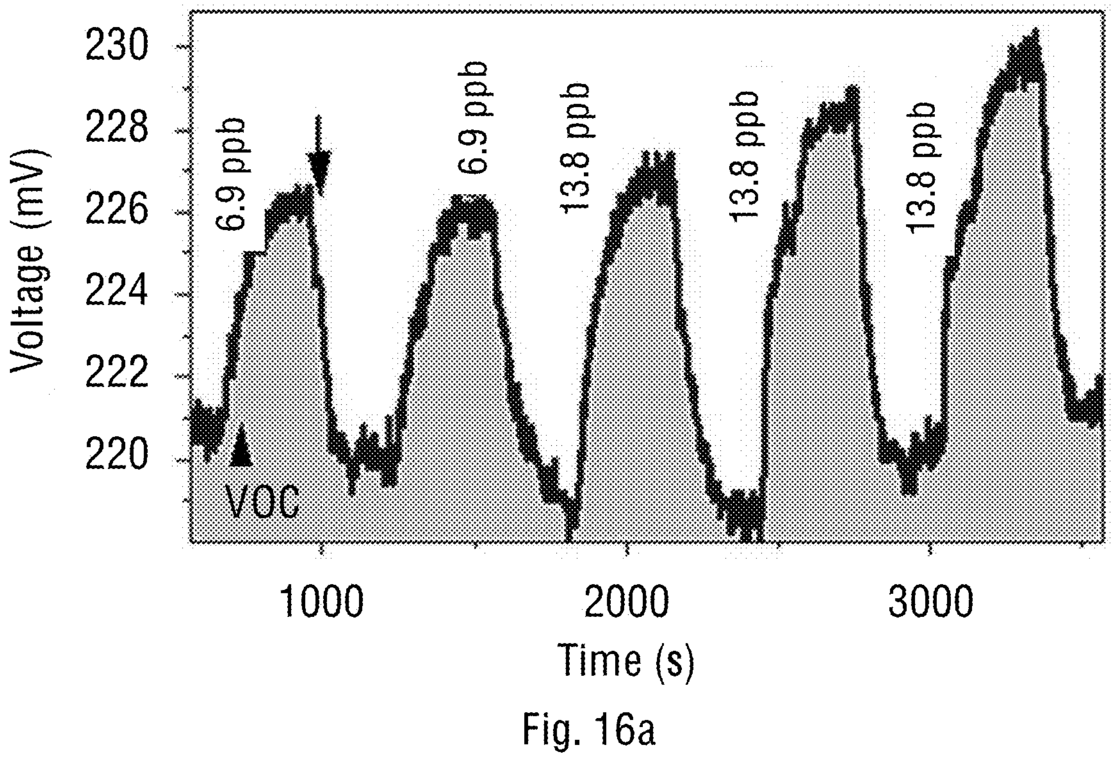
FIGS. 16*a*-16*c* show the comparison between the direct exposure and the μGC-based detector exposure of the present invention.
Figure 16B:
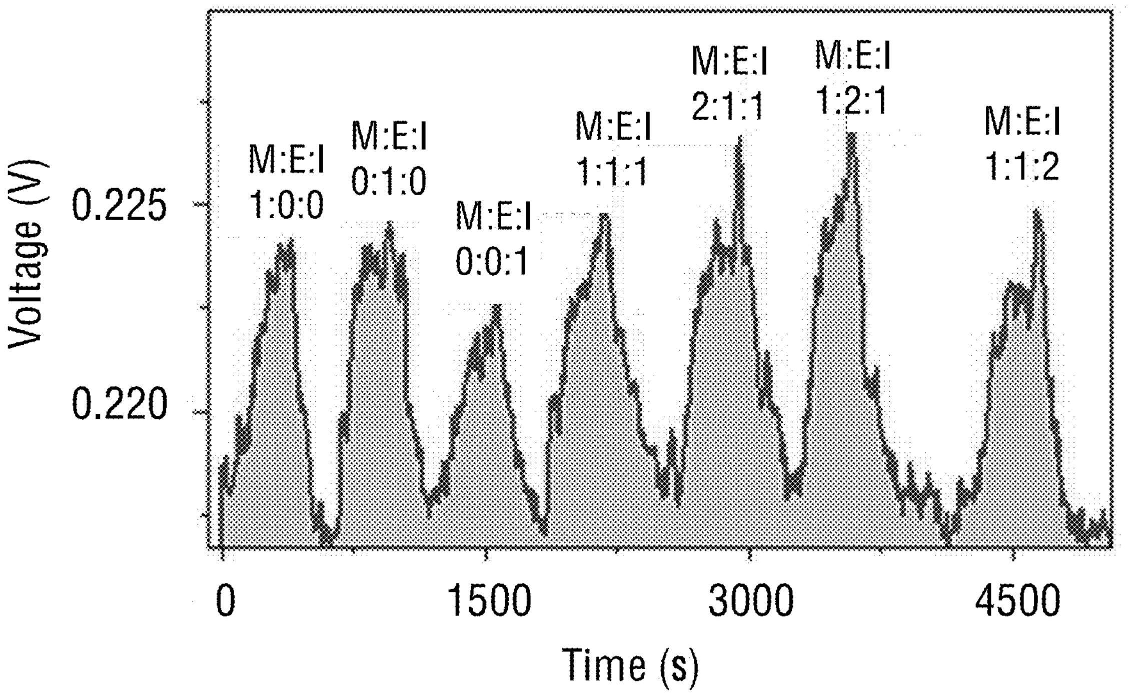
Figure 16C:
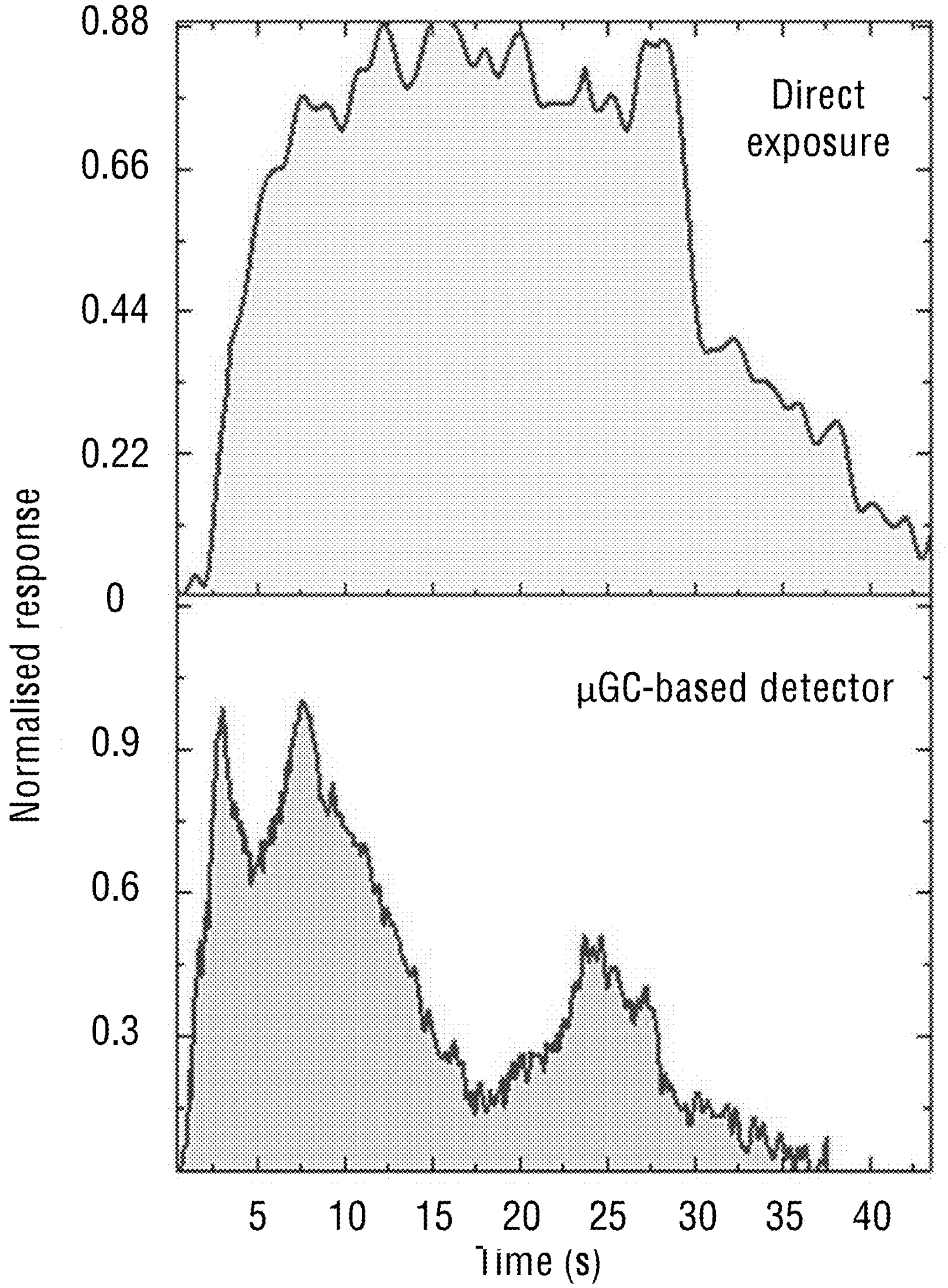

Reference is made to FIGS. 16*a*-16*c* showing the representative sensing results, such as those for methanol (6.8-13.9 ppb) and pure/mixed vapours of ethanol and isopropanol (mix ratio of three alcohols M:E:I approximately 0:0:1, 0:1:0, 1:0:0, 1:1:1, 2:1:1, 1:2:1, 1:1:2). These figures show the comparison between the direct exposure and the μGC-based detector exposure of the present invention. FIG. 16*a* shows the typical direct exposure sensing performance for methanol (6.9-13.8 ppb), and FIG. 16*b* shows other alcohol mixtures (methanol (M), ethanol (E) and isopropanol (I) for 6.9 ppb in pure (e.g., 6.9:0:0) and multiplied in the mixture in the ratio of 1:0:0, 0:1:0, 0:0:1, 2:1:1, 1:2:1, 1:1:2. FIG. 16*c* shows the comparative sensing performance of typical 1:1:1 mix vapours (E:M:I) for the direct exposure and the μGC-based detector exposure of the present invention at the second layer.

As seen in figure, the direct exposure provides superposed exponential response/recovery kinetics of overall mixture, but no further information could be obtained on each alcohol component in mixture. This superposed response could originate from infinitely possible ratios of mix components that would generate every time same exponential superposed response kinetics that is contributed from each of the component in mixture. This issue would be more challenging when number of components (analytes) in the mixture become larger. On top of that, it will be very hard mission to train intelligent system for infinitely possible combination of ratios to predict from real sample analyses. The method of the present invention changes the result dramatically.

Figure 17A:
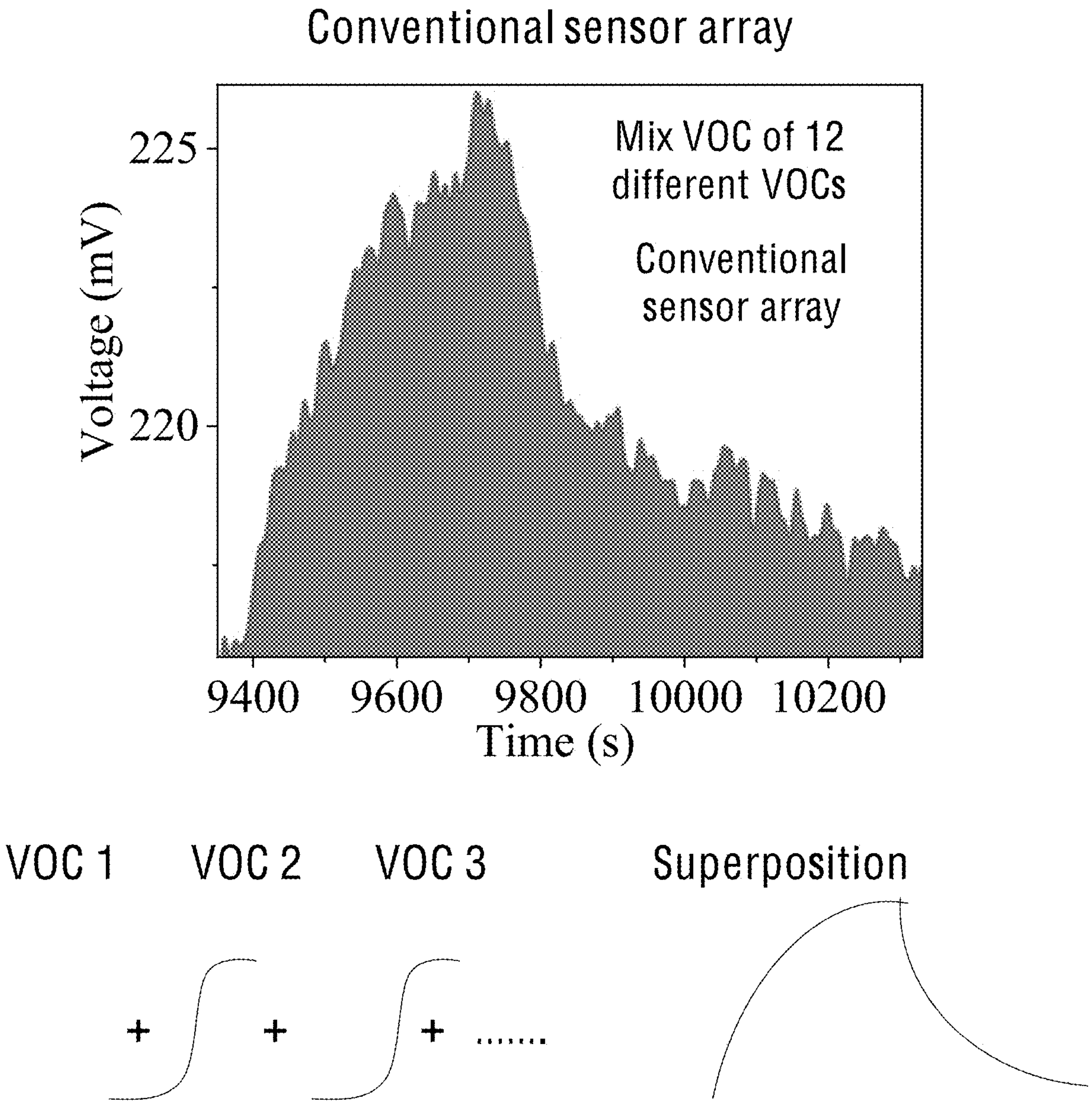
FIGS. 17*a*-17*b* schematically show a comparison of the sensing profiles with FIG. 17*a* showing the sensing profile obtained with a conventional sensing array and resulting from a superposition of individual VOC signals, and FIG. 17*b* showing the sensing mechanism and profile for the layered medium-architecture and detection of the present invention, where each VOC is separated and sensed individually, but simultaneously, thereby generating multiple peaks of each individual VOC component in the mixture.
Figure 17B:
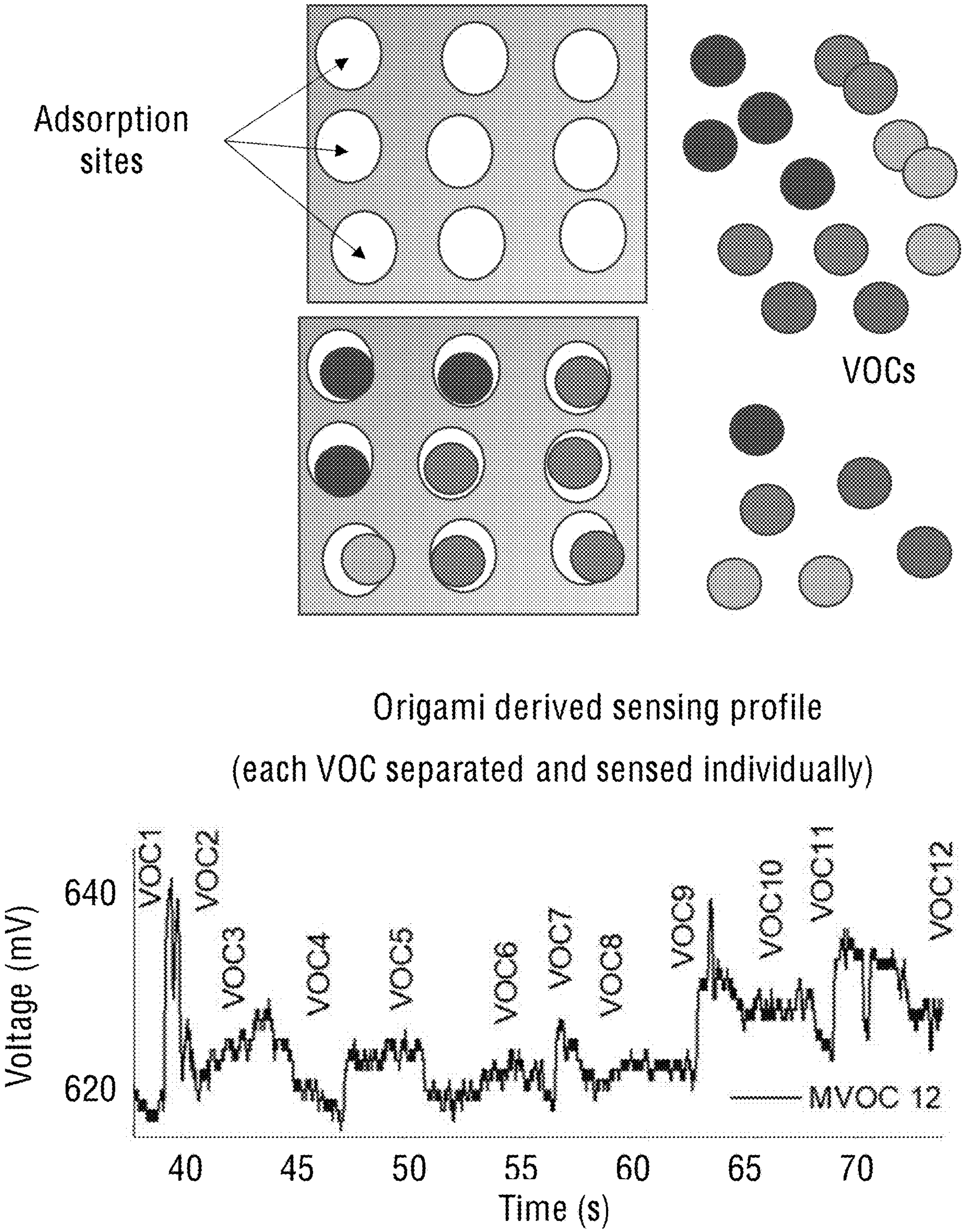

Thus, the major issue with a conventional sensor array and direct exposure is a difficulty to separate compounds having a similar structure and molecular weight (see FIGS. 3*b* and 17*a*). Reference is now made to FIGS. 17*a*-17*b* schematically showing a comparison of the sensing profiles with FIG. 17*a* showing the sensing profile obtained with a conventional sensing array and resulting from a superposition of individual VOC signals, and FIG. 17*b* showing the sensing mechanism and profile for the layered medium-architecture and detection of the present invention, where each VOC is separated and sensed individually, but simultaneously, thereby generating multiple peaks of each individual VOC component in the mixture.

The principal notion for utilising layered medium together with the detectors of the present invention in the VOC sensing is to utilise the unique time-space resolved geometry for effective semi-separation and instantaneous detection of various VOCs from a complex mixture in different instant of time. Since each VOC exhibit different mass transport phenomena (due to their distinct molar weight) while passing through porous origami paper layer, it is reasonable to expect a non-linear resistance profile (with multiple peaks at different moment of time) from sensors in each origami layer (see FIGS. 3*a* and 17*b*). These peaks signify the appearance of distinct VOCs at certain moment of time identified through the simultaneous measured resistance profile of sensor array in each layer, thus, exhibit a better estimation of complex VOC mixture than the conventional measurements where sensor array is directly exposed to the mixture of VOCs as explained above.

In conventional measurements, each sensor in the array exhibits an exponential transient reaction kinetics which is the superposition of the response profile of multiple VOCs present in the mix condition, thus, it is challenging for analysing the VOC content when the number of VOCs become higher. In particular, for real human physiological samples from breath, blood, urine and skin, the confounding VOCs and background VOCs are very large in number. In this context, time-space resolved approach like a gas chromatography, using printed origami architecture, would be highly useful for analysing complex VOC mixtures in real applications for performing direct micro-gas chromatography like measurements in skin or other physiological samples in wearable format.

Figure 18A:
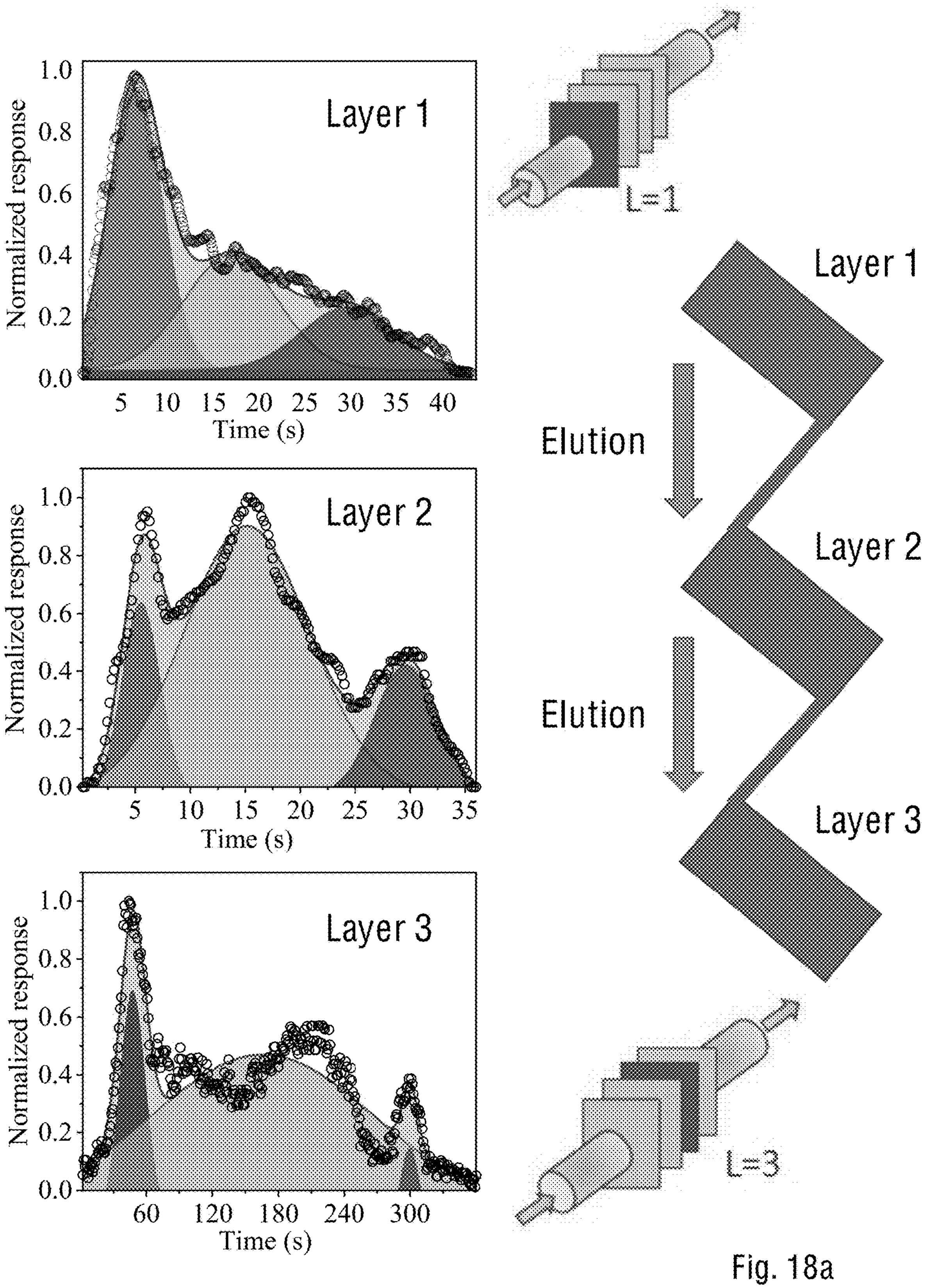
FIG. 18*a* shows an example of the μGC separation of methanol, ethanol and propanol mixture and their detection using the layered medium-based chromatography of the present invention.
Figure 18B:
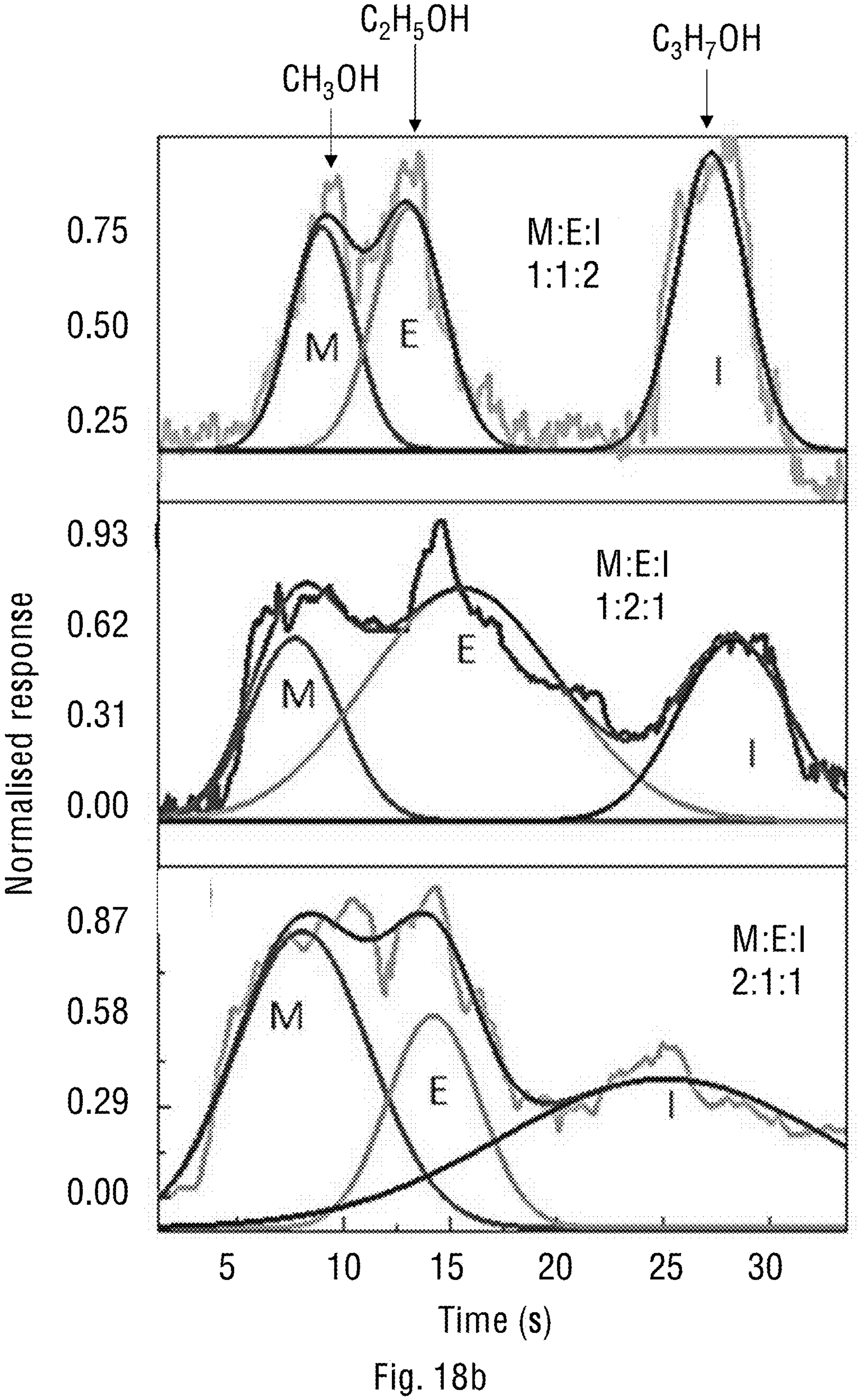
FIG. 18*b* shows the elution profile for Layer 2 of the layered-medium of FIG. 18*a* for three different mixture ratios of methanol, ethanol and propanol.
Figure 18C:
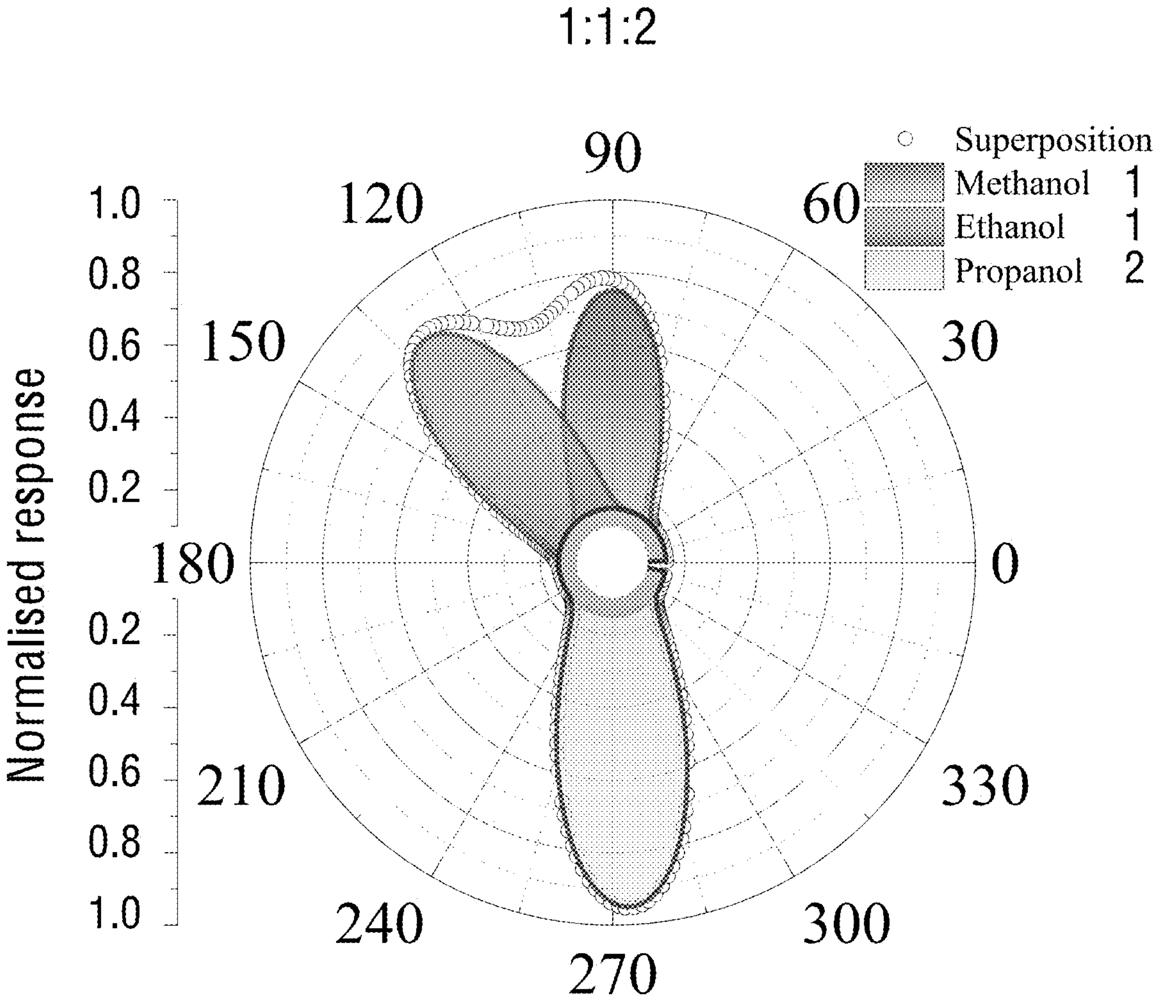
FIGS. 18*c*-18*e* show the corresponding radar charts for elution of each of the three mixtures, respectively.
Figure 18D:
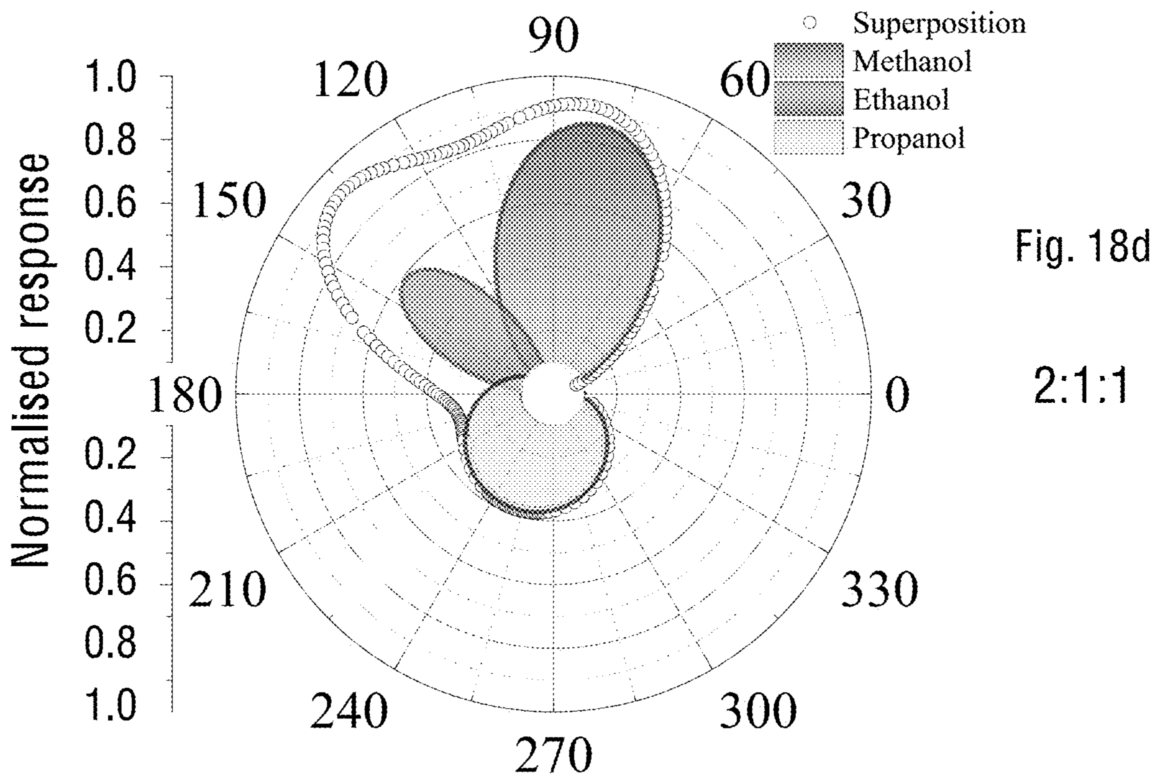
Figure 18E:
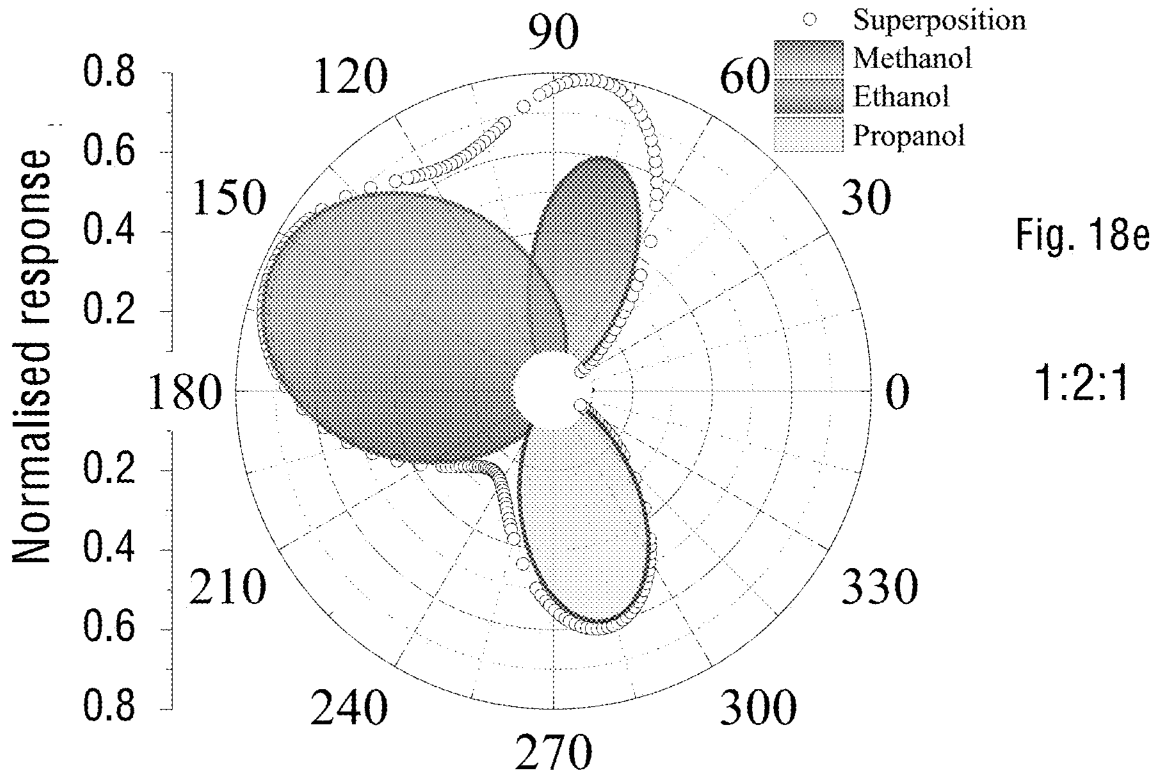

Reference is now made to FIG. 18*a* showing an example of the μGC-based separation of methanol, ethanol and propanol mixture of vapours (M:E:I=1:1:1) for the first three layers and the detection of the compounds using the layered medium-based chromatography of the present invention. This separation is reminiscent of the prismatic effect of splitting a white light beam into separate beams of different colours. FIG. 18*b* shows the elution profile for Layer 2 of the origami paper for three different mixture ratios of methanol, ethanol and propanol. FIGS. 18*c*-18*e* show the corresponding radar charts for elution of each of the three mixtures, respectively.

As expected in the first layer, sensing results showed no separation. However, already for the second and third layer, response kinetics shows three distinct peaks with a clear realisation of the μGC time-space-resolved-architecture. This simultaneous separation and sensing capability are originated from porous layered structure of the cellulose film used in this experiment within the μGC architecture which modulates unique mass transfer rate of each molecule in the mixture and creates distinct time to reach each layer, thereby creating three major peaks and area: for methanol, ethanol and isopropanol.

To confirm identification of each peak, sensing of additional vapour combinations was examined for different ratios (1:1:2, 2:1:1, 1:1:2), as shown in FIGS. 18*b* and 18*c*, which demonstrate results for Layer 2 only as a representative example. As seen in the figures, specific area or peaks for a certain VOC (analyte) is very sensitive to composition ratio and becomes larger or smaller according to nature of the applied mixture. The radial balloon plots in FIG. 18*c* clearly demonstrate the relative contribution of the specific components in this mixture, with the increase of the angle from 0 to 360° (time converted in angle (r)=t×10.28, where "t" is the time in seconds).

Figure 19:
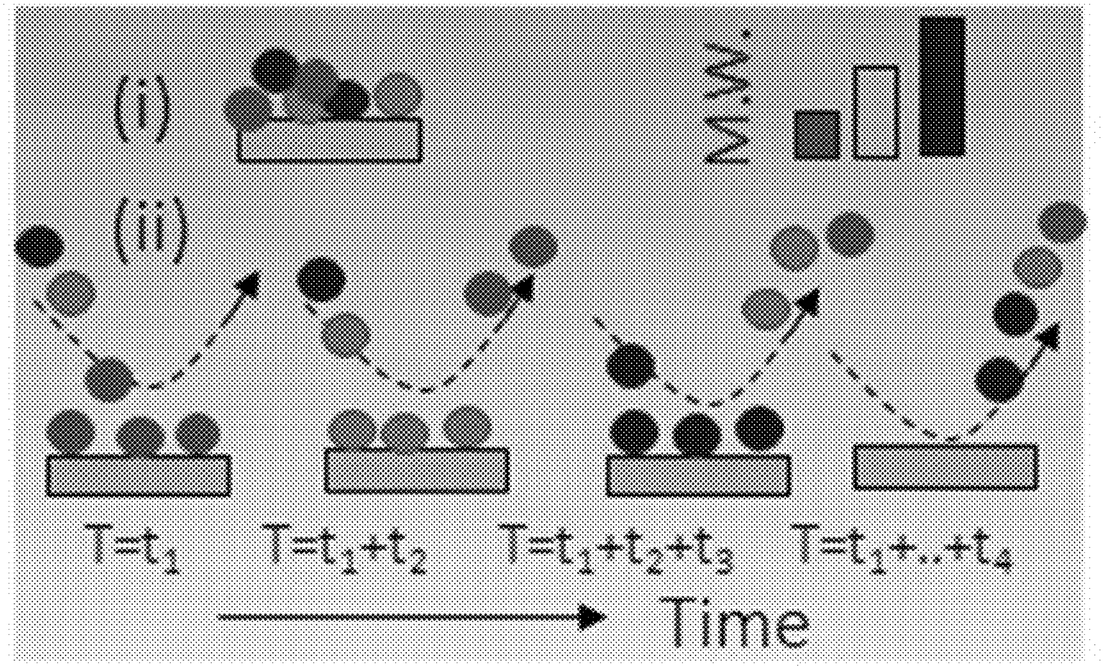
FIG. 19 shows the comparative schematic of (i) direct exposure, and (ii) time space-resolved exposure from the detector of the present invention, where each component of the mixture (having different molar mass) reaches and leaves the sensor surface at a different moment of time (i.e., $t_1$, $t_1+t_2$, . . . $t_1+t_2+t_3+t_4$).

FIG. 19 shows the comparative schematic of (i) direct exposure, and (ii) time space-resolved exposure from the detector of the present invention, where each component of the mixture (having different molar mass) reaches and leaves the sensor surface at a different moment of time (i.e., $t_1$, $t_1+t_2$, . . . $t_1+t_2+t_3+t_4$). Thus, the method of the present invention clearly provides much better information, as each component enters, interacts, and leaves a specific layer at a different moment of time (see FIG. 19(*ii*)), whereas the direct exposure approach exhibits a collective effect of all components during the measurement time (see FIG. 19(*i*)). A comparative result of the response kinetics is shown in FIGS. 16*a*-16*c*.

Kinetic Analysis of Voltage Transient

As mentioned above, the Gaussian distribution was used for fitting the peaks from mix gas analyses data to extrapolate the VOC component position. However, the Gaussian distribution is symmetric in nature. This means the response and recovery kinetics should be the same. Although it is easier to find fast discrimination of the peaks, in practice this is not applicable. The distribution of each VOC profile in mix condition is asymmetric in nature due to different adsorption/desorption energy.

To represent entire VOC kinetics, the inventors have developed a new equation that can represent the real-time picture. In continuous flow, it is assumed that during the adsorption and desorption, sensor resistance should reach a maximum point $t_{max}$ that is defined as the "maximum availability" of a specific VOC on a certain origami paper layer.

Based on the Langmuir absorption kinetics, the response-recovery kinetics is modelled, as shown in FIG. 19(*ii*), and can be expressed with the following equation to describe phenomena of entering, interacting, and leaving from a certain layer:

$$\frac{\Delta\varphi}{\Delta t} = k_a(1-\varphi)P_{voc} - k_d - \varphi$$

where $k_a$ and $k_d$ are the adsorption and desorption constants, $P_{voc}$ is the partial pressure of a volatile organic compound to be tested, and φ(t) is a fractional occupancy of the adsorption sites or the surface coverage which is linearly proportional to the sensor's conductance G (t).

Figure 20A:
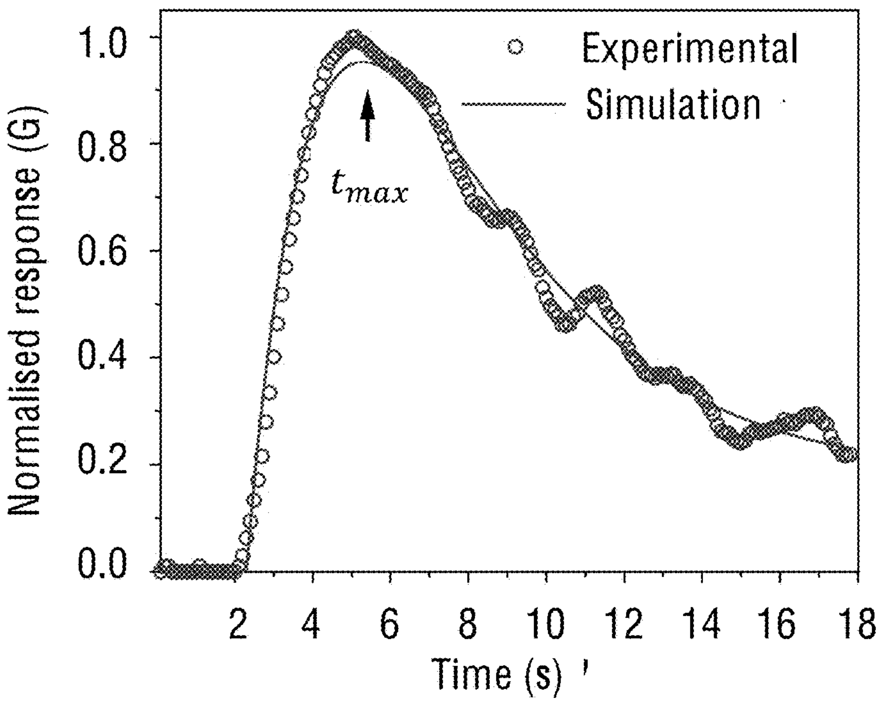
FIG. 20*a* shows the experimental and calculated Gaussian transient to evaluate $t_{max}$.
Figure 20B:
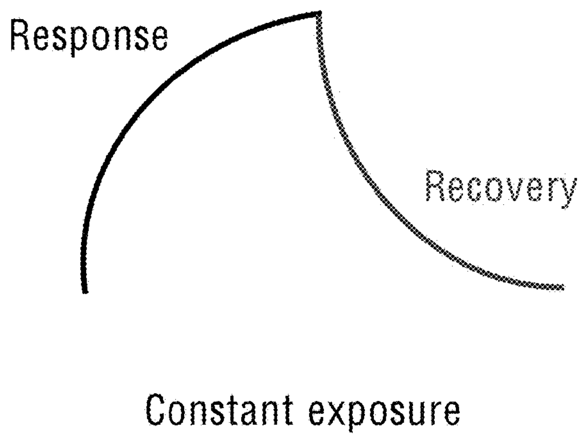
FIG. 20*b* shows the theoretical response and recovery kinetics under constant exposure.

Reference is now made to FIG. 20*a* showing the experimental and calculated Gaussian transient to evaluate $t_{max}$. After solving the above equation, one can get the expression for response and recovery kinetics (see FIG. 20*b*):

$$\text{Responce: } G(t)_{response} = a + b\left(1 - \exp^{-\frac{t}{c}}\right)$$

$$\text{Recovery: } G(t)_{recovery} = b + d\left(\exp^{-\frac{t}{e}}\right)$$

where G (t) is continuous measurement of sensor resistance at a certain time (t), $t_{max}$ is time of electrical resistance maxima representing for a specific analyte and different for different analytes, and a, b, c, d, e are respective kinetical constants, adsorption, and desorption parameters.

In the present case, some specific gas molecule enters a specific layer, react with sensor (response), leaves (recovery) and provides a unique time moment ($t_{max}$) where the electrical resistance reaches maximum. To express mathematically the entire phenomena, the entire electrical resistance transients should be the superposition.

Thus, in the method of the present invention, due to continuous flow, the adsorption/desorption is simultaneously active and therefore, the entire conductance transients should be the superposition of both contributions. This is markedly different from constant exposure where response and recovery never overlap. In that case, only after the sensor reached an equilibrium in constant VOC exposure during the response, the recovery begins. But in the present invention, due to continuous flow, both adsorption and desorption is active and therefore, the resultant equation should be written as:

$$G(t)_{total} = a + b\left(1 - \exp^{-\frac{t}{c}}\right) + b + d\left(\exp^{-\frac{t}{e}}\right)$$

Figure 21A:
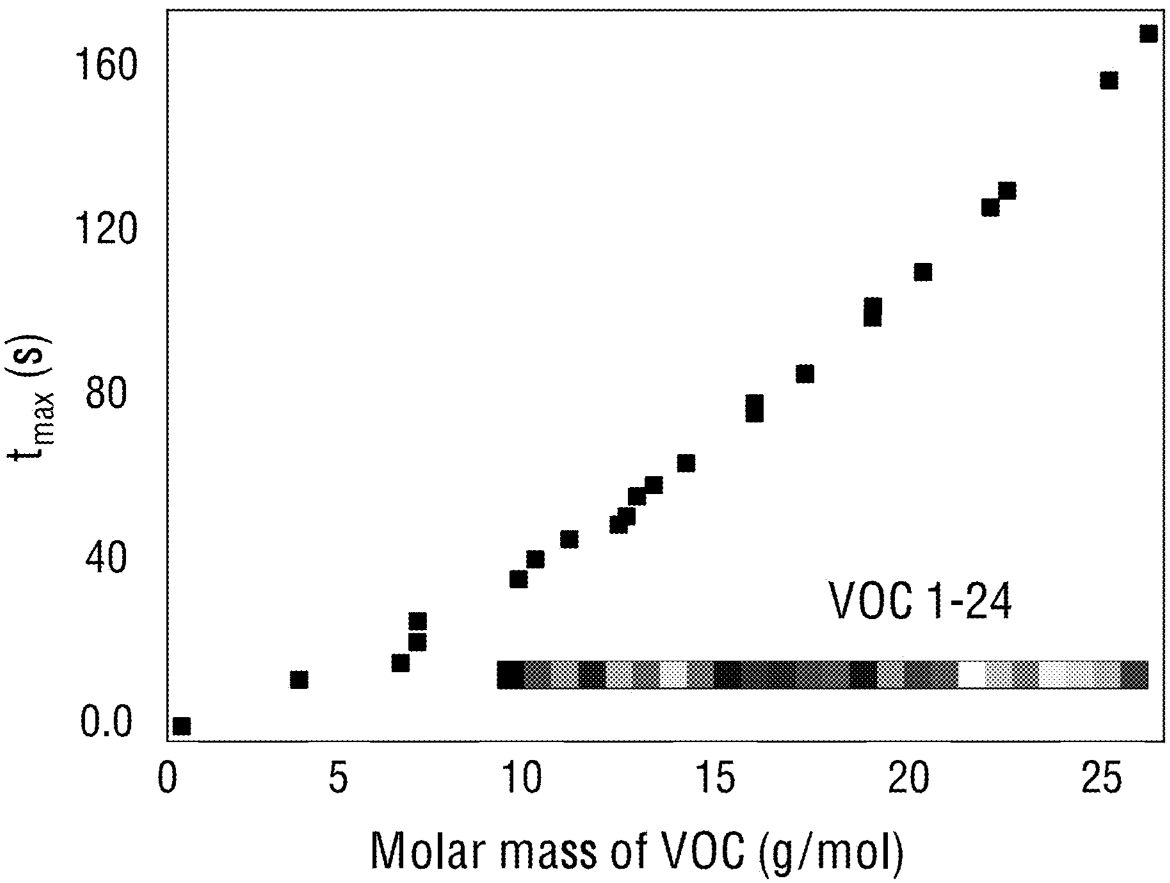
FIGS. 21*a*-21*b* demonstrate estimation of $t_{max}$ at Layer 2 for each single VOC of 24 types.

Due to difference in adsorption and desorption energy (c and e in the above equation), fitted sensing profile is asymmetric and broad (see FIG. 20*a*). For multiple analytes in a specific mixture, the above equation could be superposed with the distinct $t_{max}$, b, c, e values. FIG. 21*a* is a typical calculated $t_{max}$ for different analytes at Layer 2 and shows the variation of $t_{max}$ with molar mass of different VOCs.

Figure 20C:
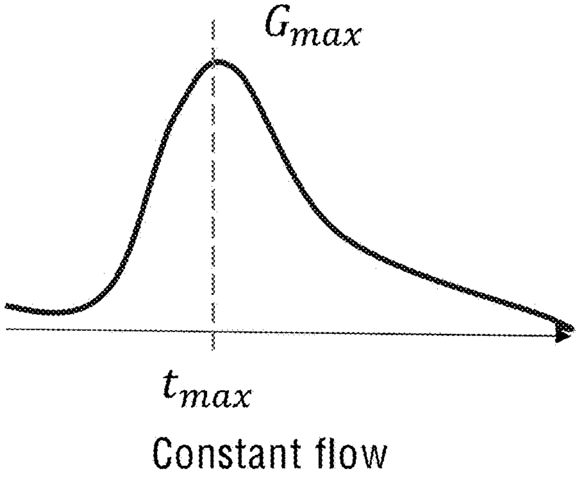
FIG. 20*c* shows the G (t) function of a constant flow exhibiting a maximum where the probability for finding the VOC is also maximum.

In this case, G (t) represent a maximum where the probability for finding the VOC is also maximum (see FIG. 20*c*). It means that at $t=t_{max}$, G $(t)=G_{max}$, and $$\frac{\Delta G_{total}}{\Delta t} = 0$$

Solving the above equation returns the following value of $t_{max}$:

$$t_{max} = \frac{ce}{(c-e)} \ln \frac{dc}{eb}$$

Adding the $t_{max}$ value into the above G (t) total equation gives the following expression:

$$G(t)_{total} = a + b\left(1 - \exp^{-\frac{t}{c}}\right) + \frac{e}{c}\exp\left[\left(t_{max}\frac{c-e}{ce}\right) - \frac{t}{e}\right]$$

Figure 20D:
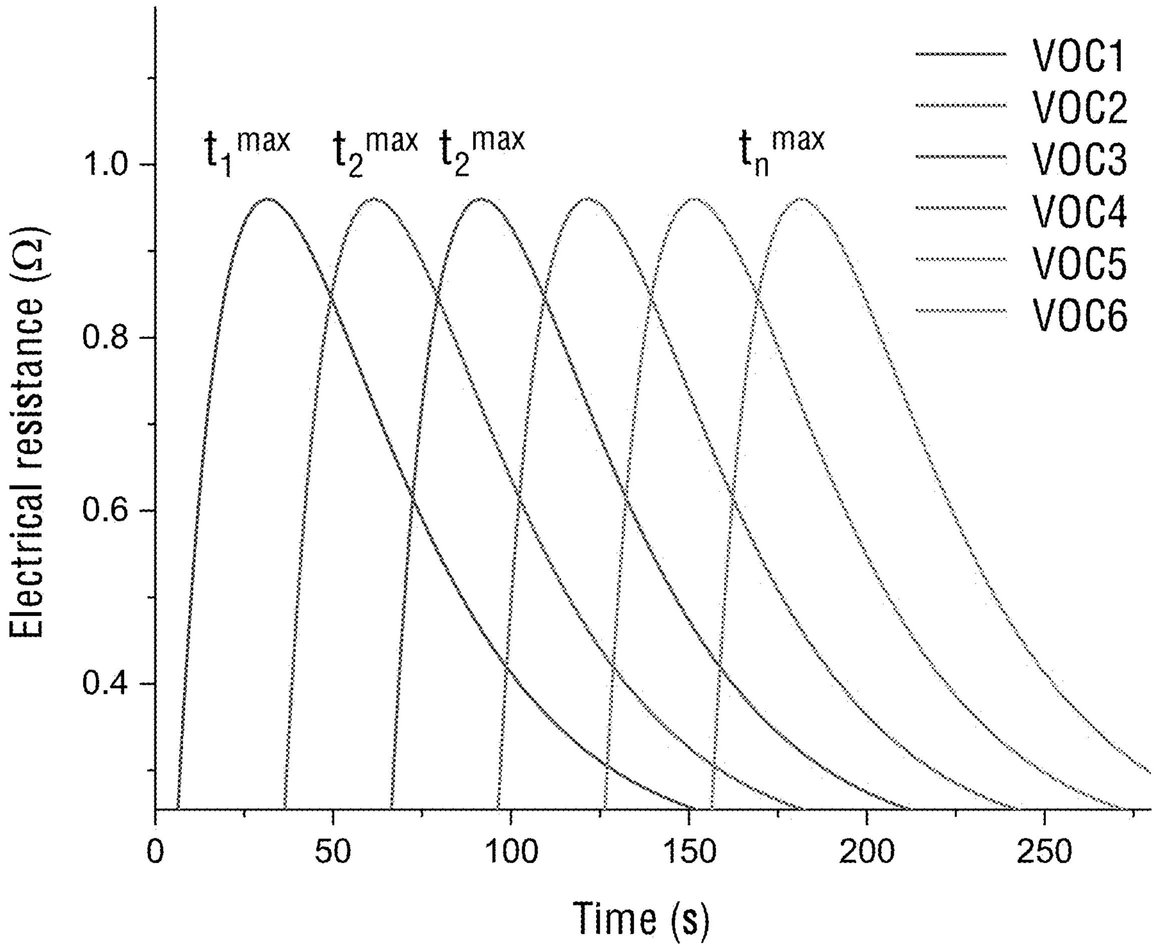
FIG. 20*d* shows the superposition of each component ($VOC_1$, $VOC_2$, . . . . $VOC_n$) of the mixture.

From the above equation, it becomes clear that $t_{max}$ corresponds to each VOC peak in the continuous micro-GC chromatogram and depends on the physico-chemical properties of each tested compound (VOC), where each VOC is eluted at different time and creates separate $t_{max}$ for each VOC. Thus, the resultant equation for the multi-VOC mixture represents the superposition of each component ($VOC_1$, $VOC_2$, . . . . $VOC_n$) (see FIG. 20*d*):

$$G_n(t)_{total\,(VOC\,mix)} = a + b\left\{b_1\left(1 - \exp^{-\frac{t}{c_1}}\right) + \frac{e_1}{c_1}\exp\left[\left(t_{max_1}\frac{c_1-e_1}{c_1e_1}\right) - \frac{t}{e_1}\right]\right\} + \left\{b_2\left(1 - \exp^{-\frac{t}{c_2}}\right) + \frac{e_2}{c_2}\exp\left[\left(t_{max_2}\frac{c_2-e_2}{c_2e_2}\right) - \frac{t}{e_2}\right]\right\} + \ldots \left\{b_n\left(1 - \exp^{-\frac{t}{c_n}}\right) + \frac{e_n}{c_n}\exp\left[\left(t_{max_n}\frac{c_n-e_n}{c_ne_n}\right) - \frac{t}{e_n}\right]\right\}$$

Figure 21B:
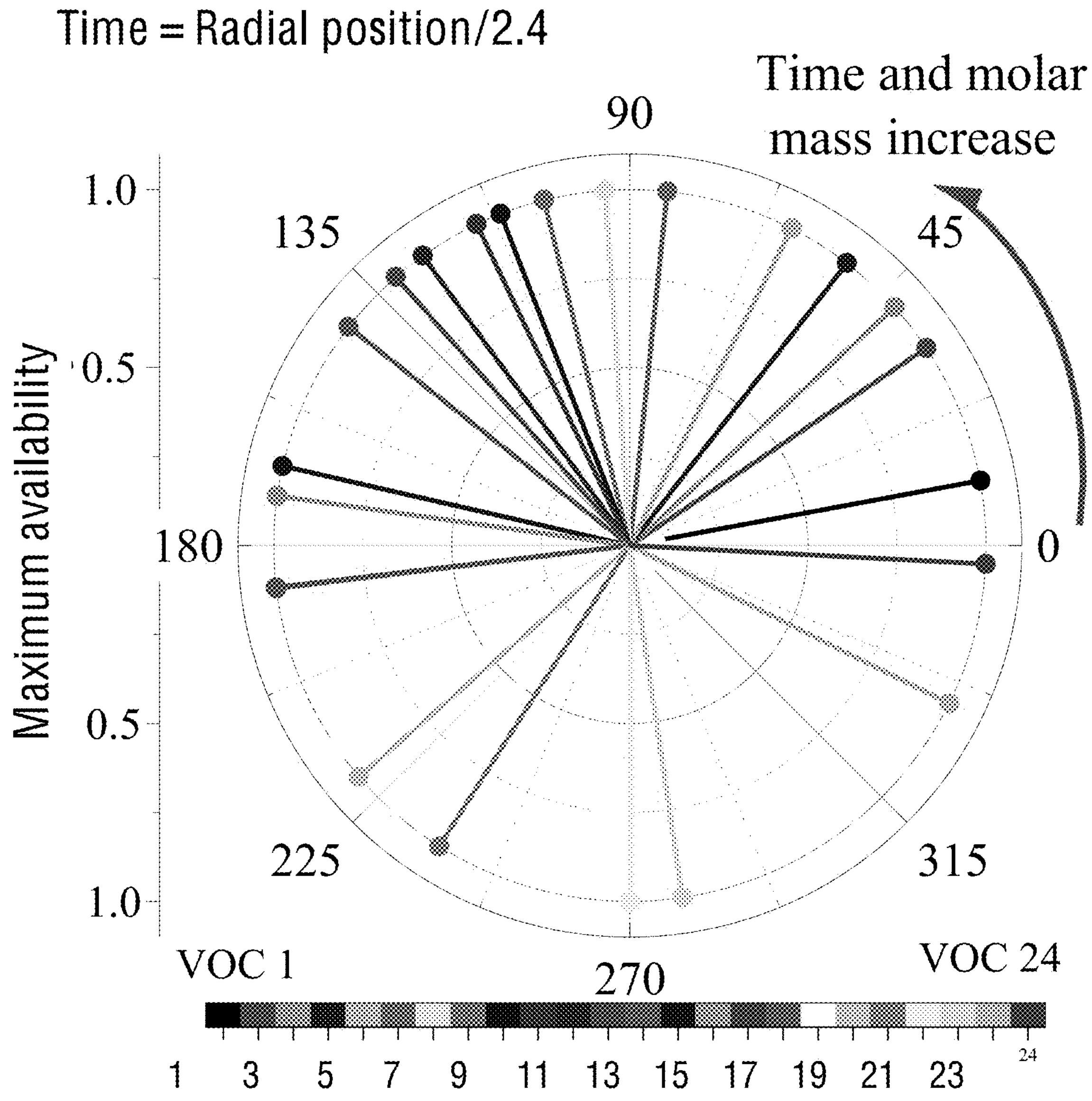

The method of the present invention was further challenged with more complex mixtures of 24 analyte types (alcohols, aldehydes, ketones, hydrocarbons and organic acids) Reference is now made to FIGS. 21*a*-21*b* demonstrating estimation of $t_{max}$ at Layer 2 for each single VOC of various types. The experiment was conducted by mixing 24 different type volatile organic compounds having molecular mass in the range of 32 to 147 g/mol, mixed in various combinations and applied to the origami layers to separate and sense sequentially. The VOCs list is given below:

| | |
|---|---|
| VOC1 | Methanol |
| VOC2 | Ethanol |
| VOC3 | Acetone |
| VOC4 | Acteic acid |
| VOC5 | Propanol |
| VOC6 | 2-butanone |
| VOC7 | Butanol |
| VOC8 | benzene |
| VOC9 | cyclohexane |
| VOC10 | di-chloromethane |
| VOC11 | Hexane |
| VOC12 | Pentanol |
| VOC13 | Toluene |
| VOC14 | 2-Hexanone |
| VOC15 | Hexaldehyde |
| VOC16 | xylene |
| VOC17 | ethylebnzene |
| VOC18 | heptaldehyde |
| VOC19 | octane |
| VOC20 | 1,2,4, TMB |
| VOC21 | Nonane |

-continued

| | |
|---|---|
| VOC22 | Heptanoic acid |
| VOC23 | Decane |
| VOC24 | dichlorbenzene |

The mixing ratio in the above experiment was 10:1. For example:

$$MVOC1 \rightarrow \text{Methanol: Other 23 types} = 10:1$$
$$MVOC2 \rightarrow \text{Ethanol: Other 23 types} = 10:1$$
$$\ldots$$
$$MVOC24 \rightarrow \text{Dichlorobenzene: Other 23 types} = 10:1$$

Figure 22A:
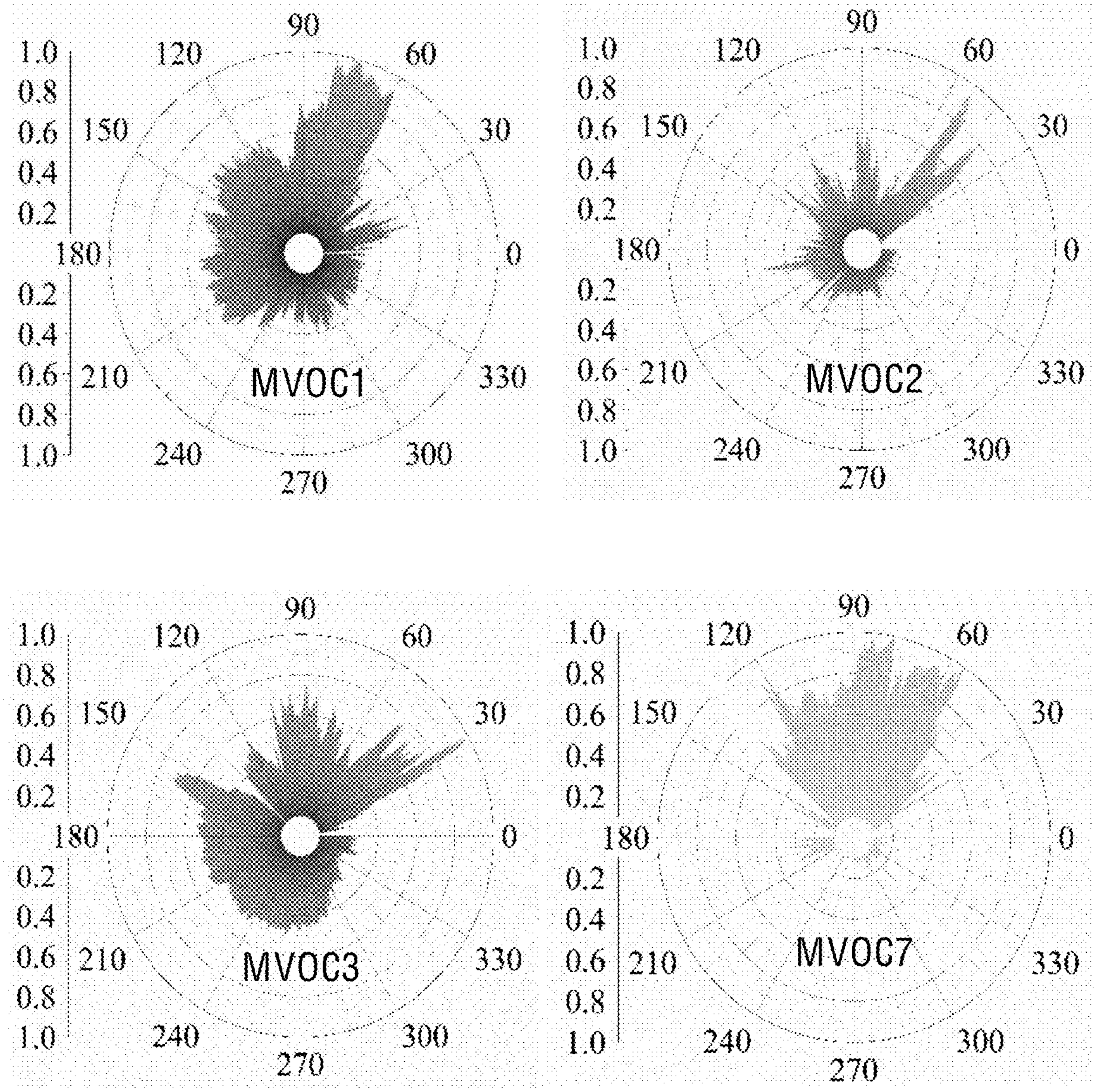
FIGS. 22*a*-22*c* show the mixed VOCs sensing test results in a radar chart representation for some of 24 VOC mixtures.
Figure 22B:
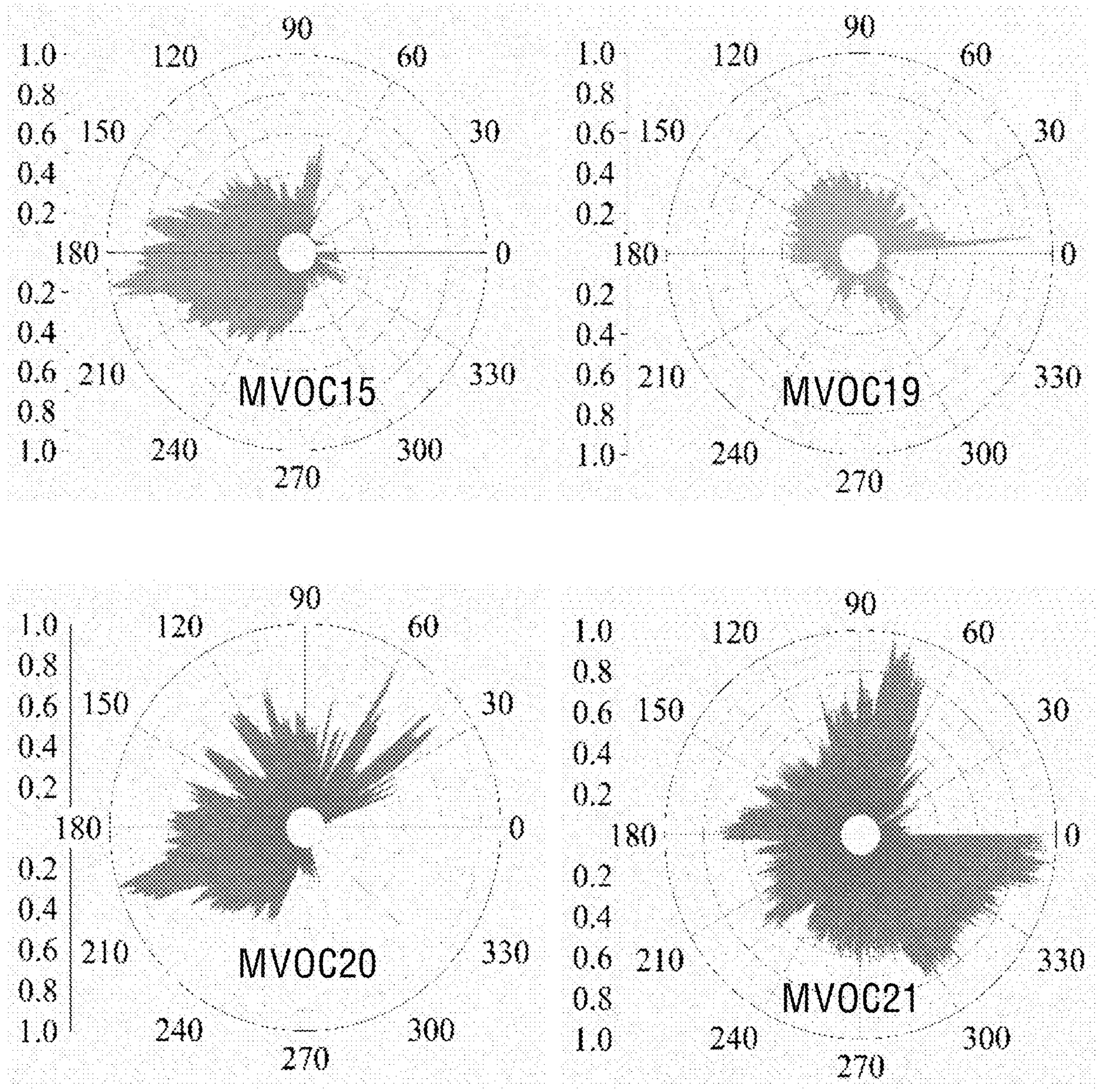
Figure 22C:
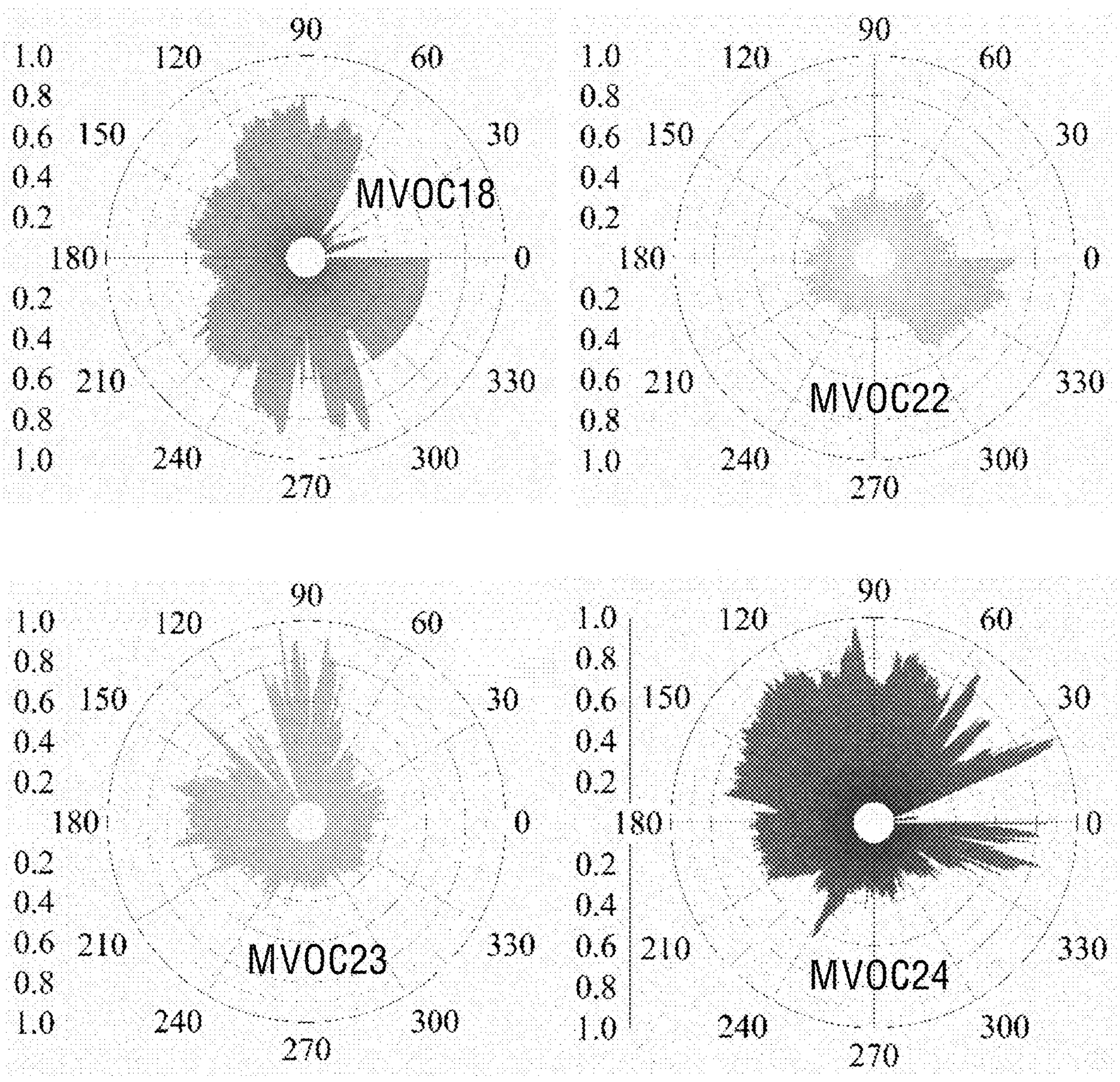

FIGS. 22*a*-22*c* show the mixed VOC sensing test results for some of 24 MVOC mixtures tested at the second layer in a radar chart format with very clear separation of each VOC component. For example, MVOC2 in FIG. 22*a* shows the typical radar chart for 24 mixed VOCs of different ratio for ethanol rich mixture (e.g., ethanol to other 23 VOCs is about 10:1). MVOC3 in FIG. 22*a* shows the typical radar chart for ketone rich mixture (e.g., acetone to other 23 VOCs is about 10:1). The typical radar chart for aldehyde rich mixture (e.g., hexaldehyde to other 23 VOCs is about 10:1) is shown as MVOC15 in FIG. 22*b*, while MVOC22 in FIG. 22*c* shows the typical radar chart for an organic acid rich mixture (e.g., heptanoic acid to other 23 VOCs is approximately 10:1). The typical radar chart for hydrocarbon rich mixture (e.g., decane to other 23 VOCs is approximately 10:1) is shown as MVOC20 in FIG. 22*b* and MVOC24 in FIG. 22*c* shows the typical radar chart for benzene compound rich mixture (e.g., dichlorobenzene to other 23 VOCs is approximately 10:1).

Machine Learning

Figure 23A:
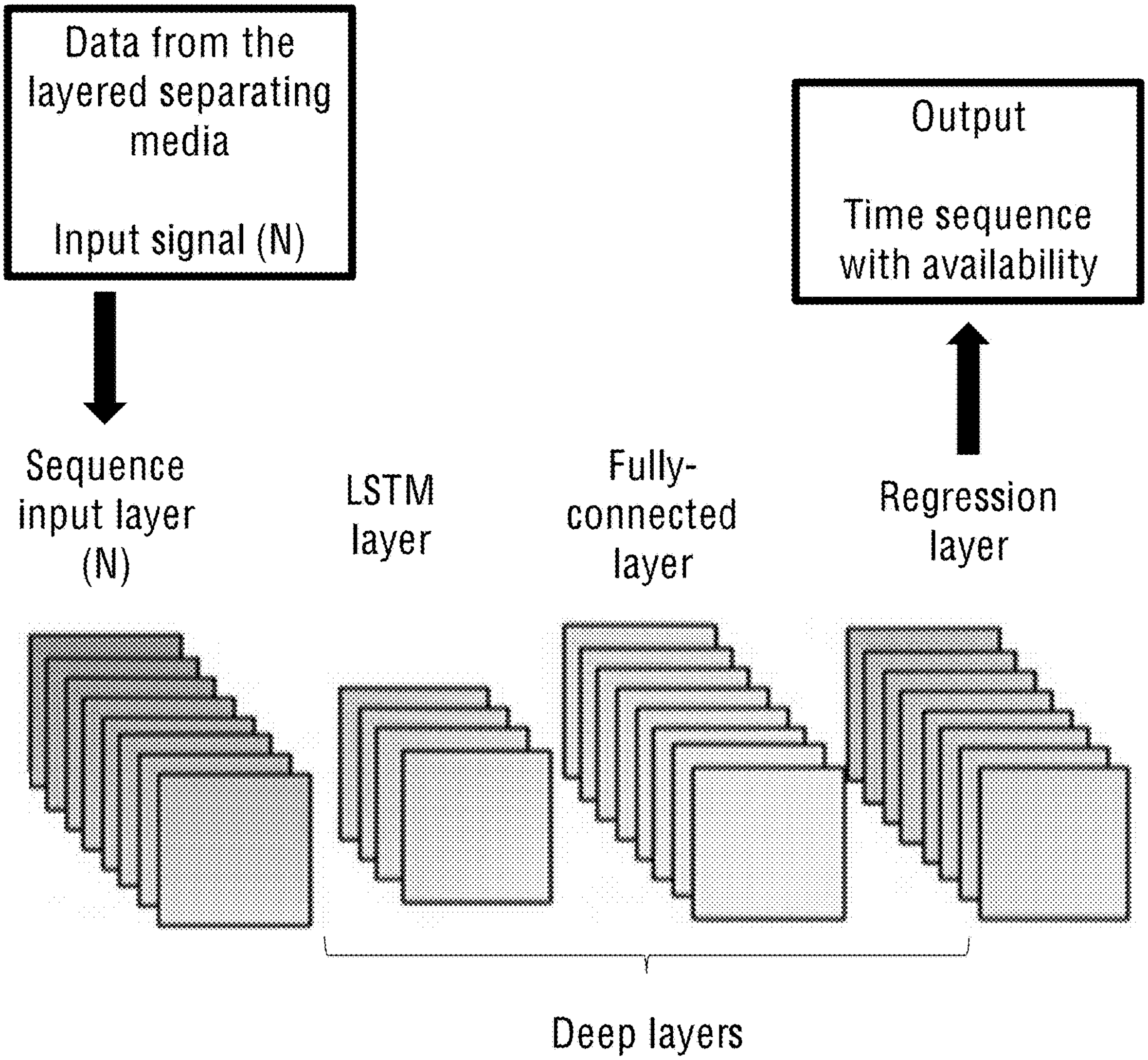
FIGS. 23*a*-23*b* show the machine learning-based architecture and wavelet-based signal processing, respectively, for compressing the μGC-derived large data set of the results obtained from the layered separating medium for predicting the chromatogram.
Figure 23B:
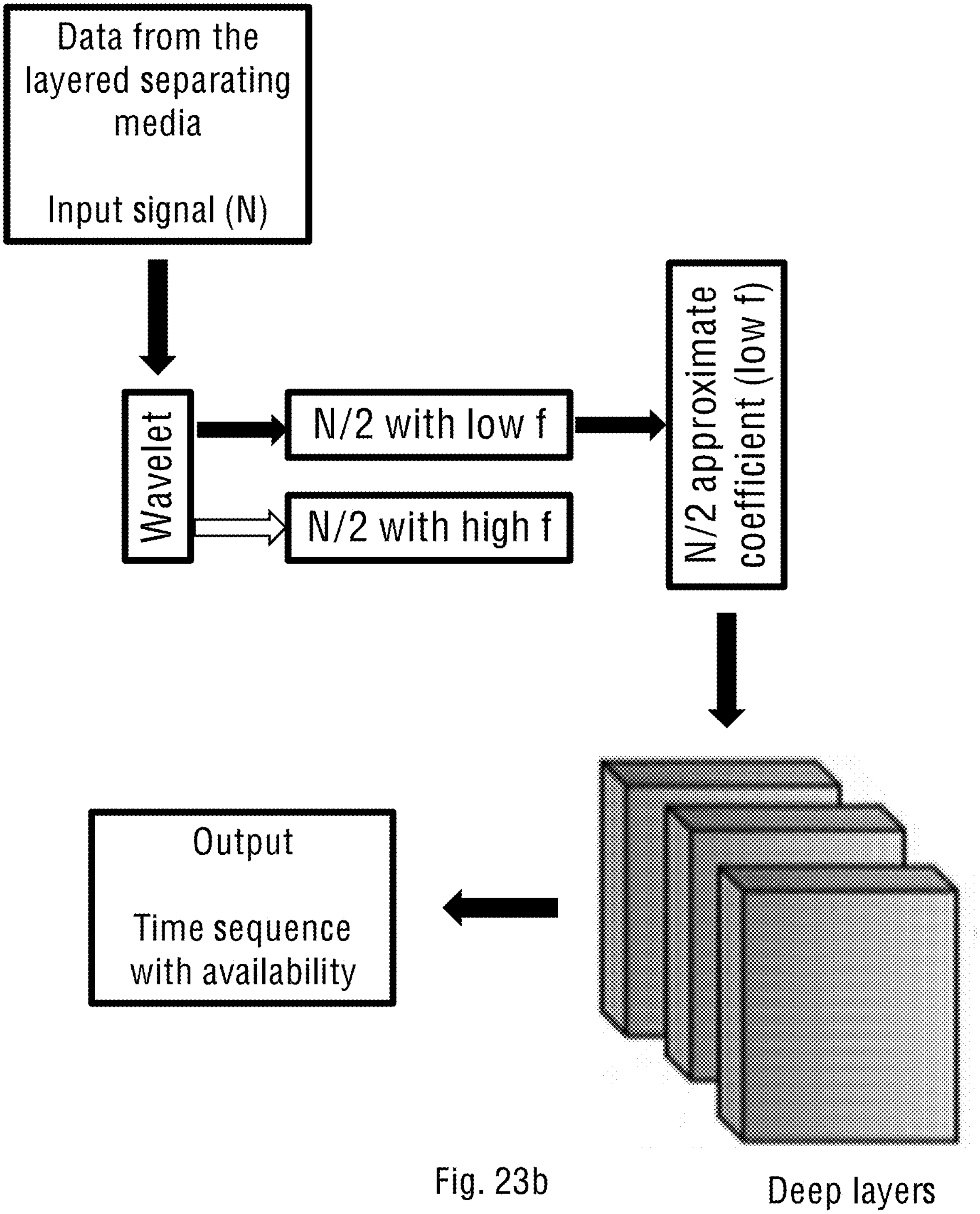

All complex data set was used as a sequence input to machine learning for generating the predicted continuous chromatogram or spectrogram of typical mix samples MVOC1-12. Details of input-generation, hidden-layer optimisation and data-compressing using wavelet-based signal processing are provided below. FIGS. 23*a*-23*b* show the machine learning-based architecture and wavelet-based signal processing, respectively, for compressing the μGC-derived large data set of the results obtained from the layered separating medium for predicting the chromatogram.

Figure 24:
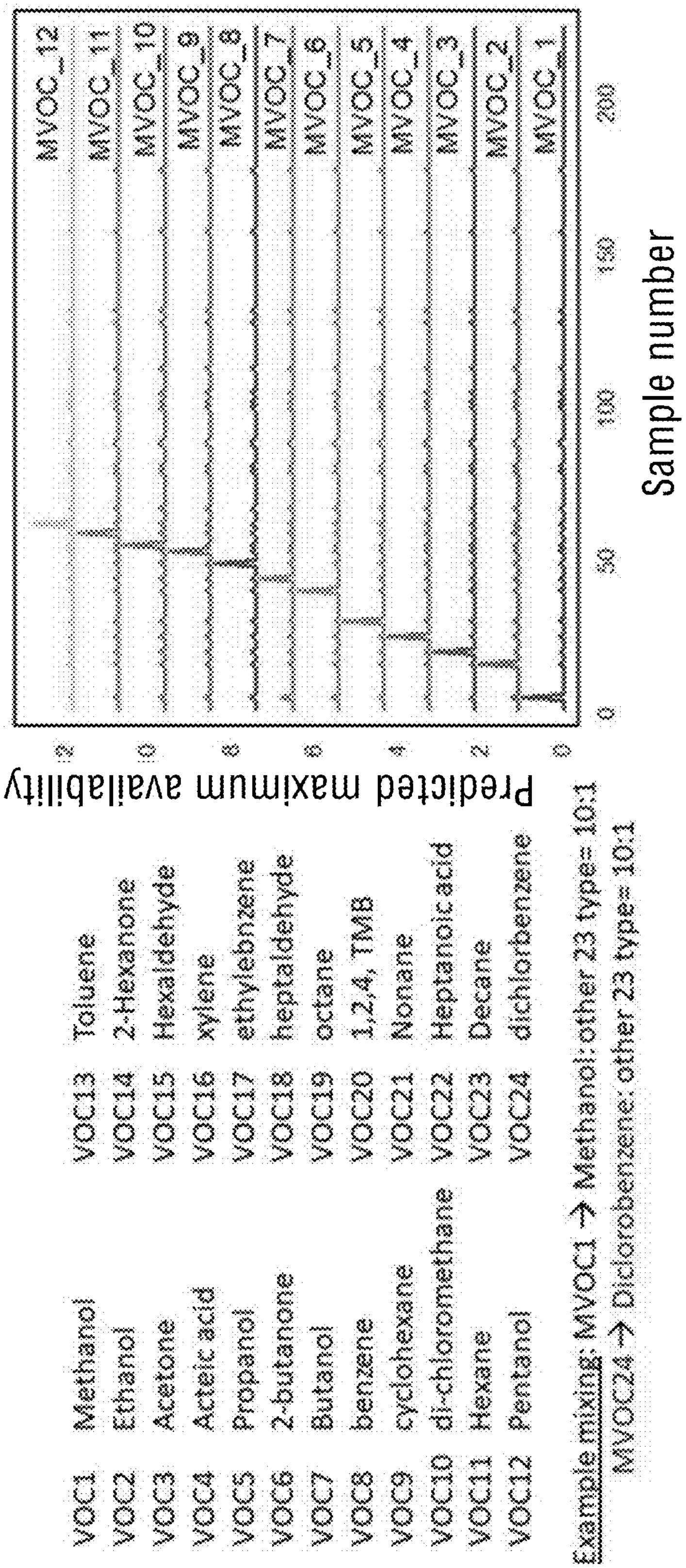
FIG. 24 shows the machine-learning predicted μGC chromatograms from all the typical complex mix VOC samples (MVOC1-MVOC12) in the Layer 2 of the layered separating medium using 50 hidden machine-learning LSTM layers.

The Layer 2 of the layered medium-derived sensing profile of the VOCs mixes of 24 types is thus analysed through machine learning and wavelet-based signal processing to generate the chromatogram or spectrogram. FIG. 24 shows the machine-learning predicted μGC chromatograms from all the typical complex mix VOC samples (MVOC1-MVOC12) in the Layer 2 of the layered separating medium using 50 hidden machine-learning LSTM layers. As clearly seen from the figure, the neural network of the invention perfectly predicted all the VOC mix components from 24 types and generated the GC-like chromatograms using the time-space resolved layered separating-medium architecture.

Machine-learning neural network architecture is constructed by MATLAB program with a typical sequence input layer which is fed from the time space resolved data (read from Layer 2). This specific time-resistance sequence is further processed to LSTM layer and fully connected layers. Then finally a regression layer is added in the end of the process to generate the chromatogram or spectrogram for continuous prediction. Due to large data set, the wavelet-based signal processing (with Haar Level 3 decomposition)

is used in order to compress the time sequence data (N) from the approximated coefficients values (N/2), and then used for deep neural network's sequence input layer.

For enantiomers and isomers mix state, the image processing is used by synthetically constructed input image from Layer 2 μGC-derived data and fed to the self-learning architecture of the deep net layers, which has the subsequent consecutive layers, such as, image-input layer, a 2-D convolutional layer ("convolution2dLayer" operation in MathWorks®), rectified linear unit (ReLU) layer ("reluLayer" operation in MathWorks®), a 2-D max pooling layer ("maxPooling2dLayer" operation in MathWorks®), fully connected layer, classification layers. Convolutional and batch normalisation layers are usually followed by a nonlinear activation function such as a rectified linear unit (ReLU), which is specified by a ReLU layer. The ReLU layer performs a threshold operation to each element of the input, where any value less than zero is set to zero. Before the training, each image input sequence has been resized with same dimension. Deep net system automatically samples the features from an image by itself and uses them for learning to classify the various mixed enantiomers and isomers.

Figure 25A:
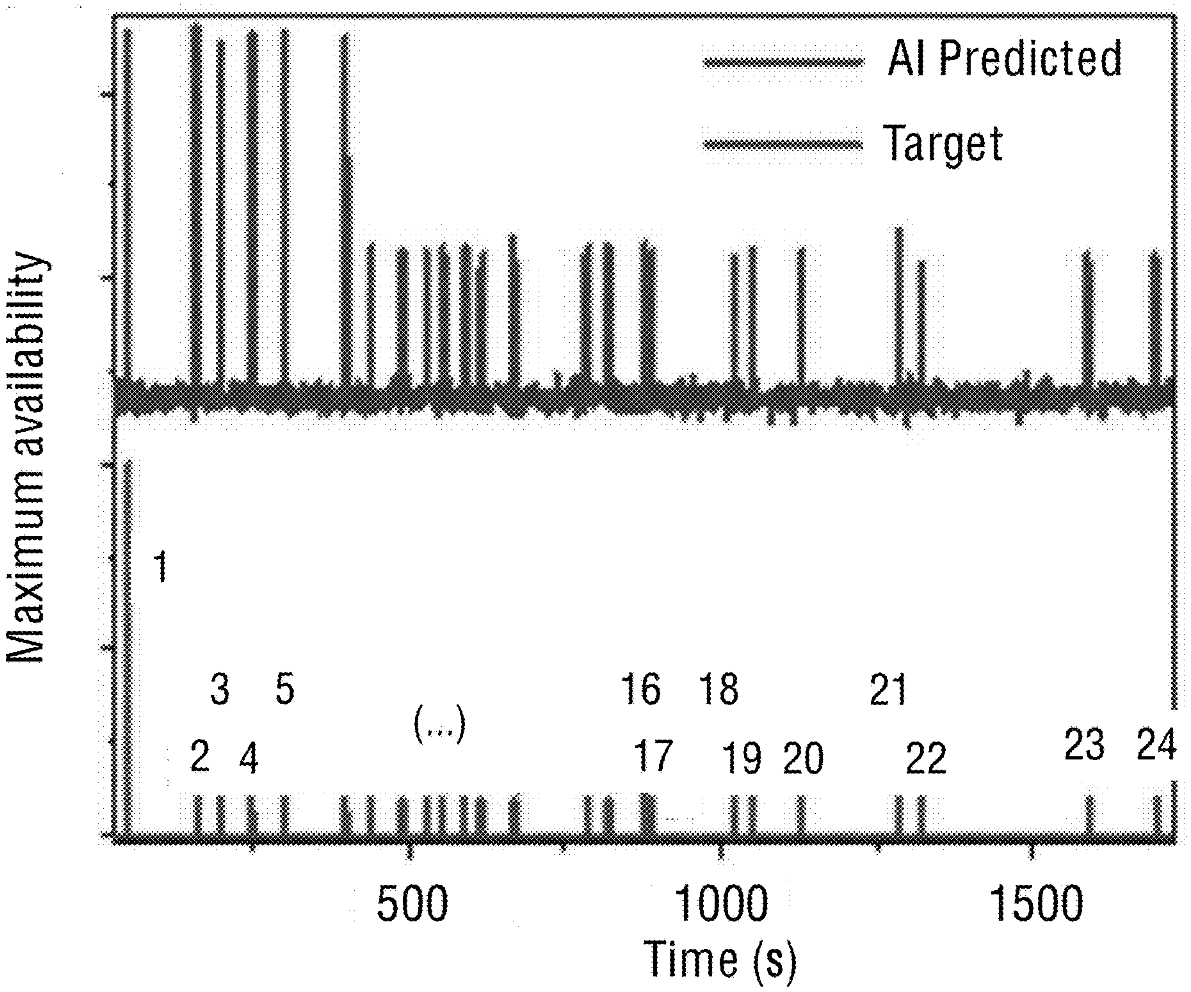
FIG. 25*a* demonstrates the typical predicted chromatogram for MVOC1 (methanol with other VOC type approximately 10:1) using the uncompressed data set from Layer 2 of the layered separating medium subjected to the μGC analysis (the VOC number is mentioned in FIG. 24 and assigned to a particular analyte).

FIG. 25*a* shows the typical predicted chromatogram for MVOC1 (mass ratio of methanol to 23 types of other VOCs is 10:1) using the entire, time-domain, uncompressed data set obtained from Layer 2 of the layered separating medium subjected to the μGC analysis. This entire, huge, time-domain matrix set (which is 1800 time-stamps×72 cases, i.e., 24 different types×3) was used for building the neural network from Layer 2 of an origami paper as a layered separating medium, where the Layer 2 demonstrated to be the best option as "input" information. The "input" to a neural network used in the method of the present invention is defined as a string or an array of measurement results generate with the detector of the present invention, such as μGC. The input is a string of classical bits (in case of appearance a single signal or peak in the chromatogram at a certain time event point, which is time of chromatographic elution) or integers (in case of a group of signals) $y_i$, where each bit in the string accepts the value of either '0' or '1' corresponding to a non-successful and successful measurement of the compound at time $t_i$ (time stamp) of the experiment, respectively, and where the value of each integer is any integer number corresponding to the measured frequency, voltage, sensor conductance, maximum availability or amplitude of the input. The latter is the case of many μGC measurements, which are performed via a series of experiments, and therefore, the generated μGC chromatography data is an average of many peaks in the μGC chromatogram in a form of a continuous output.

Figure 25B:
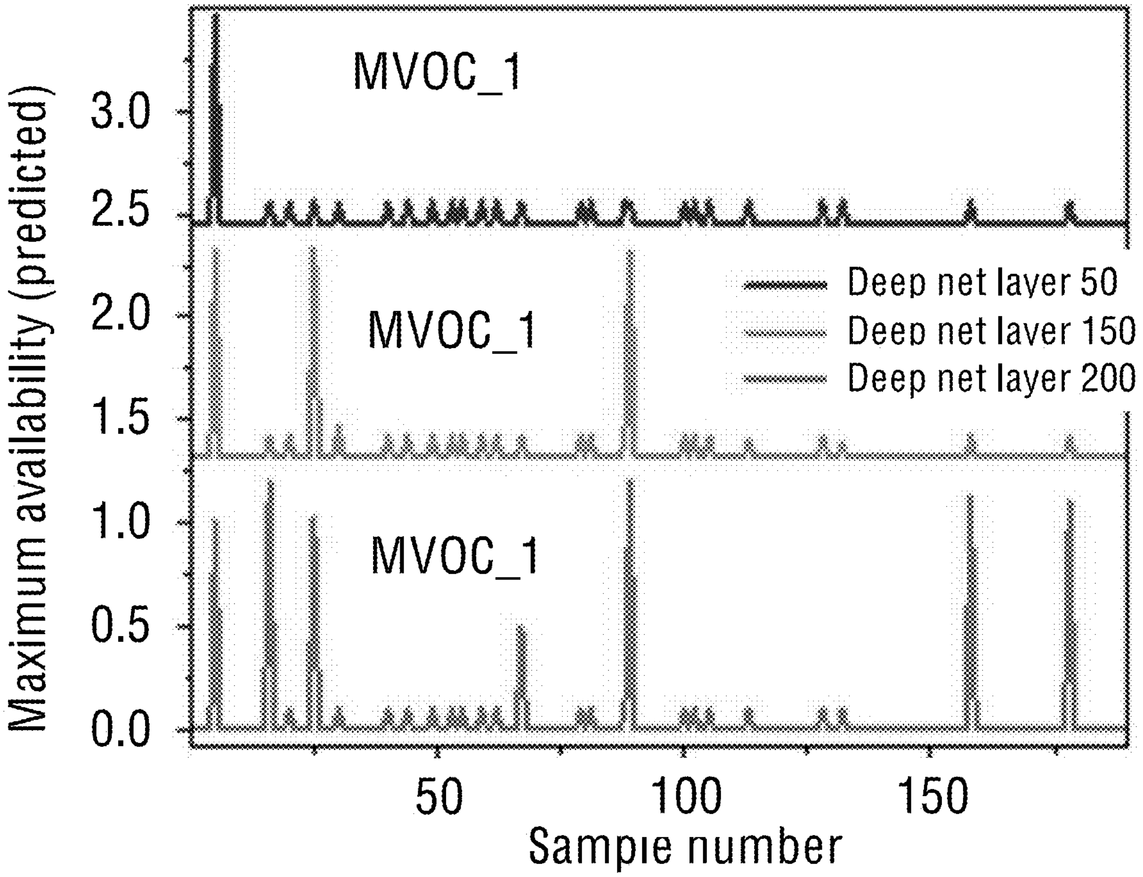
FIG. 25*b* shows the improved predicted chromatogram obtained from the wavelet-based compressed data as input for various hidden deep layers (50-200), which provide more than 95% accuracy.
Figure 25C:
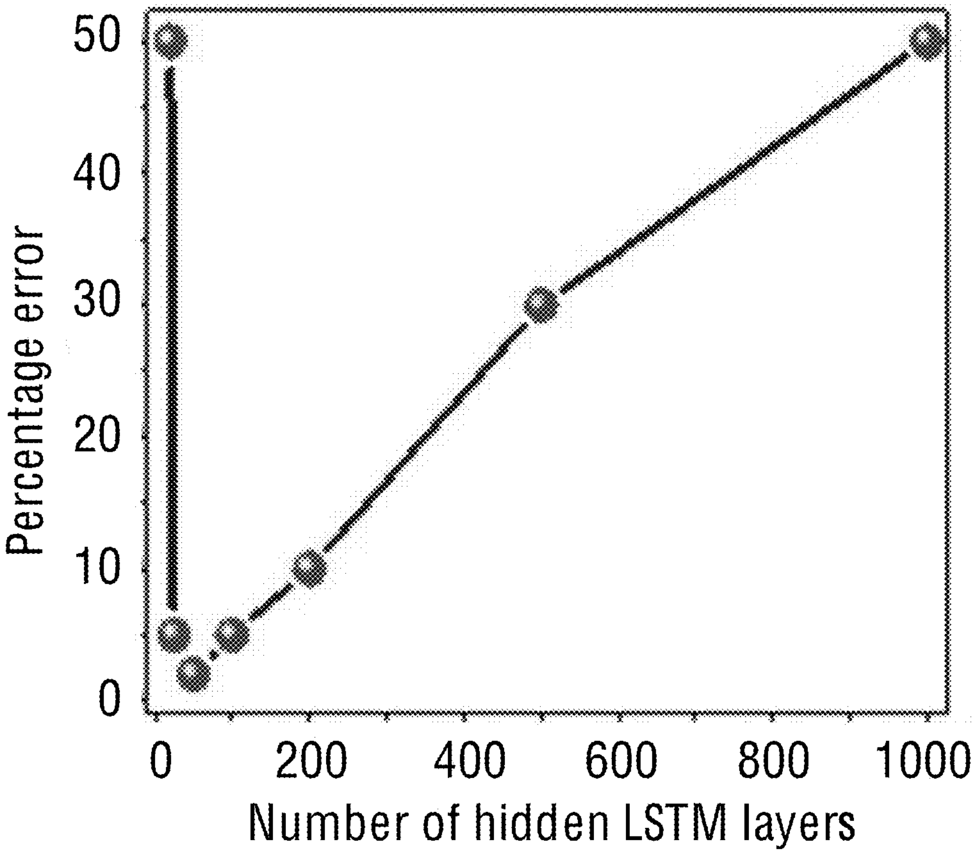
FIG. 25*c* shows the optimisation of the hidden layer number from the minimum error (or maximum accuracy) in the prediction.

The predicted result does not match properly with the target ratio and could be due to large time stamp and data information and need to optimise the hidden layer information with longer training time. To solve this, the μGC-derived input large data set is further compressed with wavelet transformation without losing important information and then used for deep net input as described above. FIG. 25*b* shows the improved predicted chromatogram for various hidden deep net layers (50-200). As clearly see in FIG. 25*c*, here 50 hidden layer shows the lowest error for the best prediction of the chromatogram and therefore, they are used for prediction of other mixed vapours.

Figure 26:
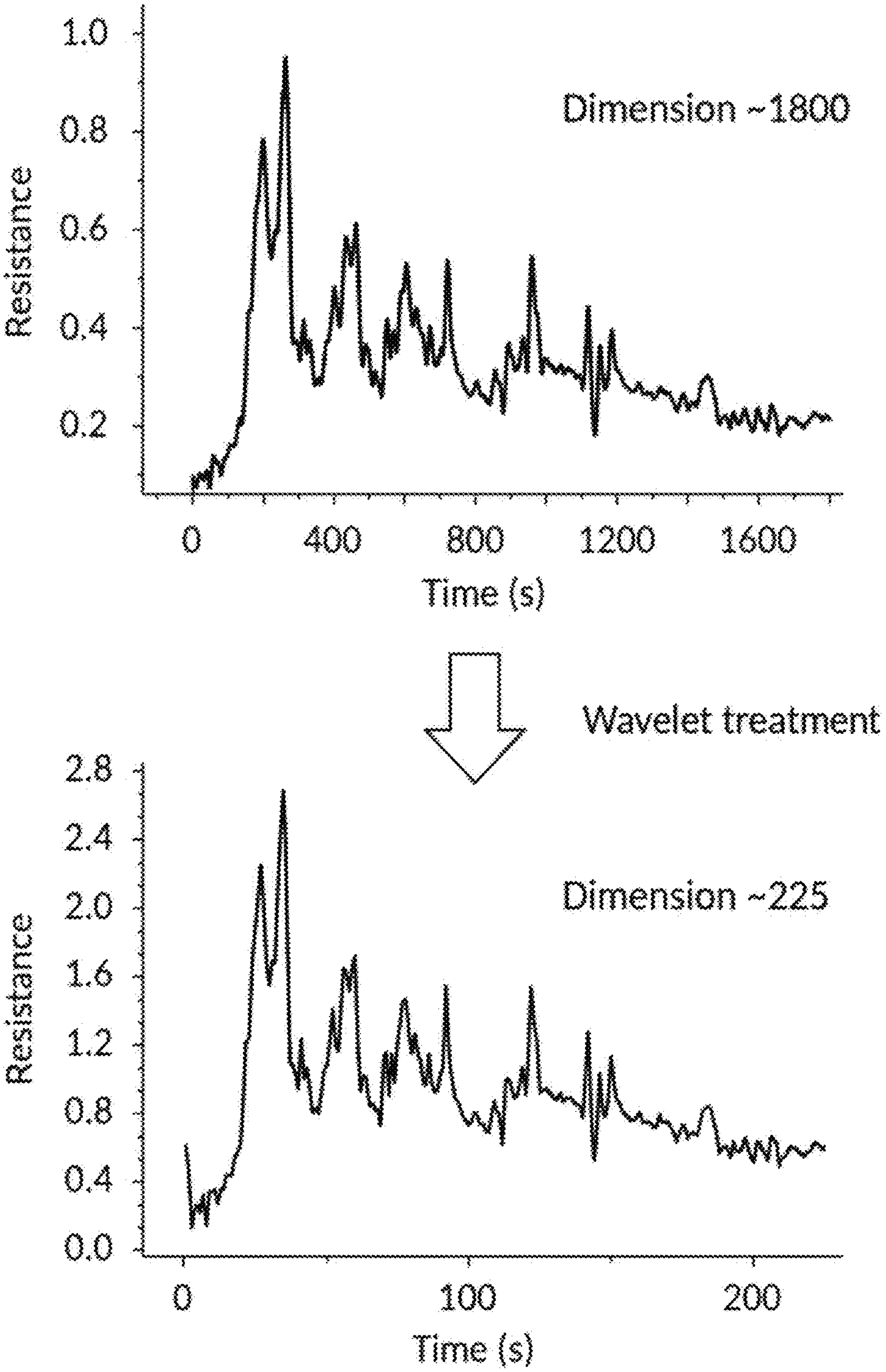
FIG. 26 shows the obtained MVOC2 data having the dimension of 1800 time-stamps, and the compressed MVOC2 data having the dimension of 225 time-stamps obtained after the wavelet treatment.
Figure 27A:
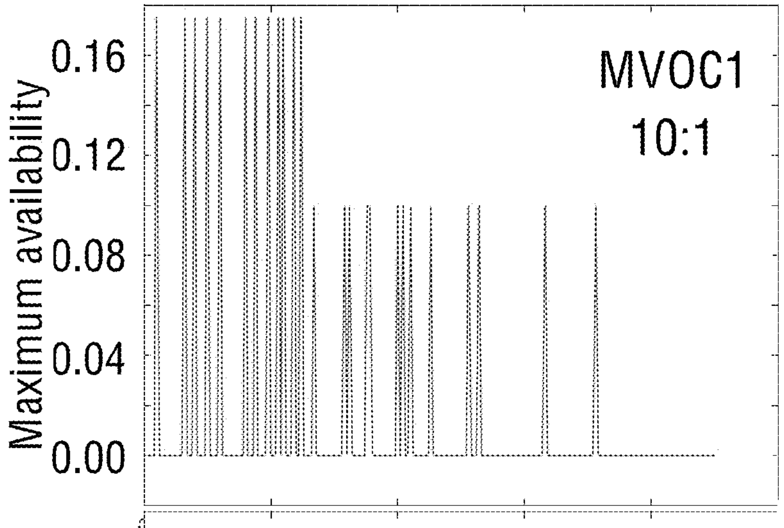
FIGS. 27*a*-27*c* show the neural network predicted chromatogram using the wavelet treated origami layer generated data for the MVOC1 with the different number of the hidden LSTM layers, i.e., 200, 150 and 50 layers, respectively.
Figure 27B:
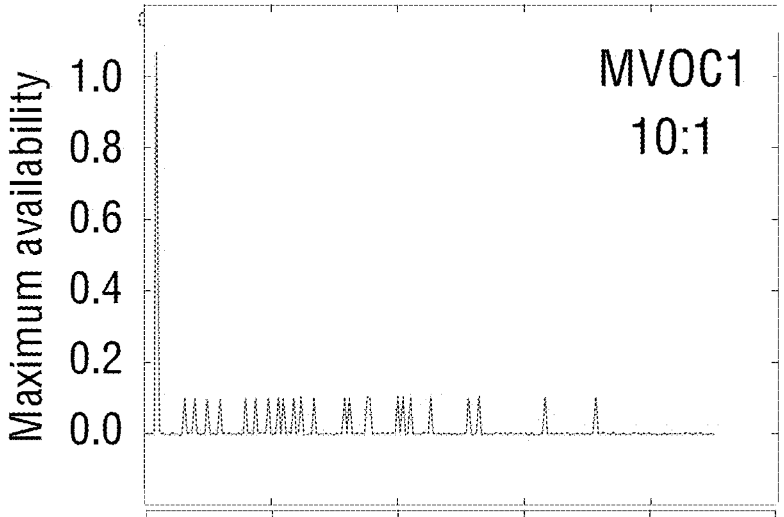
Figure 27C:
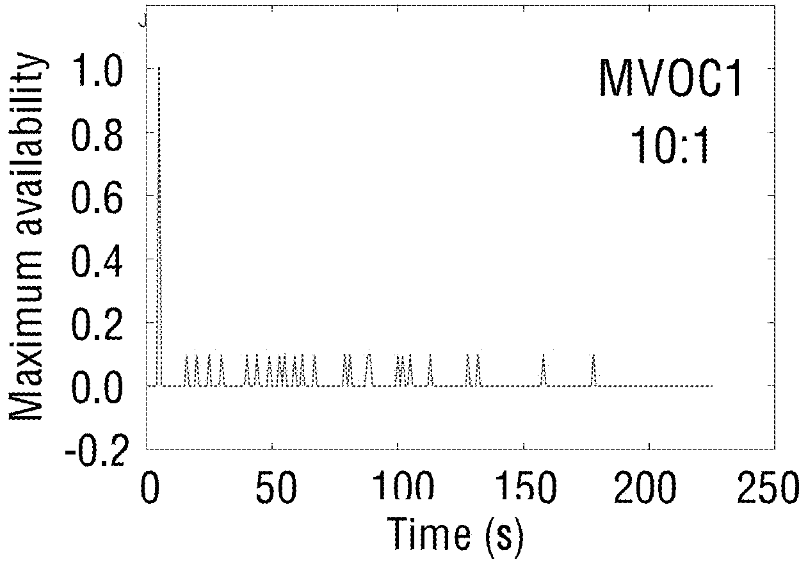

FIG. 26 shows the obtained MVOC2 data having the dimension of 1800 time-stamps, and the compressed MVOC2 data having the dimension of 225 time-stamps obtained after the wavelet treatment. FIGS. 27*a*-27*c* show the neural network predicted chromatogram using the wavelet-treated origami layer generated data for the MVOC1 with the different number of the hidden LSTM layers, i.e., 200, 150 and 50 layers, respectively. As seen from these figures, hidden Layer 50 actually provides the best neural network configuration to successfully classify and quantify all the VOCs in the sample.

The abbreviation "LSTM layers" stand for the long short-term memory layers of a neural network. Recurrent neural networks (RNNs) process inputs in a sequential manner, where the context from the previous input is considered when computing the output of the current step. This allows the neural network to carry information over different time steps rather than keeping all the inputs independent of each other. However, a significant shortcoming that plagues the RNN is the problem of vanishing/exploding gradients. This problem arises when back-propagating through the typical RNN during training, especially for networks with deeper layers. The gradients have to go through continuous matrix multiplications during the back-propagation process due to the chain rule, causing the gradient to either shrink exponentially (vanish) or blow up exponentially (explode). Having a gradient that is too small prevents the weights from updating and learning, whereas extremely large gradients cause the model to be unstable. Due to these issues, RNNs are unable to work with longer sequences and hold on to long-term dependencies, making them suffer from "short-term memory". The LSTMs come to solve this problem While LSTMs are a kind of RNN and function similarly to traditional RNNs, its gating mechanism is what sets it apart. This feature addresses the "short-term memory" problem of RNNs. FIGS. 28*a*-28*b* illustrate the comparison of the typical RNN vs LSTM. As seen from these figures, the difference lies mainly in the LSTM's ability to preserve long-term memory. This is especially important in the majority of time-stamp related series and sequential tasks. The neural network of the present invention generates the resistance or maximum availability values based on the GC input given to the network. At the start of the input, the network receives information about certain peaks in the GC chromatogram when certain compounds are eluted at a certain time stamp. With time, there is no mention of these peaks anymore, since there is no more elution of these compounds, but the GC chromatograph brings up some other peaks (signals) again, and the network has to generate the next input to that. Due to the short-term memory, the typical RNN will only be able to relate these new peaks (signals) to the compounds that recently eluted, which is not useful at all, and it has no clue as to what the compounds relating to other peaks might be as the relevant information from the start of the input has already been lost.

On the other hand, the LSTM layers can retain the earlier information of all the previous time stamps, and this will aid the model in accurate determination of compounds in complex mixtures, even when the compounds are structurally very similar, such as isomers (see examples below). The LSTM is capable of generating the input at any time stamp due to the contextual information from a much earlier time stamp. This advantage of the LSTM actually lies in its gating mechanism within each LSTM cell. In the normal RNN cell, the input at a certain time stamp and the hidden state from the previous time step is passed through a hyperbolic tangent (tanh) activation function to obtain a new hidden state and output. On the other hand, the LSTM cell at each time stamp takes in three different pieces of information, which are the current input data, the short-term memory from the previous cell (similar to hidden states in RNNs) and lastly the long-term memory. The short-term memory is commonly referred to as the hidden state, and the long-term memory is usually known as the cell state. The cell then uses gates to regulate the information to be kept or discarded at each time step before passing on the long-term and short-term information to the next cell. These gates can be seen as filters. Ideally, the role of these gates is supposed to selectively remove any irrelevant information. At the same time, only desired data can pass through these filters, just like how the gates only hold on to the useful information. Of course, these gates need to be trained to accurately filter what is useful and what is not. These gates are called the Input Gate, the Forget Gate, and the Output Gate. There are many variants to the names of these gates; nevertheless, the calculations and workings of these gates are mostly the same.

In the present invention, a chemical or biological compound generates a spectrogram or chromatogram which is read by the detector, for example μGC, miniaturised dispersive optical spectrometer, fibre-coupled optical spectrometer, MEMS-based spectrometer, plasmon-enhanced Raman spectrometer, on-chip plasmonic spectrometer, piezoelectric crystal detector, or spin-induced mass spectrometer. As mentioned above, each VOC, as any chemical or biological compound, has its own unique fingerprint (pattern) in a generated library and can be served as a layer input data from a layered separating medium, resulting in a '0' if there is no compound in the mixture, or a '1' if there is a compound in the mixture. Alternatively, these could be probed, for example by a regular GC chromatography or mass spectrometry readout resulting in a binary result as well. The readout could be done via a series of measurements resulting in a sum of the ones and zeros from all the detections. Therefore, in the method of the present invention, an input is either an array of binary values or an array of integers generated by the series.

An "output" of a neural network used in the method of the present invention is defined as a single bit whose value is '0' or '1', or an array of bits, or an array of integers, or an array of complex numbers, wherein said single bit, or said array of bits, or said array of integers, or said array of complex numbers corresponds to an estimated frequency, voltage, sensor conductance, electrical resistance, or time of chromatographic elution, mass-to-charge ratio, nuclear magnetic resonance shift, and to maximum availability or amplitude of the input.

As mentioned above, a neural network of the present invention is trained using a training dataset of inputs with known fingerprints or patterns. During the training, the parameters of the neural network are optimised to output the correct fingerprints or patterns for the inputs in the training dataset. The goal of the training is thus to make the neural network learn the general relation between the inputs and outputs such that it would be able to output the correct result of a known input with the highest possible probability.

The machine-learning method of the present invention is able to overcome the lack of knowledge of the physical model under supervised learning. As noted above, the objective is to use a train data set that contains inputs together with their known true patterns (true outputs) in order to train a deep neural network such that the trained neural network is an optimised function, which outputs the correct results for new inputs with the optimal (or near optimal) probability.

The problem of discrimination between at least two signals corresponding to at least two different time stamps by the detector of the present invention, for example μGC, miniaturised dispersive optical spectrometer, fibre-coupled optical spectrometer, MEMS-based spectrometer, plasmon-enhanced Raman spectrometer, on-chip plasmonic spectrometer, piezoelectric crystal detector, or spin-induced mass spectrometer, is solved in the present invention. In accordance with the present invention, to overcome the model's lack of knowledge, a supervised machine-learning model is used. In this model, a train dataset of measurement results of known patterns from a pre-generated library is used to train the neural network. The trained network is then applied to a test dataset and results in estimations of the time stamps of the test measurement results.

System of the Present Invention, Powering and Communication

In a further aspect of the present invention, a system for performing a physico-chemical analysis of a sample containing compounds subjected to a physico-chemical separation, said analysis is performed by processing spectrometry data of the sample, said system comprises:

(a) the layered separating medium for physico-chemical separation of the compounds contained in the sample and for support of an embedded electronics and detector;
(b) the detector comprising an array of sensors printed on each layer of said separating medium, and providing information on the presence and properties of said compounds in the sample; and
(c) the embedded electronics printed on each layer of said separating medium.

The aforementioned embedded electronics may comprise:

(1) a voltage source connected to said detector and said sensors via a microelectronic circuit for supplying electric current to said detector and sensors;
(2) an integrated or CMOS current amplifier connected to said voltage source for amplification of an electric current obtained from said detector and said sensors;
(3) an analogue-to-digital converter (ADC) with in-built digital input/output card connected to said current amplifier for outputting the converted signal to the external memory; and
(4) a wired or wireless connection module for connecting said system to said external memory.

In a particular embodiment, the system of the present invention further comprises a remote powering with miniaturised receiver antenna. Inclusion of a battery for powering the system would affect the overall size and would cause several economic and environmental problems due to the toxic nature of battery chemicals. Thus, the system of the present invention is optionally based on sensing nodes that use the energy provided by incoming electromagnetic waves to ensure the read-out of the sensors and the transmission of the resulting data to the reader node. The major problem solved by the present inventors in this regard relates to the size of the antenna, which affects both the coupling and the selection of carrier frequencies. The coupling decreases with the reduction of antenna size, while the optimal carrier frequency increases. Only high carrier frequencies can permit the miniaturisation of the antenna, but the propagation losses also increase with the frequency which requires both careful selection and EM modelling.

When considering an implementation, the present inventors proposed that the harvested energy would require transformation to power the analogue read-out of sensors. This is typically handled by a PMU (Power Management Unit) but the extremely low received energy would challenge the use of existing solutions. A tightly combined implementation of these components in the system: harvester, PMU and analogue front-end is another embodiment of the present invention that allows to reach performances beyond state of the art.

In still another embodiment, the system of the present invention further comprises at least one of: a feedback control microcontroller unit (MCU) for energy level adjustment and de-trapping via an external or integrated gate electrode, a harvester for harvesting energy of the system, a power management unit (PMU) for transforming the harvested energy and powering an analogue read-out of the sensors, an analogue front-end and a gate electrode for discharging parasitic electric current. The system may further comprise at least one radio-frequency identification (RFID) out-input tag for remote readout and zero-power operation, each RFID tag connected to said embedded electronics via an electric circuit for receiving or transmitting a signal. In a particular embodiment, this RFID system further comprises:

(1) a diode input-output separator to separate polarities in said circuit; and (2) an integrated circuit for storing and processing said signal, and for modulating and demodulating radio-frequency (RF) signals.

In some embodiments, the external memory is a mobile device, wearable gadget, smartphone, smartwatch, desktop computer, server, remote storage, internet storage or internet cloud. The external memory may comprise a processor, a microcontroller or a memory-storing controller suitable for storing executable instructions, which when executed by the processor cause the processor to perform the machine-learning method on the measurement results.

In other embodiments, communication between the sensors and the external memory can be either passive or active, or combination thereof. In the passive read-out of the sensors, the system uses a spectral encoding of the information that is the route of choice, since a passive structure cannot handle any kind of communication protocol. The necessary information (RFID and sensors readings) is encoded in the passive mode using a single radiative structure with multiple resonators each of which is dedicated either to a bit encoding or to a sensor readout.

In case of the active communication, a parallel route is carried out to power and communicate with the system using a semiconductor device. In order to do that, a miniaturised die (25 μm thick, inert and non-toxic) on the substrate and the management of the energy are integrated in the system. Importantly, this approach also enables operation of the sensor elements at optimum operating frequencies (DC to kHz). The antenna and RF propagation channel are viewed jointly and closely co-designed with the materials.

In the above approach, the number of sensing nodes accessed (millions) lies orders of magnitudes beyond the state of the art (thousands) found nowadays in the conventional UHF RFID solutions, in which many tags can be seen almost simultaneously by a user. Spatial, time and frequency multiplexing are considered together with data encoding and modulation schemes to push beyond the limits of the state-of-the-art. Depending on the architectural implementation (passive or active) of the sensing node of the system, the communication scheme is different. When the complexity (intelligence) of the sensing node is limited as in a passive mode, specific distributions of sensing node configurations (by construction) are used to reduce overlaps in time or frequencies. This requires the design of complementary separation algorithms pushing back the complexity at the reader level.

Due to the extreme miniaturisation of the system, the returned signal may considerably diminish. To solve this problem, the present inventors proposed to combine the contribution of multiple nodes, and to use a communication scheme allowing an intrinsic averaging of the sensed data together with an increase of the back scattered energy.

In yet further embodiment, the connection module may be wireless for wireless connection of said system with the external memory. The external memory may comprise another wireless connection module connecting said system to a user interface via a digital-to-analogue converter (DAC). In a certain embodiment, both wireless connection modules are either Bluetooth or NFC, thereby providing wireless communication between the sensor and the readout module for up to 20 m. If these two modules are Wi-Fi, the connection between them can be established for up to 200 m, while the GSM may provide the worldwide communication.

In a particular embodiment, the external memory supports its own communication network and the reporting to the cloud. To achieve this, a secondary communication link providing long-range and variable data rates is integrated into the node. A specific multi-interface control protocol is designed and prototyped to handle both the locally dense data exchanges (localisation, consolidation, and pre-processing) and the long-range but low data-rate reporting to the cloud. It comes on top of the communication interfaces installed on the external memory devices (such as cellular, Wi-Fi or V2V). It is inspired from heterogeneous V2V algorithms.

In a certain embodiment, the connection to the cloud is direct and simple. Ideally, there is only one physical device that interconnects the swarm of the sensors with the cloud, i.e., the external memory device may have a cellular interface. For areas with low cellular coverage, a private cellular network (4G/5G) may be deployed, for instance on a drone. However, the association of spatial and temporal data to measurements requires a form of collaboration between the external memory devices, and in the hierarchical architecture, the collaboration is enforced by the gateway-cloud node. However, this node does not need to be a physical device, it can be virtual. In 5G, most network functions are virtualised, and specific edge functions can be deployed near the actual working location to minimise latency. The virtual gate-way cloud generates the time signal to synchronise all the external memory devices and runs more advanced protocols: data cleaning, localisation and spectrum optimization. The latter is understood to minimise spectrum usage by the external memory device, for instance by leveraging the sensors' redundancy.

Rapid Malignance Detection and Skin Spectrometry

Figure 29A:
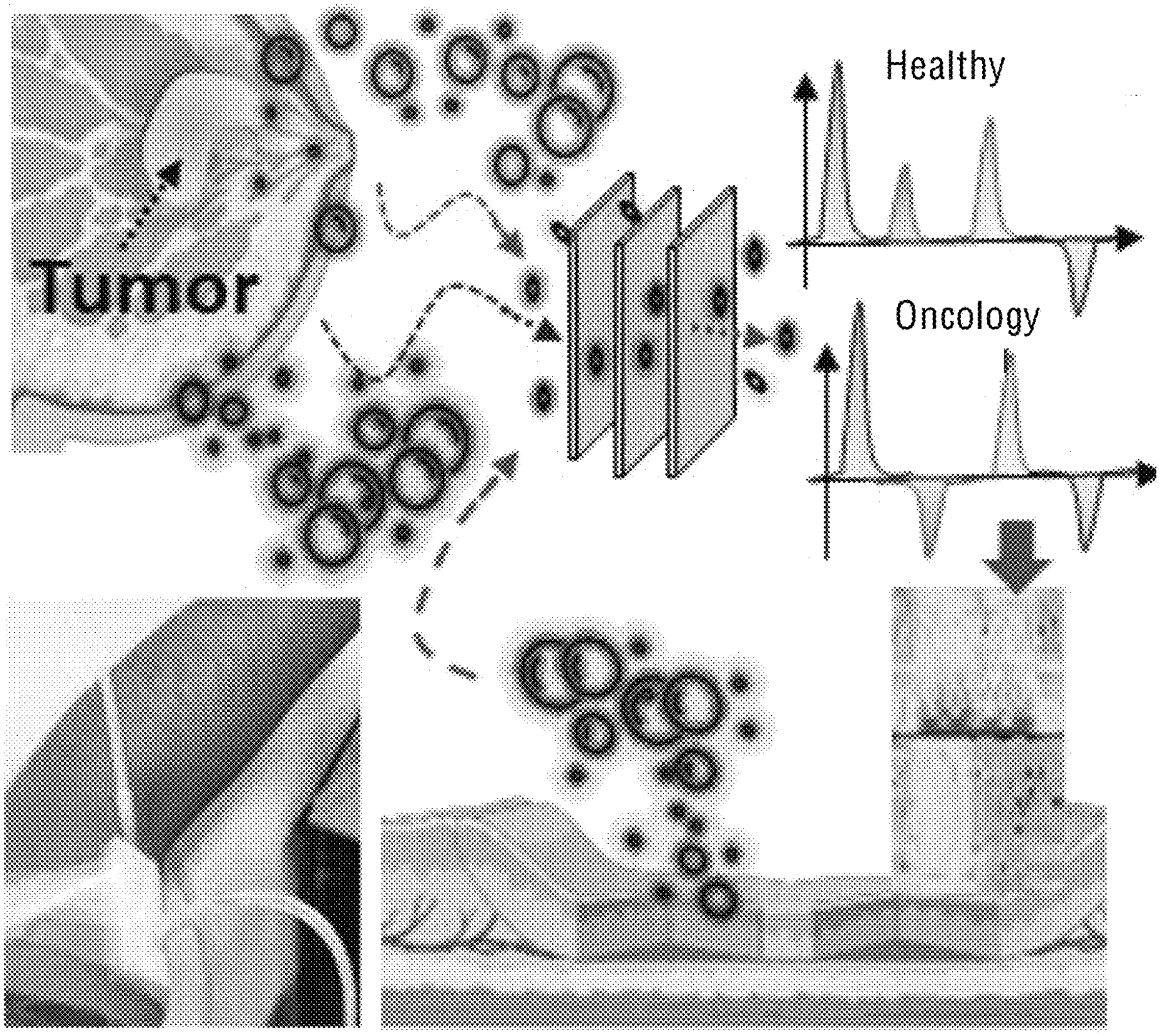
FIG. 29*a* shows the schematic illustration of the VOC biomarker analyses for diagnosing breast cancer and skin-based organic compounds monitoring as a wearable approach using the method of the present invention.

As a first example, where the method and system of the present invention are used is the screening for human breast cancer and skin-based VOC sampling. Reference is now made to FIG. 29*a* showing a schematic illustration of the VOC biomarker analyses for diagnosing breast cancer and skin-based organic compounds monitoring as a wearable approach using the method of the present invention.

Figure 29B:
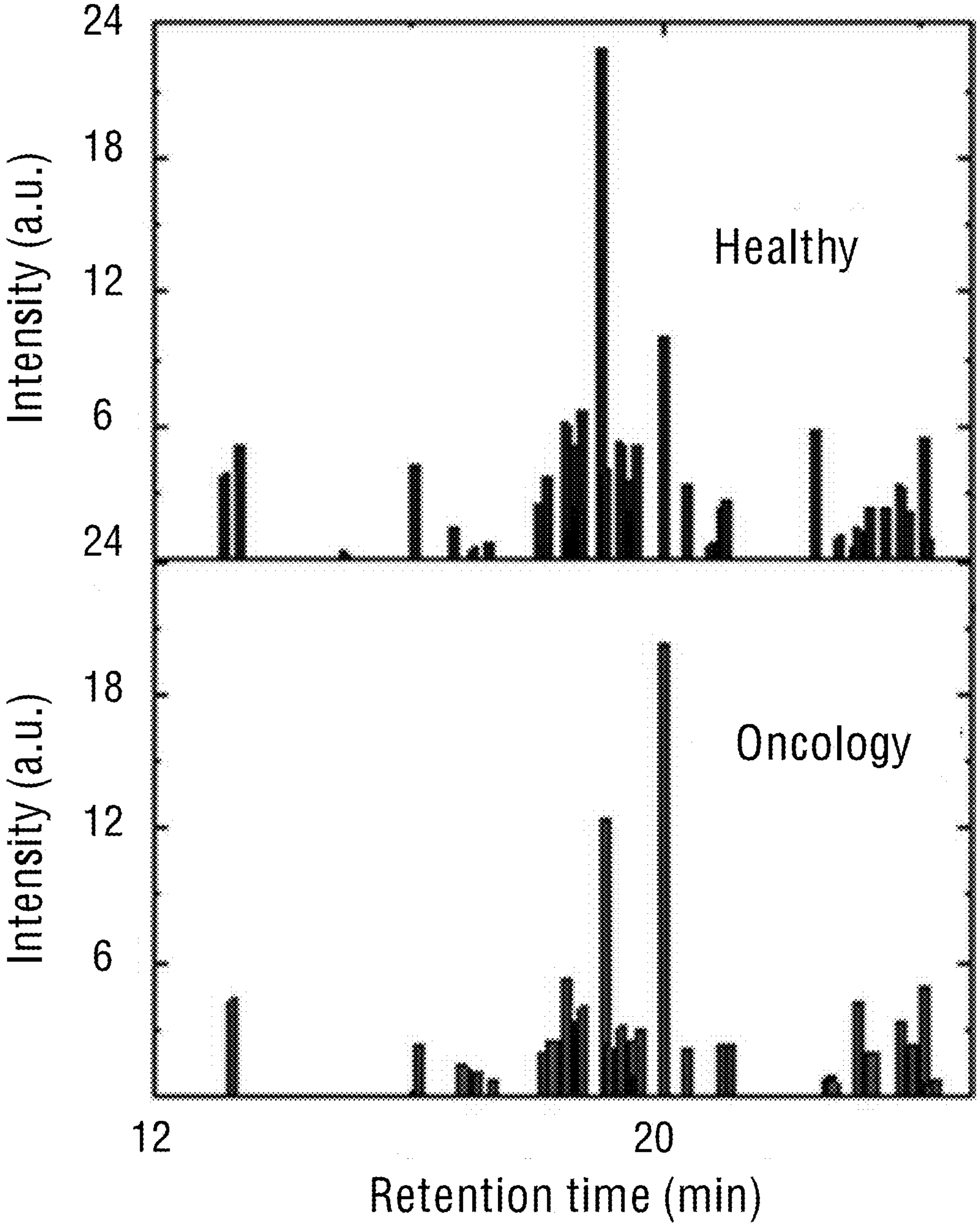
FIGS. 29*b*-29*c* show the conventional GC-MS chromatogram of the VOC biomarker analyses and the μGC chromatogram obtained with the method of the present invention, respectively, for healthy and tumour breast tissue samples.
Figure 29C:
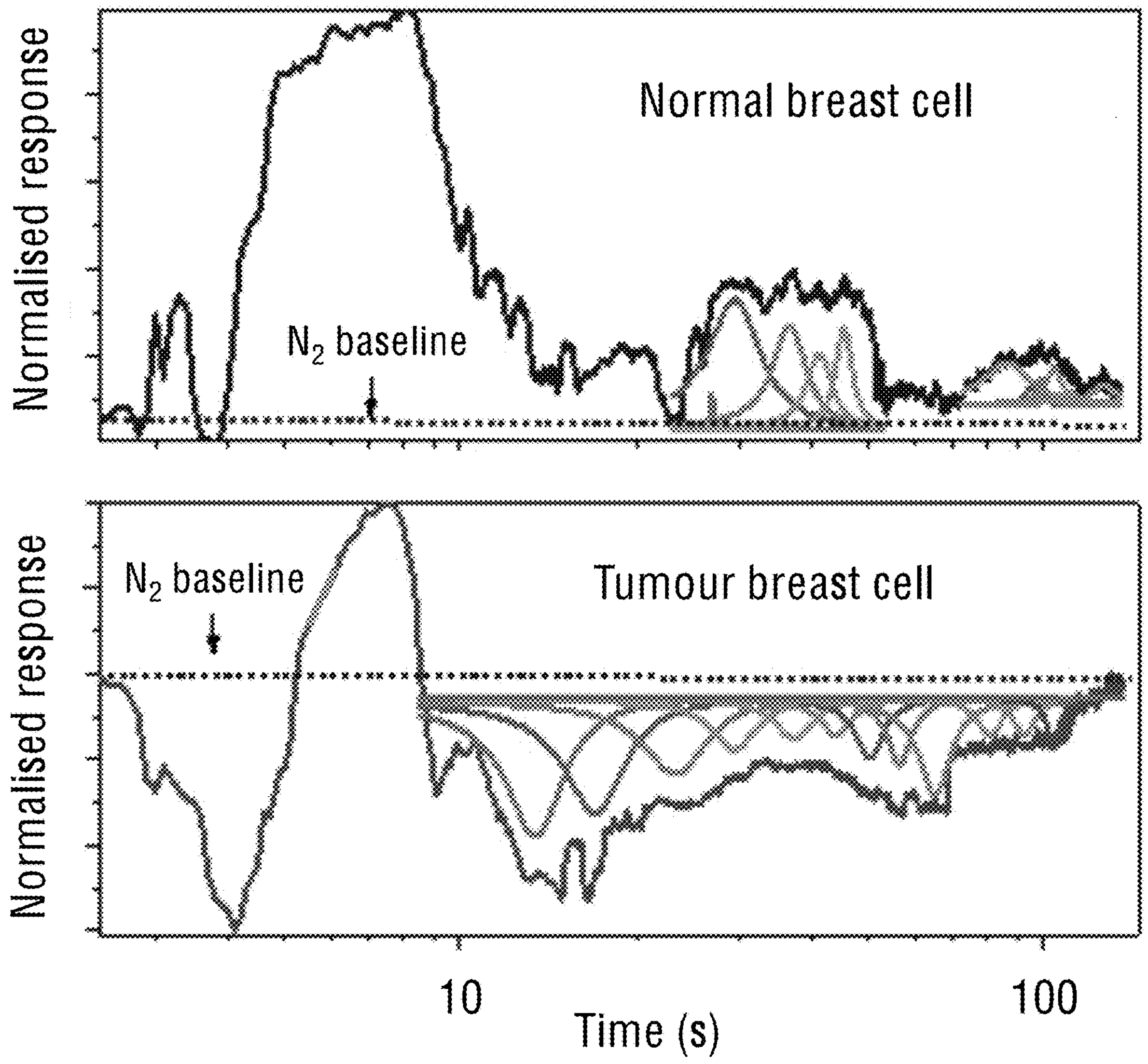

FIGS. 29*b*-29*c* show the conventional GC-MS chromatogram of the VOC biomarker analyses and the μGC chromatogram obtained with the method of the present invention, respectively, for healthy and tumour breast tissue samples. The figures indicate the unique traces of the VOCs and their relative distinct ratios. Oncology-specific VOCs can be generated in lipid-peroxidation processes and carbohydrate metabolism, for instance, and they can be related to the inflammatory and oxidative stress states caused by tumours. Cytochrome (CYP450) enzymes, a multigene family of enzymes that metabolise oxidatively a large range of exogenous/endogenous compounds, are overexpressed in tumour tissues and mediumte reactions that generate reactive oxygen species (ROS). Since presence of CYP450 has been detected in various sections of breast cancer biopsies, the VOC profile can be modulated due to biochemical pathways in cancer progression according to the altered activity of these enzymes. Armed with these observations that a specific group of VOCs with their unique presence can be an effective for rapid VOC-biopsy-cancer-screening, the method of the present invention (demonstrated for Layer 2 of the layered medium) shows the unique separating abilities for each type of the VOC compound (see FIG. 29*c*).

Figure 29D:
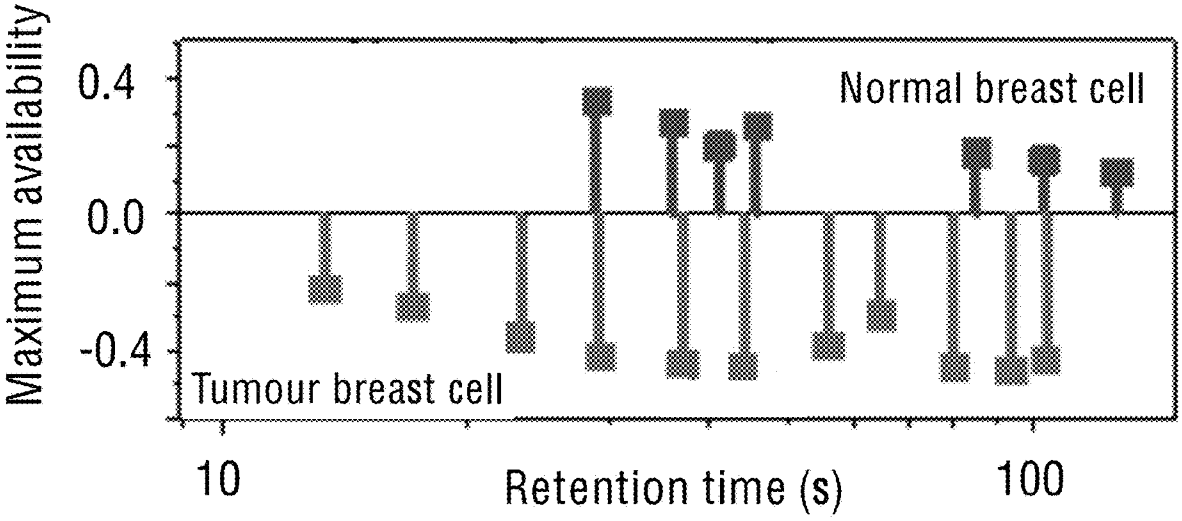
FIG. 29*d* shows the calculated fitted results to estimate the retention time in order to discriminate the normal and tumour cells with 180° phase difference in retention time.

FIG. 29*d* shows the calculated fitted results to estimate the retention time in order to discriminate the normal and tumour cells with 180° phase difference in retention time. The μGC chromatogram obtained in this case from the fitted results, as shown in FIG. 29*d*, exhibits unique retention timestamp and 180° opposite phase-difference due to presence of the electron donating or accepting VOCs that reach to the sensor surface in a malignant mass during the surgery. Additional information (reproducibility, statistical analysis) is provided in extended data FIG. 2 *a*(i-ii)) and *b*).

Figure 29E:
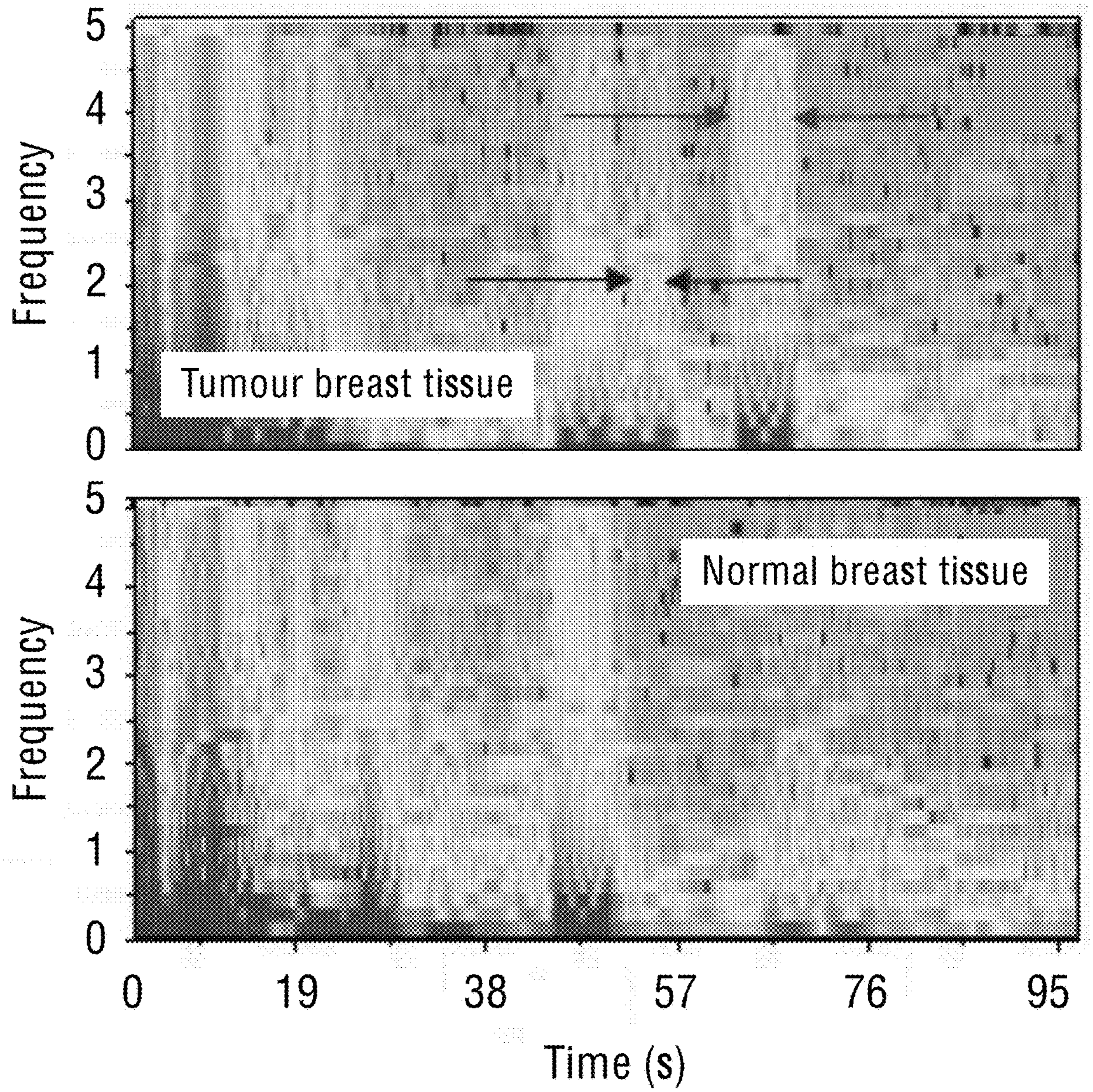
FIG. 29*e* shows the time-frequency spectrogram of the malignant tumour tissue (top image) and healthy breast tissue (bottom image).
Figure 29F:
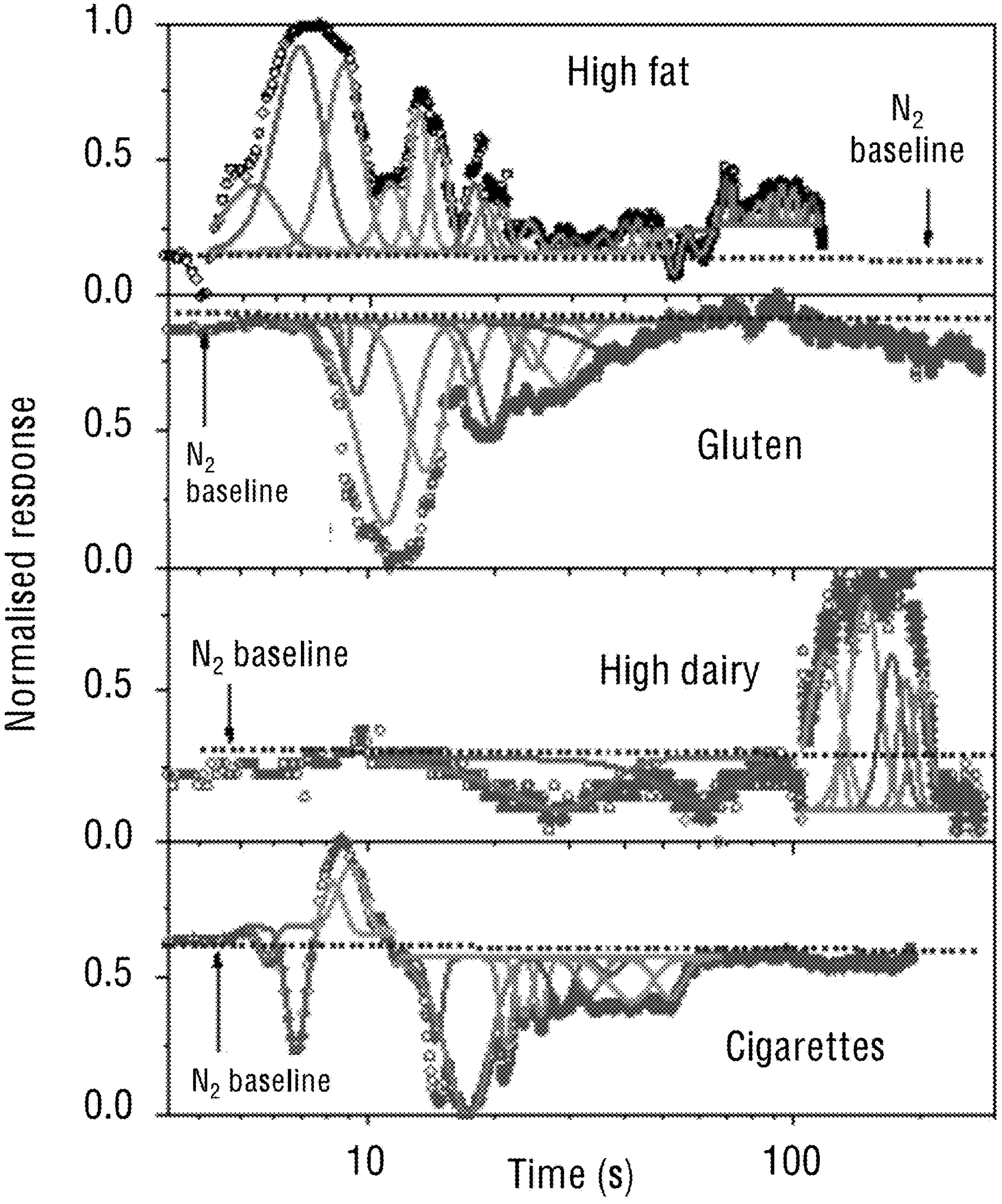
FIGS. 29*f*-29*g* show the skin sample μGC chromatogram for monitoring various dietary effects and related extracted retention time and height from maximum availability.
Figure 29G:
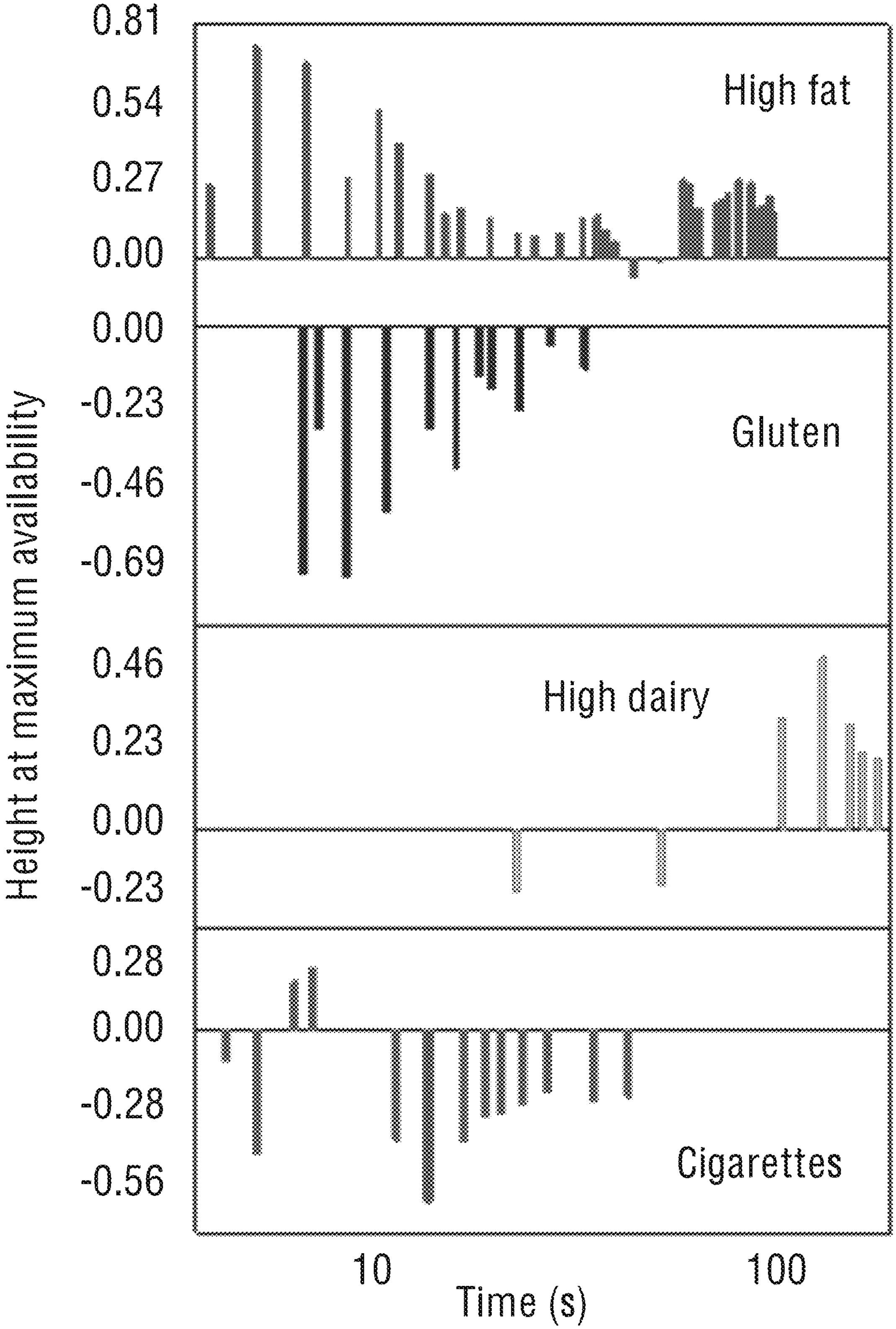

FIG. 29*e* shows the time-frequency spectrogram of the malignant tumour tissue (top image) and healthy breast tissue (bottom image). FIGS. 29*f*-29*g* show the data obtained from skin samples on in skin-based wearable VOC analysis using the μGC detector of the present invention, which generated the μGC chromatogram for skin VOCs extracted from human body for monitoring various dietary effects and related extracted retention time and height from the maximum availability. The unique separating pattern observed in FIGS. 29*f*-29*g* supports the use of the method of the present invention in a wearable all-spectrometric-prognosis on skin to monitor various diseases and healthcare status ex-vivo.

Figure 30:
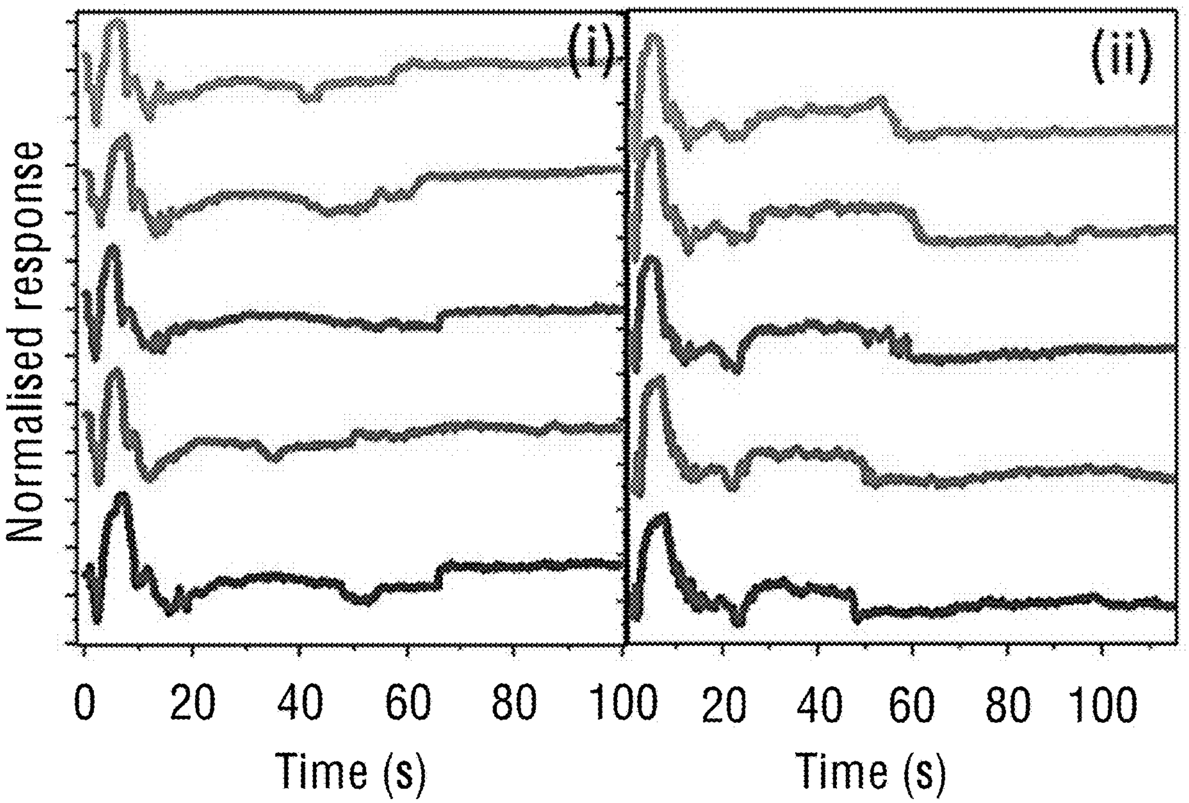
FIG. 30 shows the typical repeatability measurements from multiple cycles demonstrating the replication of similar separating behaviour of the VOC components for (i) malignant breast tumour tissues, and (ii) healthy breast tissues of multi-clinical samples.
Figure 31:
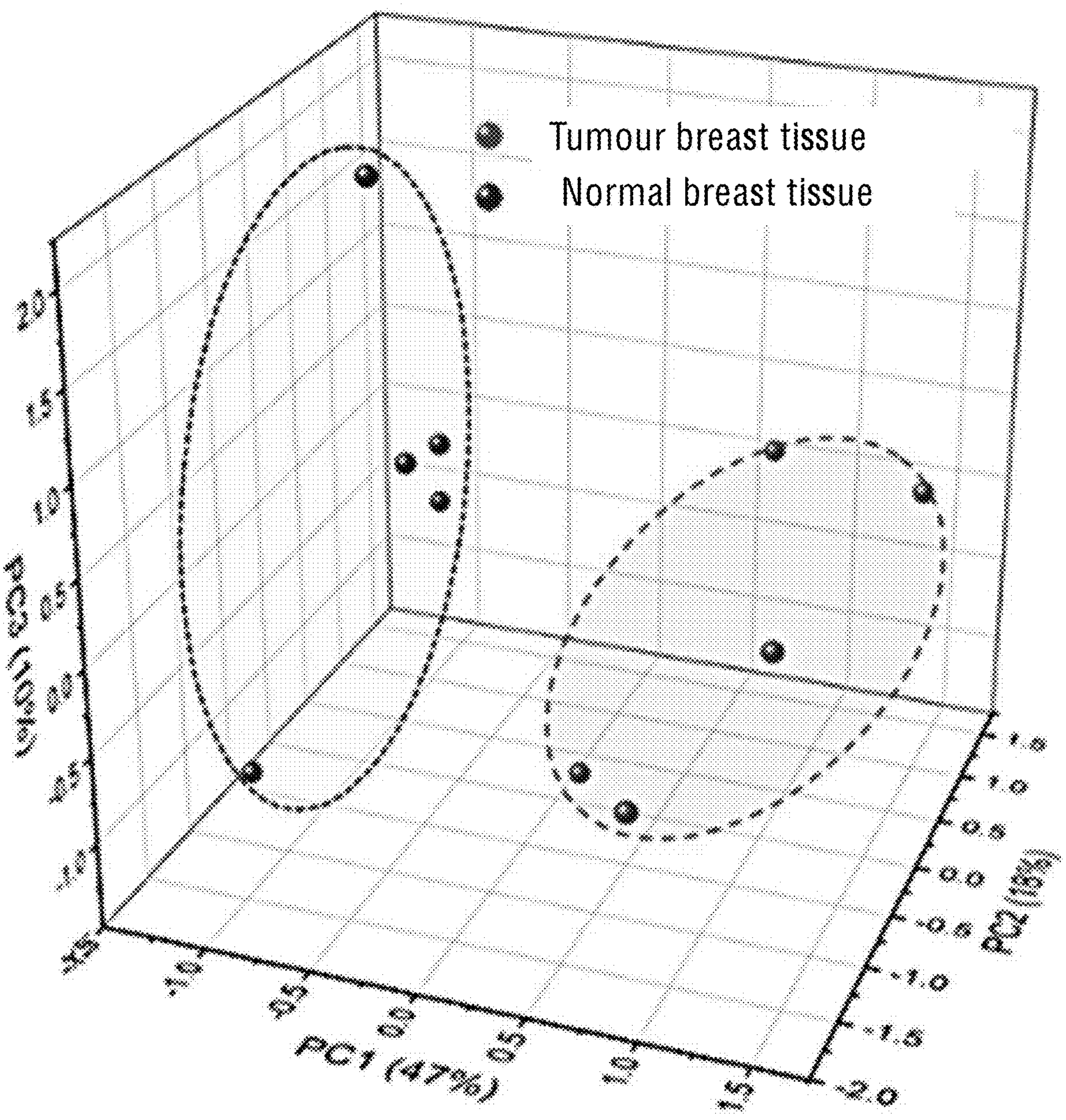
FIG. 31 shows the PCA analyses separating tumour and normal breast tissues.
Figure 32A:
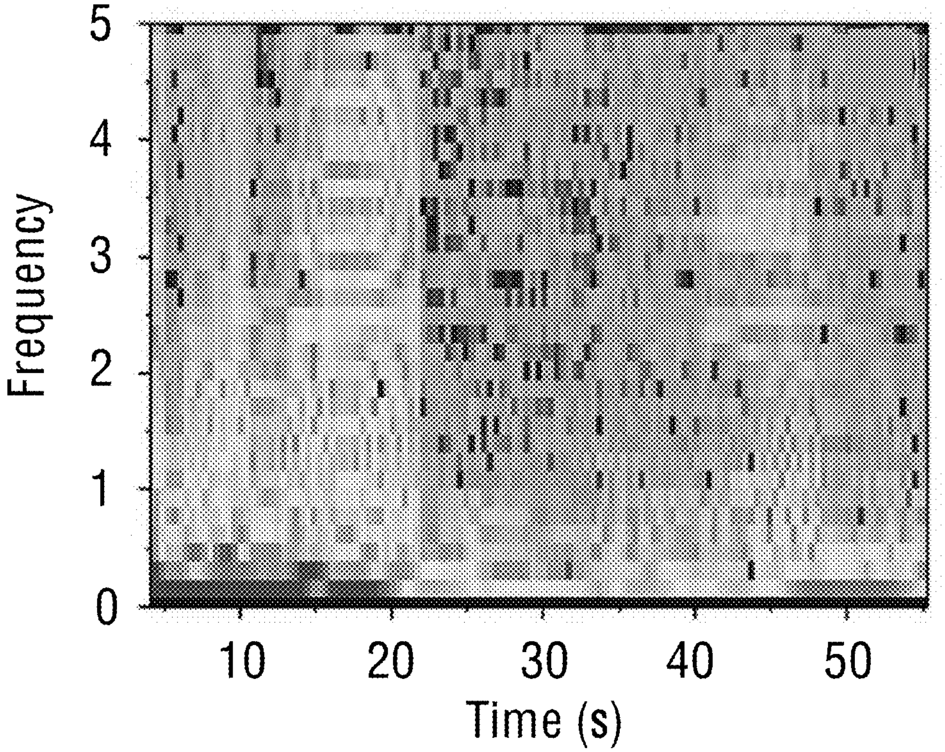
FIGS. 32*a*-32*d* show the obtained spectrogram image of the skin-derived VOC samples for different dietary influences: (32*a*) fatty meal, (32*b*) gluten, (32*c*) dairy, and (32*d*) cigarette smoke for continuous health care monitoring.
Figure 32B:
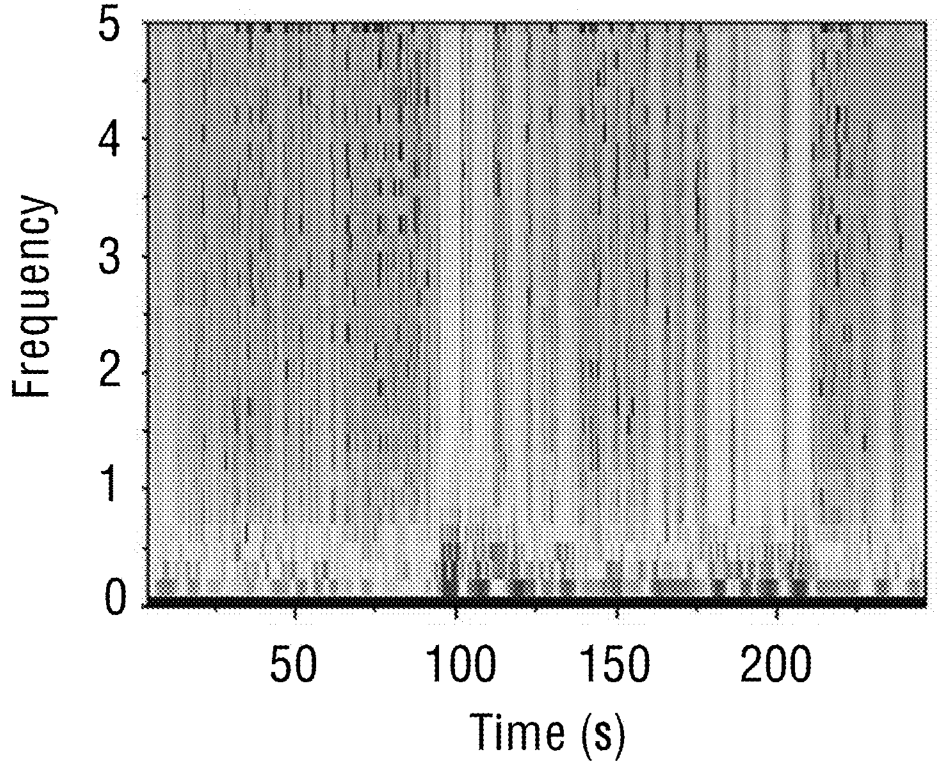
Figure 32C:
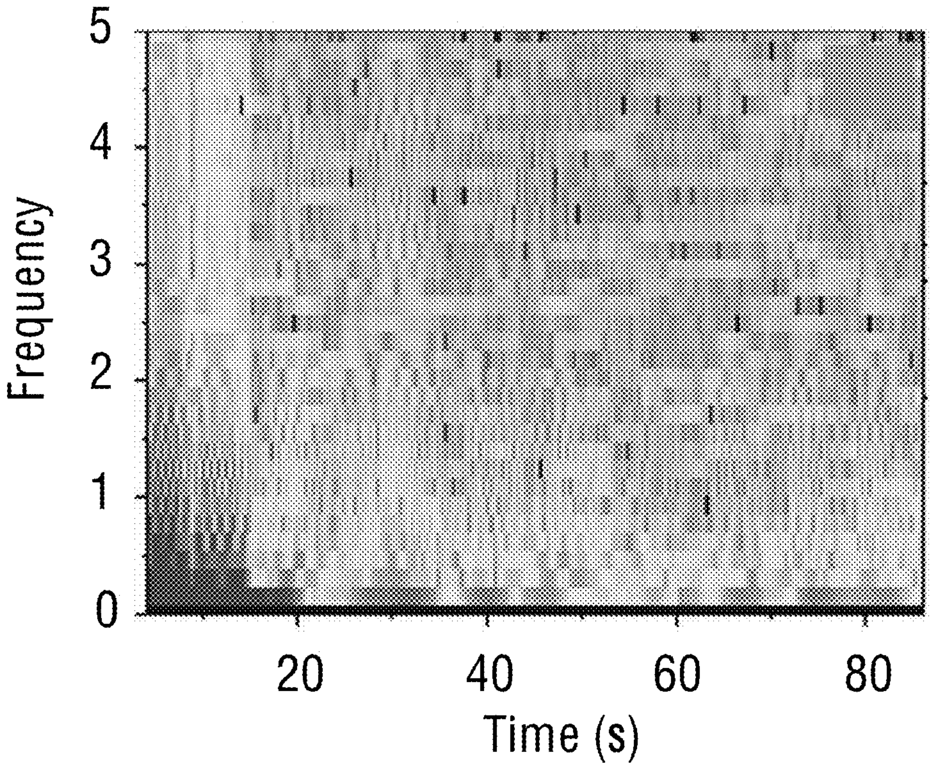
Figure 32D:
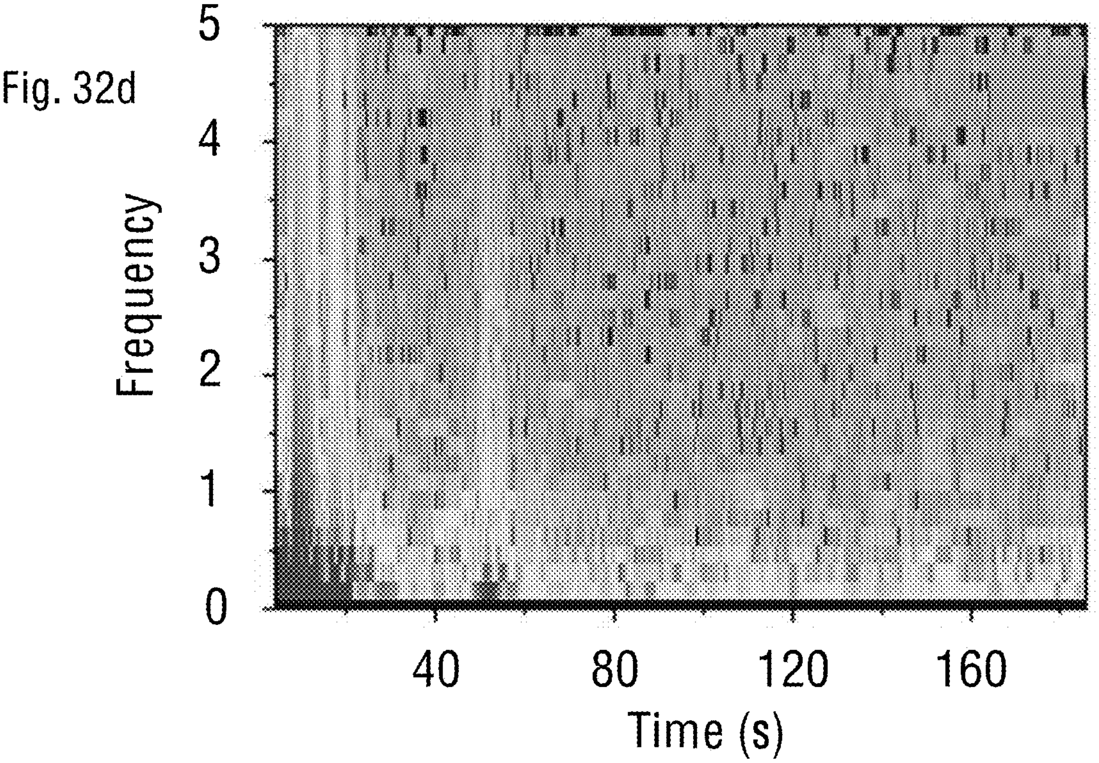

In another example, FIGS. 30, 31 and 32*a*-32*d* show reproducibility and statistical analysis of the separated profiles of multiple clinical samples (malignant and non-malignant breast tissues), and spectrogram of skin samples. FIG. 30 shows the typical repeatability measurements from multiple cycles demonstrating the replication of similar separating behaviour of the VOC components for (i) malignant breast tumour tissues, and (ii) healthy breast tissues of multi-clinical samples. FIG. 31 shows the PCA analyses separating tumour and normal breast tissues. The obtained spectrogram images of skin-derived VOC samples for different dietary influences are shown in FIG. 32*a* for fatty meal, FIG. 32*b* for gluten, FIG. 32*c* for dairy, and FIG. 32*d* for cigarette smoke for continuous health care monitoring.

Chiral Recognition and Spin-Influence

In another example, the present inventors were able to discriminate between two enantiomers of butanol in their racemic (1:1) and enantiomeric mixtures using the method of the present invention, which is normally impossible to do with a regular GC-MS chromatography:

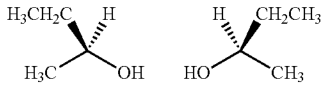

(+)-2-Butanol (-)-2-Butanol

Figure 33:
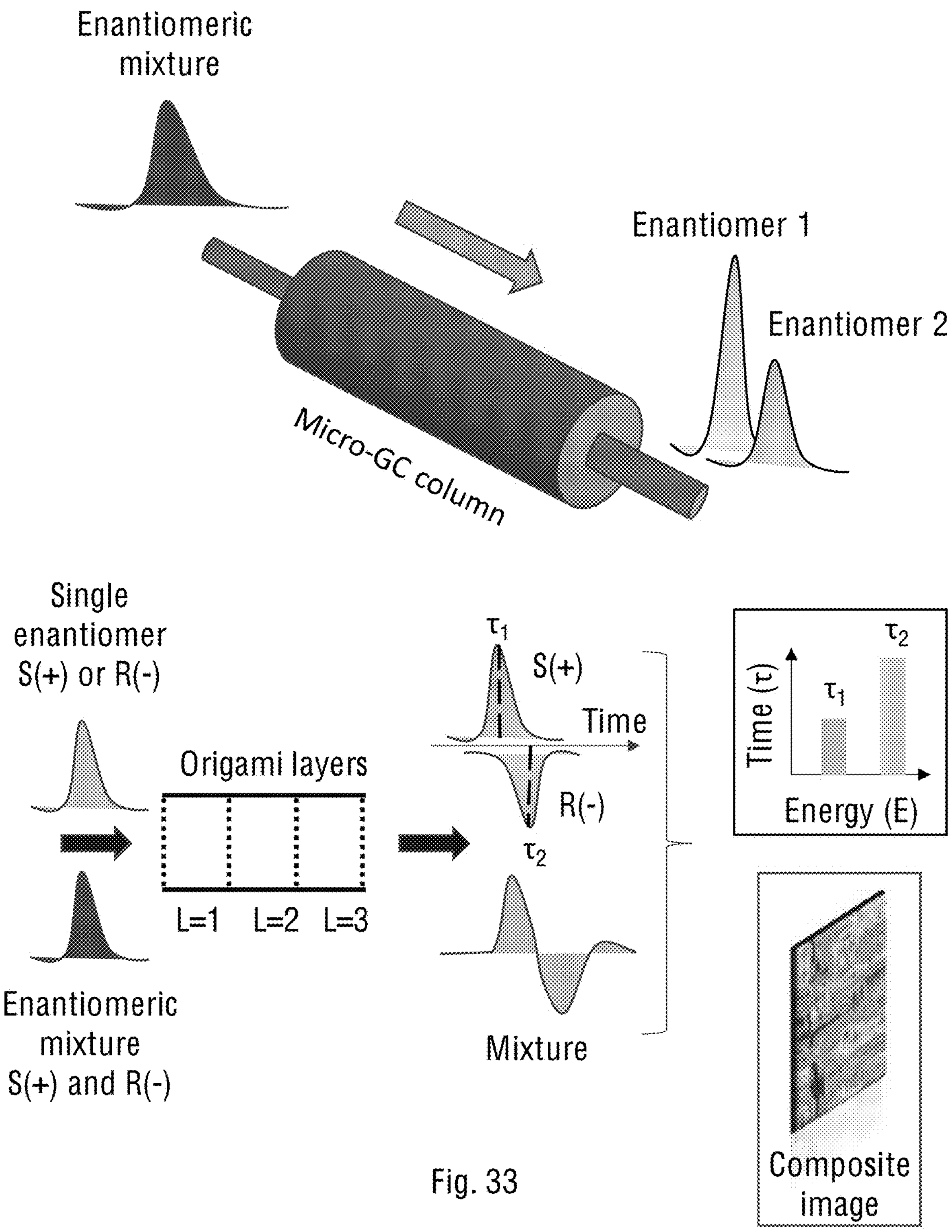
FIG. 33 schematically shows the chiral separation and detection using μGC enantiomeric stationary phase and μGC-based detector of the present invention on the layered separating medium, such as origami paper containing chiral/helical cellulose fibres as a stationary phase.

The method of the invention mimics an alternative rapid approach to chromatographic enantiomer separation and detection, in the sense that it enables the enantiomers to bind differently to chirality/helicity of the cellulose/lignin fibres of the layered separating medium of the present invention. As a result, the enantiomers are released to each next layer at different time, thereby enabling spatiotemporal separation. FIG. 33 schematically shows the chiral separation and detection using μGC enantiomeric stationary phase and μGC-based detector of the present invention on the layered separating medium, such as origami paper containing chiral/helical cellulose fibres as a stationary phase, where E is an interaction energy of chiral cellulose and enantiomers.

Figure 34:
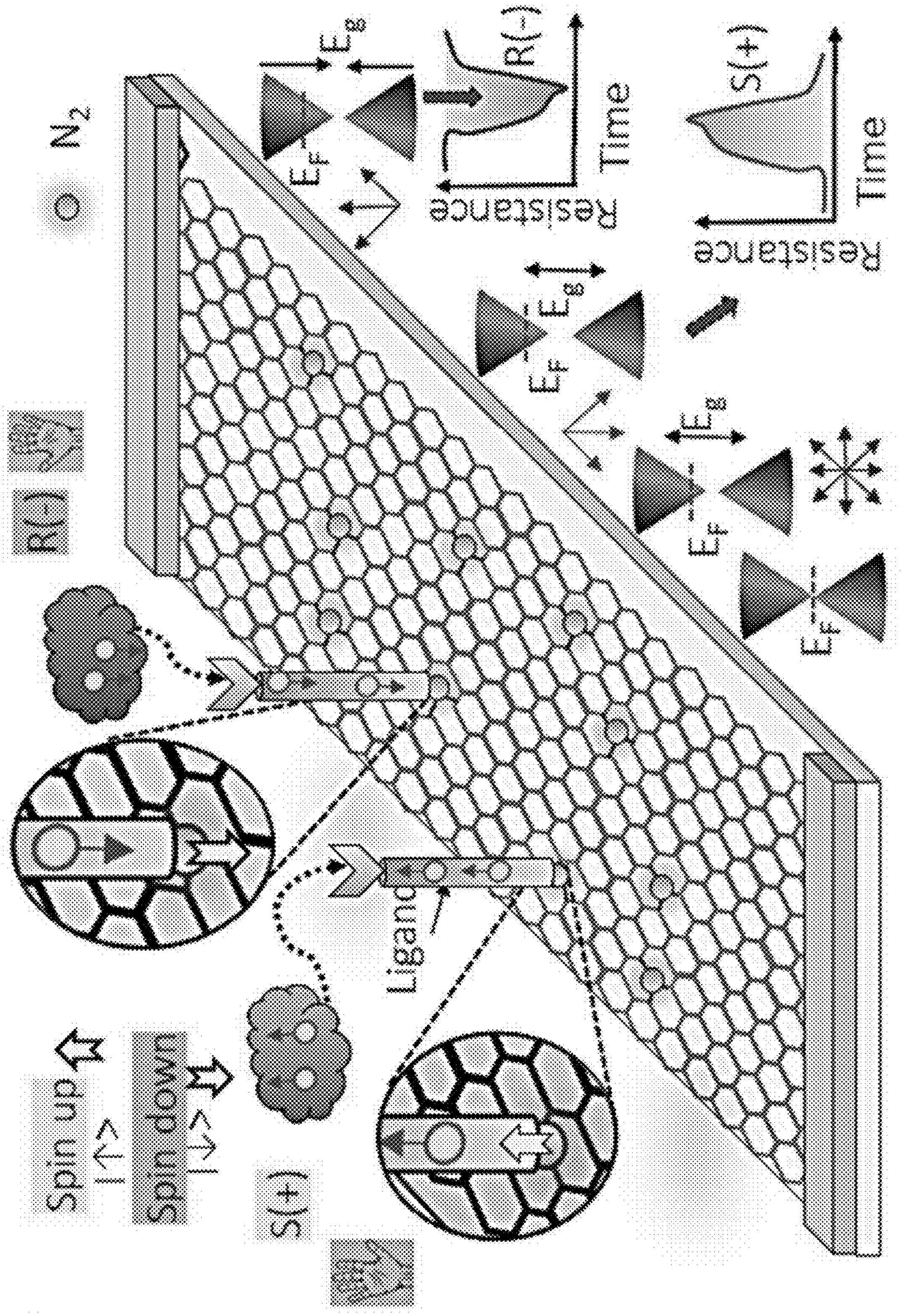
FIG. 34 schematically shows the chirality-induced spin injection in a doped graphene structure and band gap modulation to show the opposite direction change of an enantiomer.

Complementary to the spatiotemporal part, the hybrid FDrGO sensors were loaded with various chiral/achiral ligands that exhibit remarkable sensing difference between each enantiomer. In this regard, the reference is made to FIG. 34 schematically showing the chirality-induced spin injection in a doped graphene structure and band gap modulation to show the opposite direction change of an enantiomer.

Figures 35A, 35B:
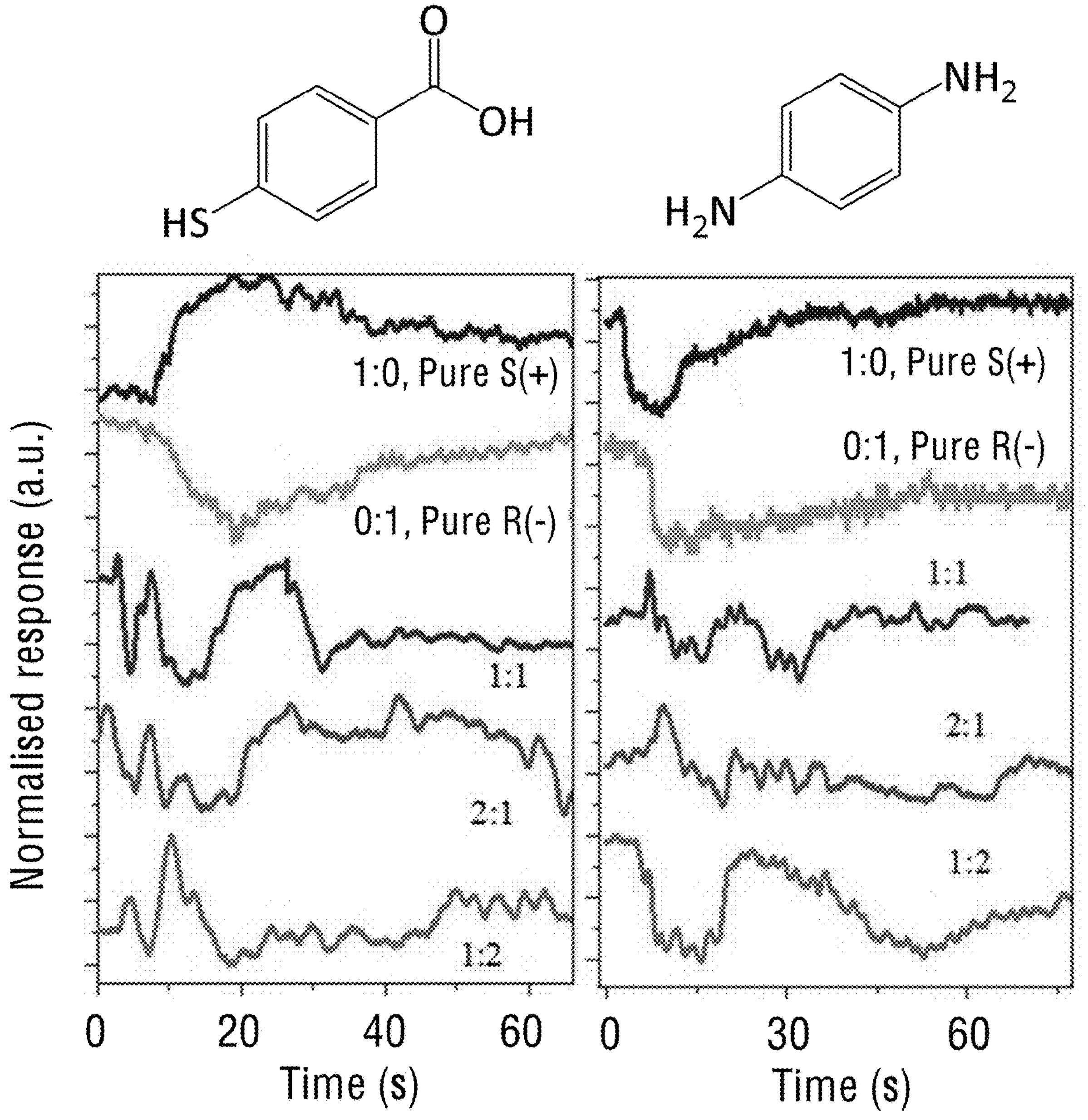
FIGS. 35*a*-35*c* show the typical response pattern of pure, racemic, and enantiomeric mixture of S (+) butanol and R (−) butanol, respectively, for achiral FDrGO ligands.
Figure 35C:
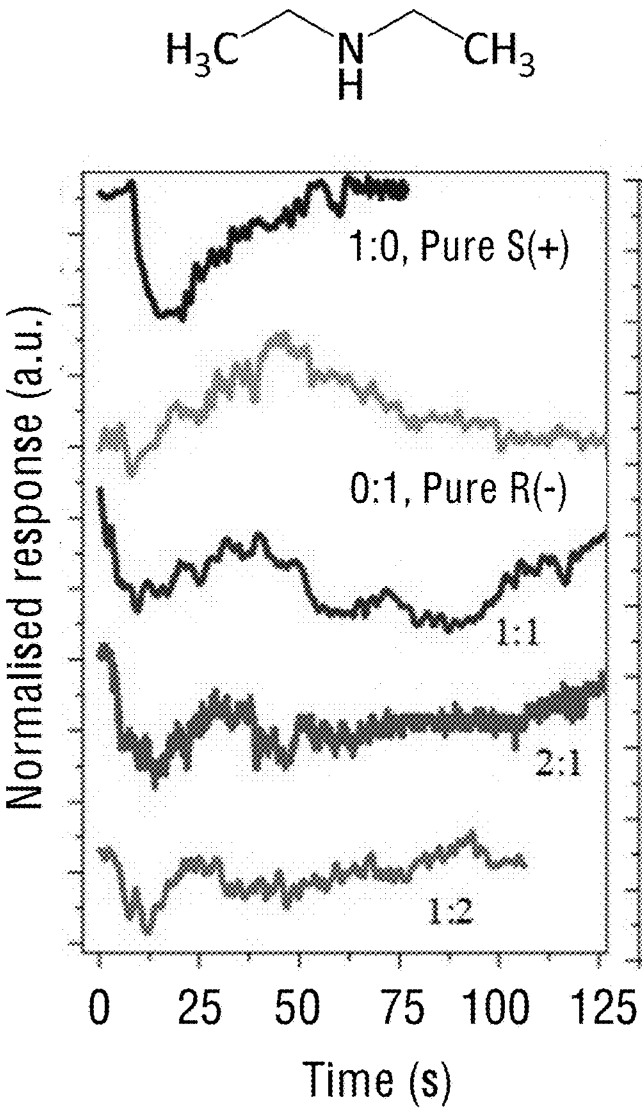
Figure 35D:
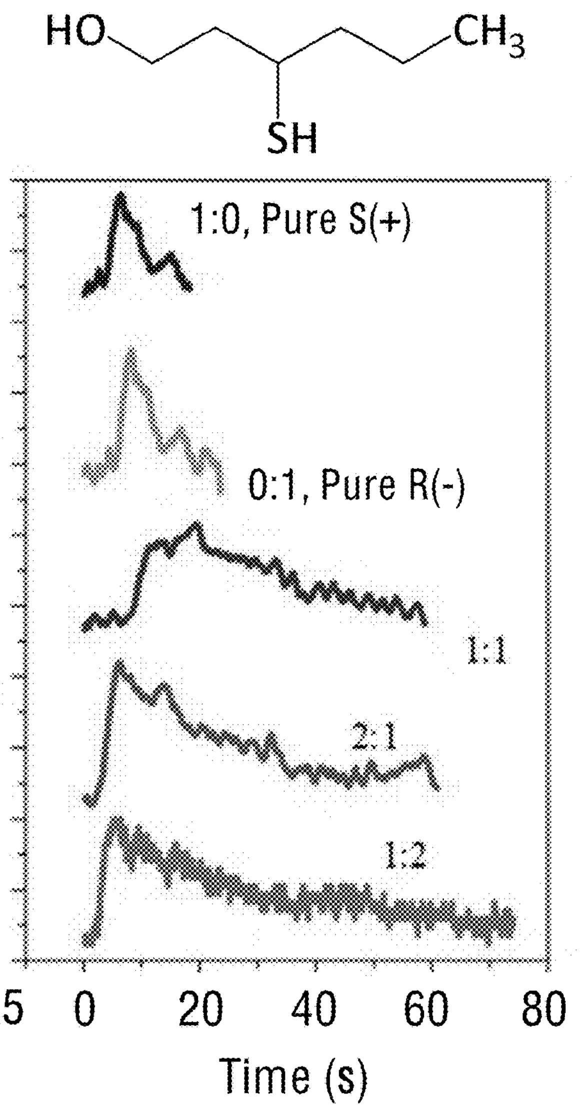
FIG. 35*d* shows the same for chiral FDrGO ligands.
Figure 36A:
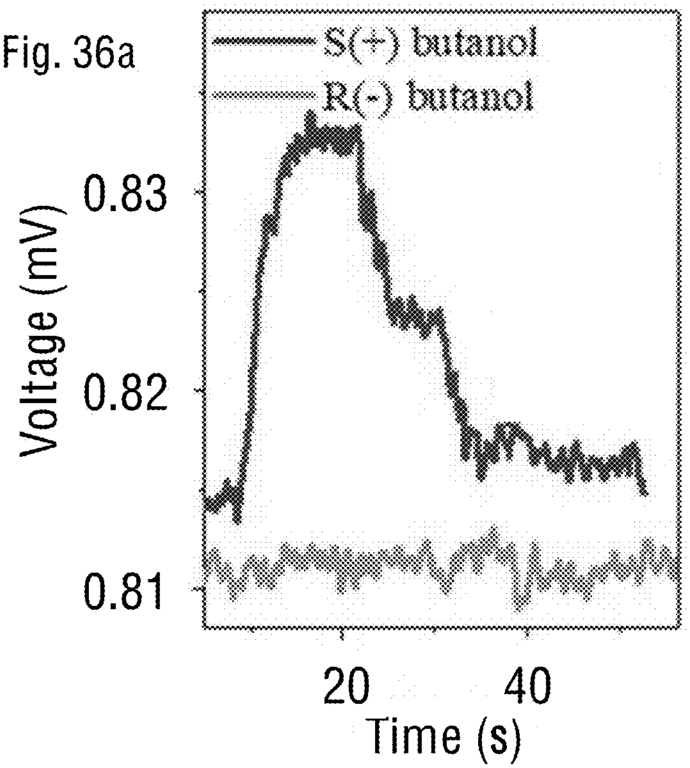
FIGS. 36*a*-36*c* show the chiral selectivity observed for various DrGO ligands.
Figure 36A:
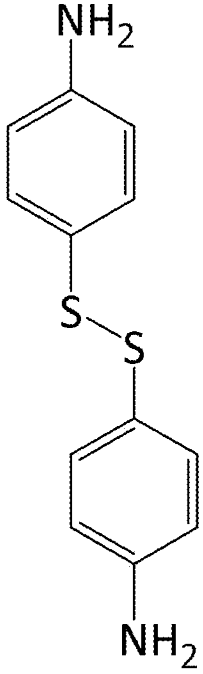
Figure 36B:
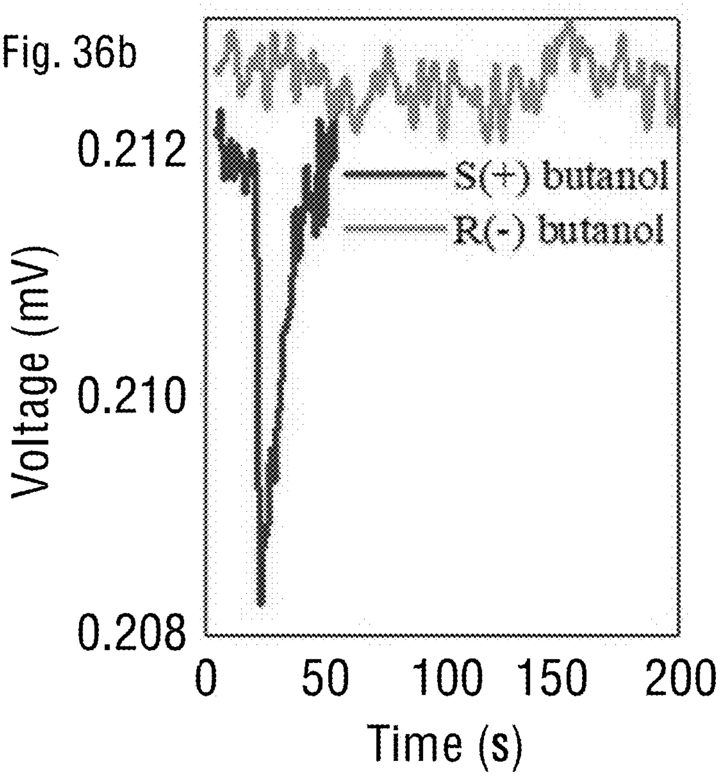
Figure 36B:
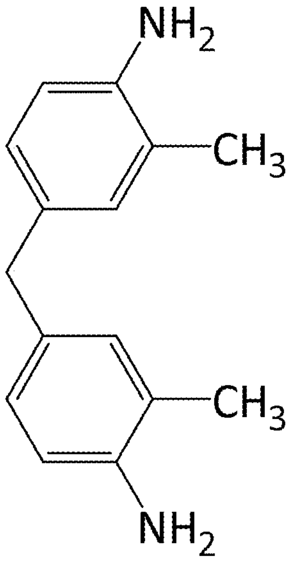
Figure 36C:
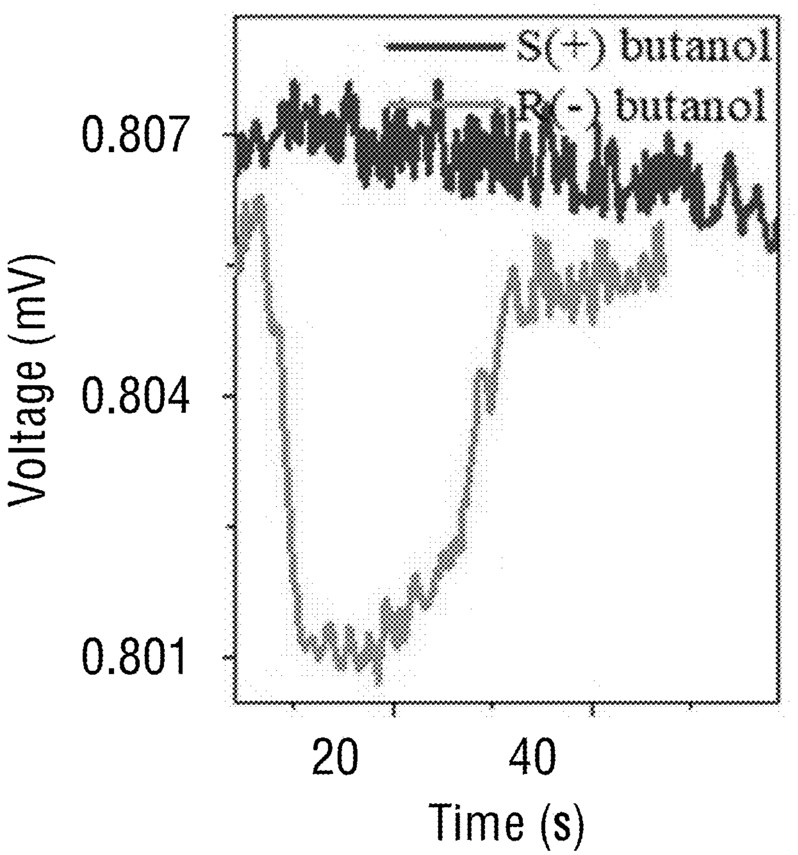
Figure 36C:
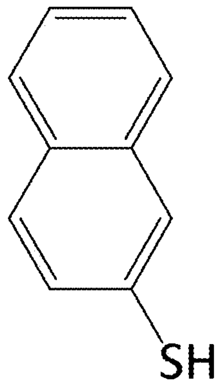
Figure 37:
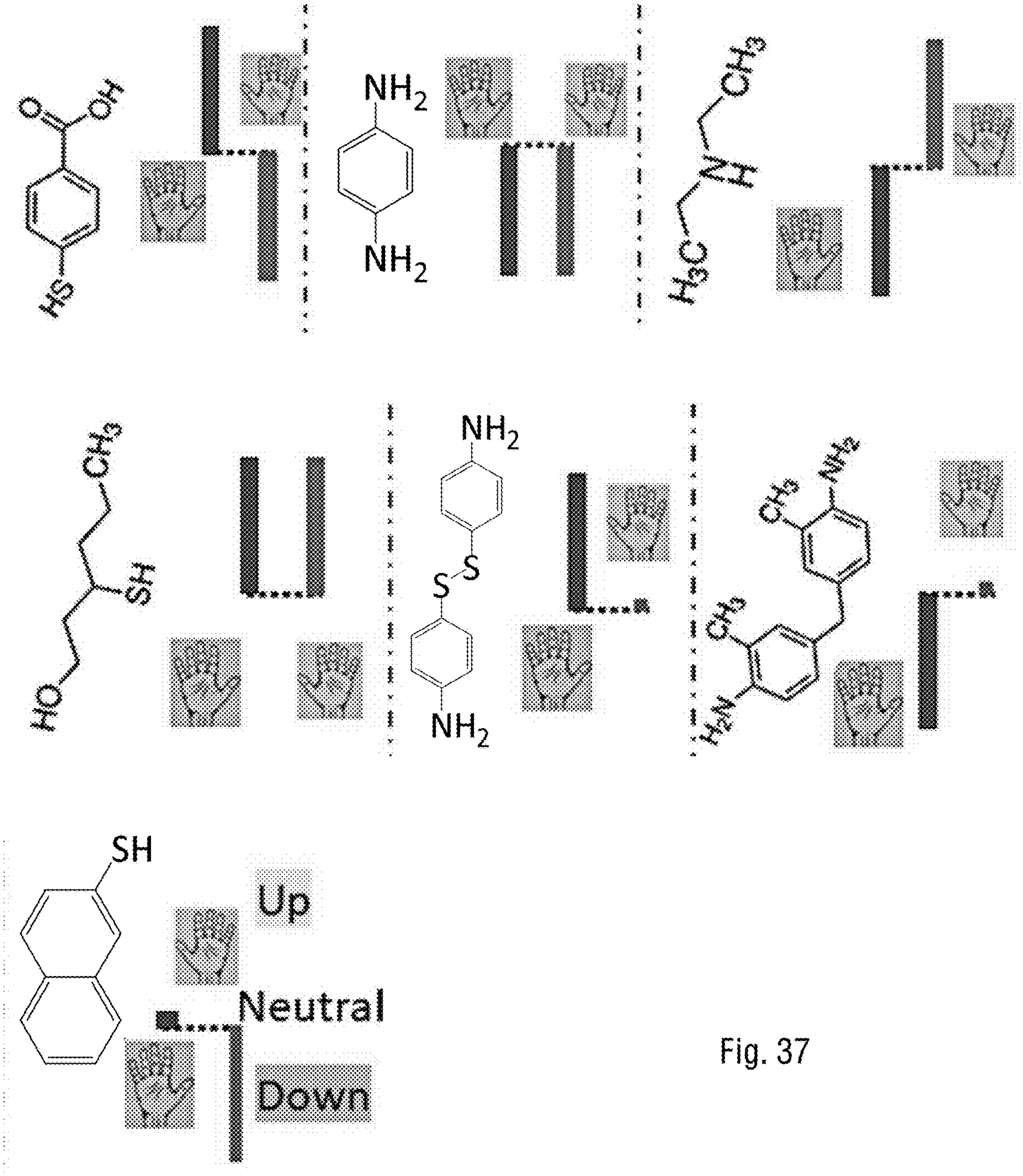
FIG. 37 shows the different orientation of the resistance change (up, down and neutral) for chiral exposure for various chemical ligands.

FIGS. 35*a*-35*c* show the typical response pattern of pure, racemic, and enantiomeric mixture of S (+) butanol and R (−) butanol, respectively, for achiral FDrGO ligands, while FIG. 35*d* shows the same for chiral FDrGO ligands. FIGS. 36*a*-36*c* show the chiral selectivity observed for various DrGO ligands. FIG. 37 shows the different orientation of the resistance change (up, down and neutral) for chiral exposure for various chemical ligands. As seen in these figures, the excellent chiral selectivity is observed for some specific FDrGOs functionalised with organic ligands, for example 4-aminophenyl disulphide and others. Various chemical ligands also exhibit various orientations (up/down/neutral) of the resistance change, as seen in FIG. 37.

Figure 38:
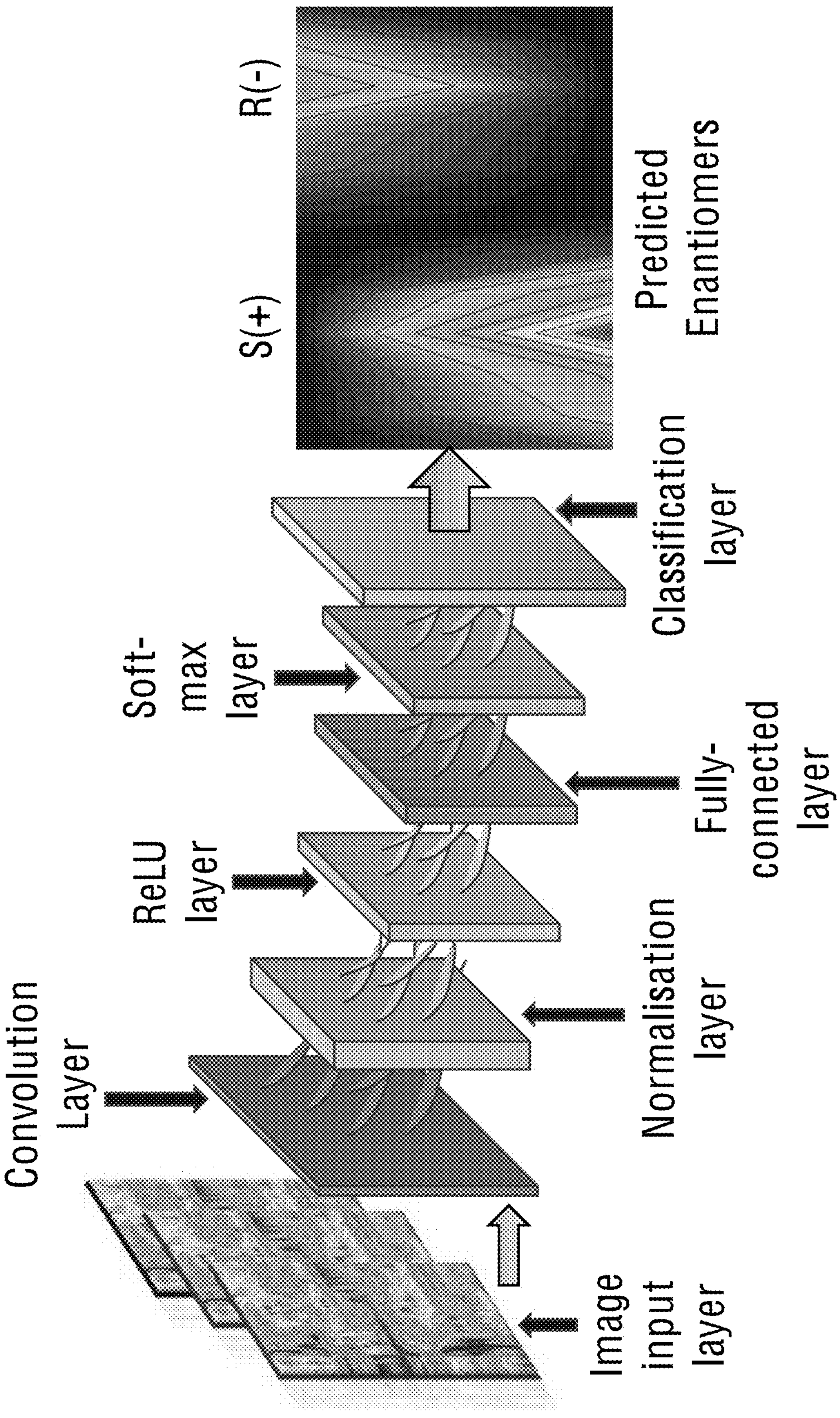
FIG. 38 illustrates an exemplary embodiment of the machine-learning process for the enantiomer discrimination starting with the image input layer and outputting the maximum availability of the predicted enantiomers and their ratio.
Figure 39A:
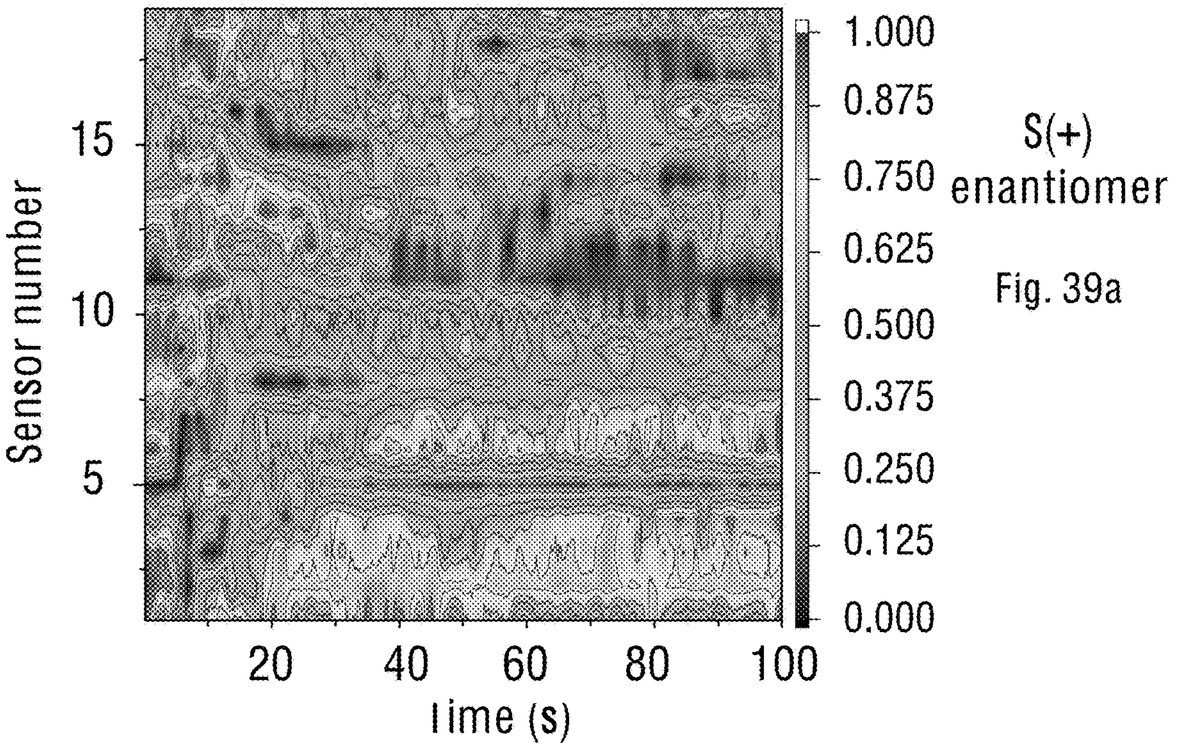
FIGS. 39*a*-39*e* show the input μGC composite images as a function of a sensor number on a time stamp for single S (+) and R (−) enantiomers of 2-butanol, and for its 2:1 and 1:2 enantiomeric mixtures, and the racemic (1:1) mixture, respectively.
Figure 39B:
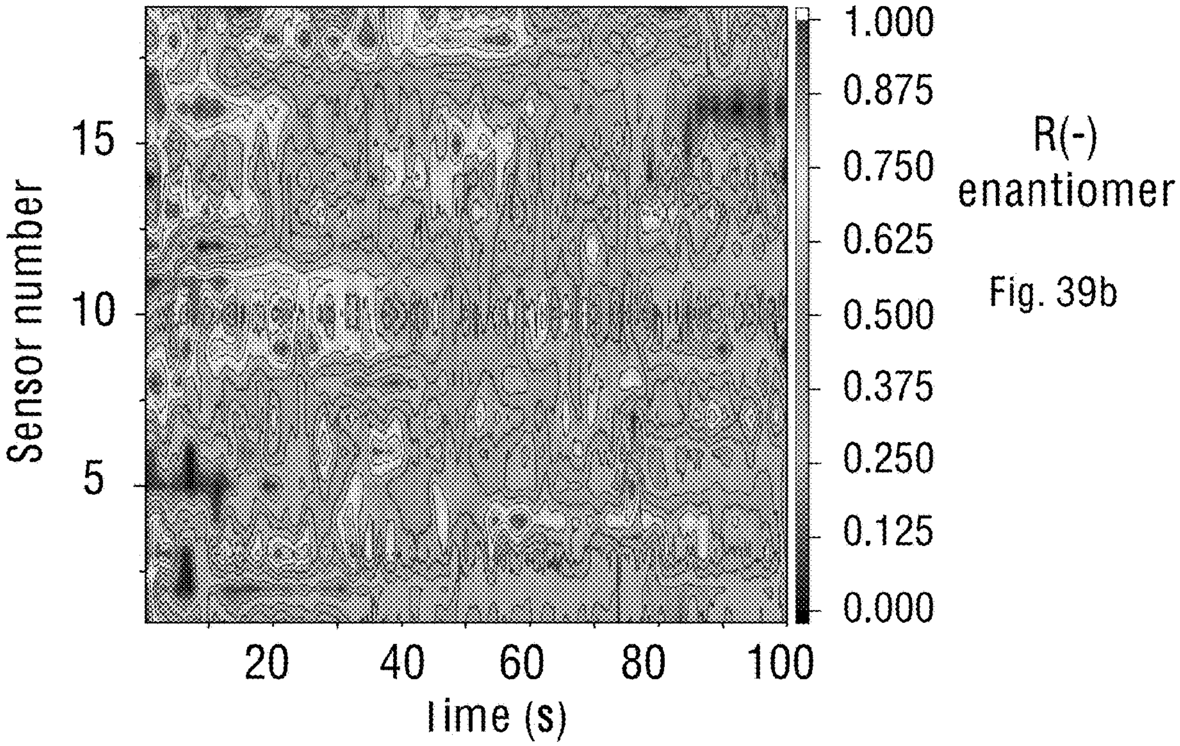
Figure 39C:
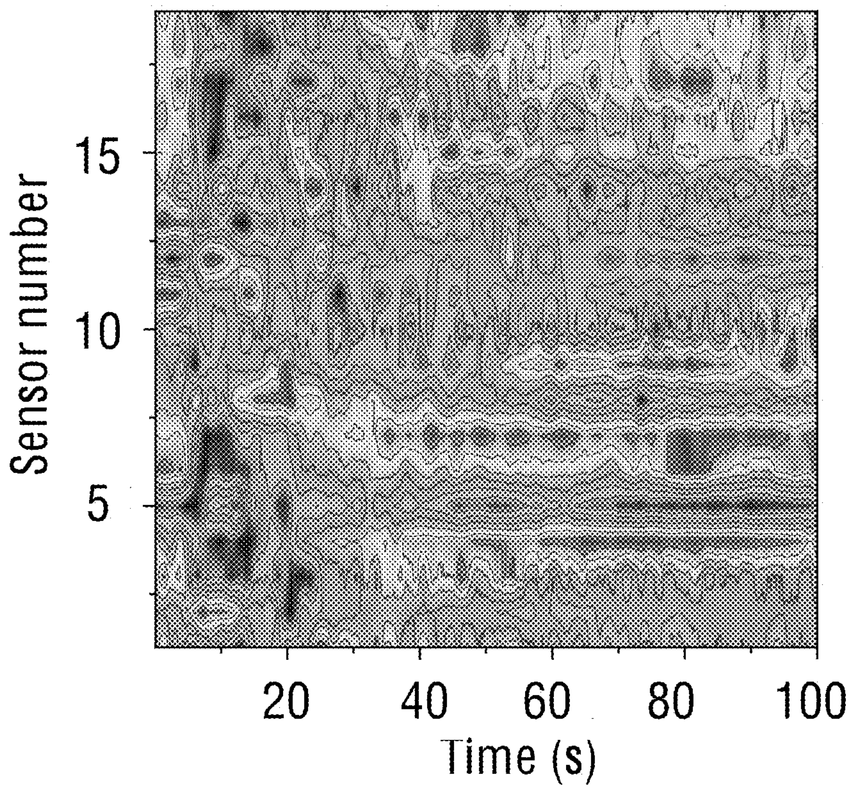
Figure 39D:
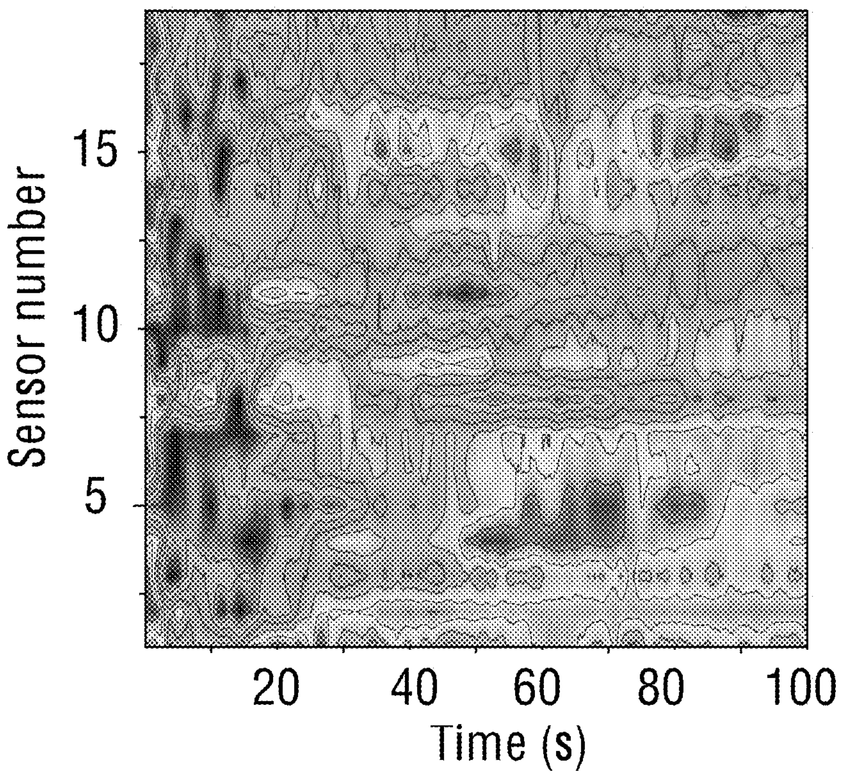
Figure 39E:
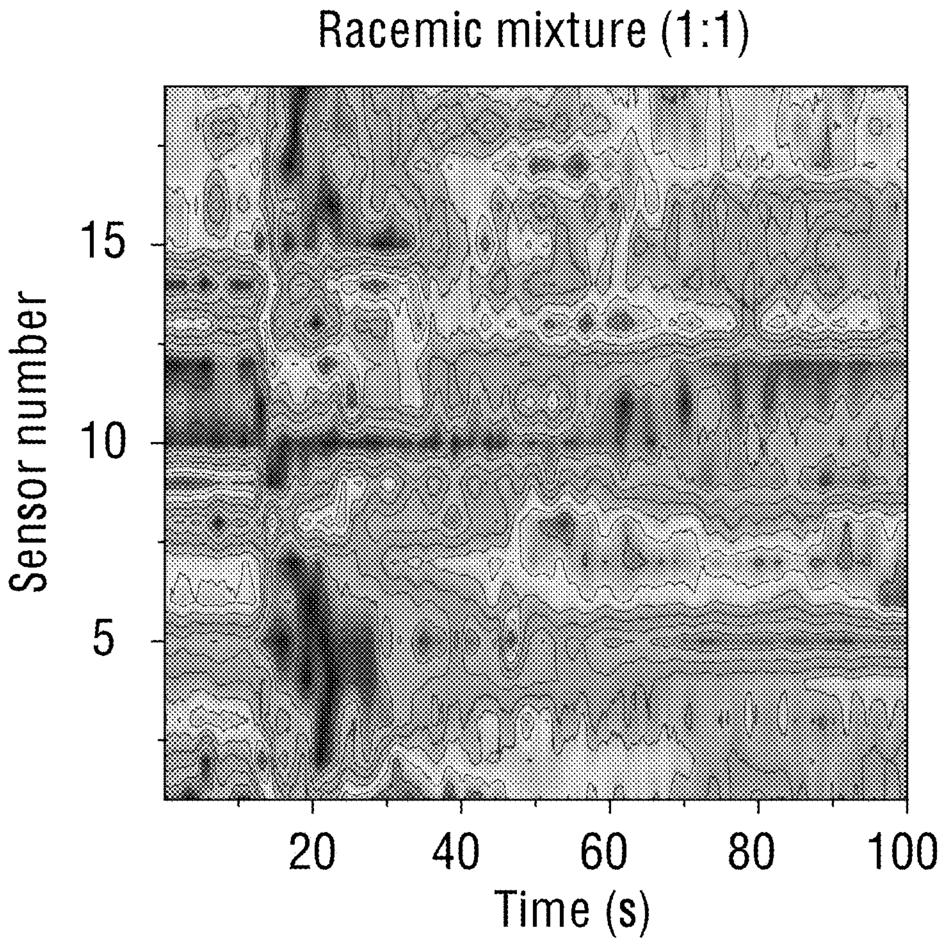

Reference is now made to FIG. 33 illustrating the μGC enantiomer separation on the origami layers to obtain the composite chromatographic image. As mentioned above, the composite chromatographic image is used as an input to the LSTM-based neural network. FIG. 38 shows an exemplary embodiment of the machine-learning process for the enantiomer discrimination starting with the image input layer and outputting the maximum availability of the predicted enantiomers and their ratio. A feed-forward neural network of several layers shown in FIG. 38 is employed in the machine-learning method of the present invention. As shown in the figure, the first layer, which is defined as "an input layer", inputs the results of the μGC measurement "y" to the second layer, which is the convolution layer in this example. The neurons of the input layer output the input data, which is (in this example) the μGC measurement results y of a single experiment, to the second layer. The output of the convolution layer is the input of the normalisation layer, followed by the rectified linear layer (or ReLU layer). The output of the last hidden layer is fed to the output layer, which results in the time stamp discrimination.

For all the hidden layers, the ReLU activation function is used. The output of the ReLU layer is then fed as an input to the next (fully-connected layer) layer, followed by softmax and classification layers so on until the last layer (output) layer is reached. According to the present invention, the number of the hidden layers can be any, but at least one. In this model of the present invention, the output layer has at least one neuron having low and high activations levels associated with the two possible patterns and time stamps. The output probability is calculated by the loss function (the mean-squared error) between the output patterns of compounds (for example, enantiomers) and their true patterns.

As mentioned above, the specific (exemplary) parameters of the neural network of the present invention are in no way limiting. They may further be fine-tuned and adjusted, including the number of hidden layers, the number of neurons in each layer, the activation function of each layer, the activation function of the output layer, the optimisation method and learning rate, and the addition of regularisation methods.

The machine-learning method of the present invention can also be used for time stamp estimation. This can be achieved by generalising the discrimination problem between two patterns to a discrimination problem between a few to many patterns, where each pattern corresponds to a small time-stamp interval. The structure of the neural network, including for instance the number of layers, number of nodes in each layer, type of activation functions and loss functions, might have to be adjusted in that case.

Figure 40A:
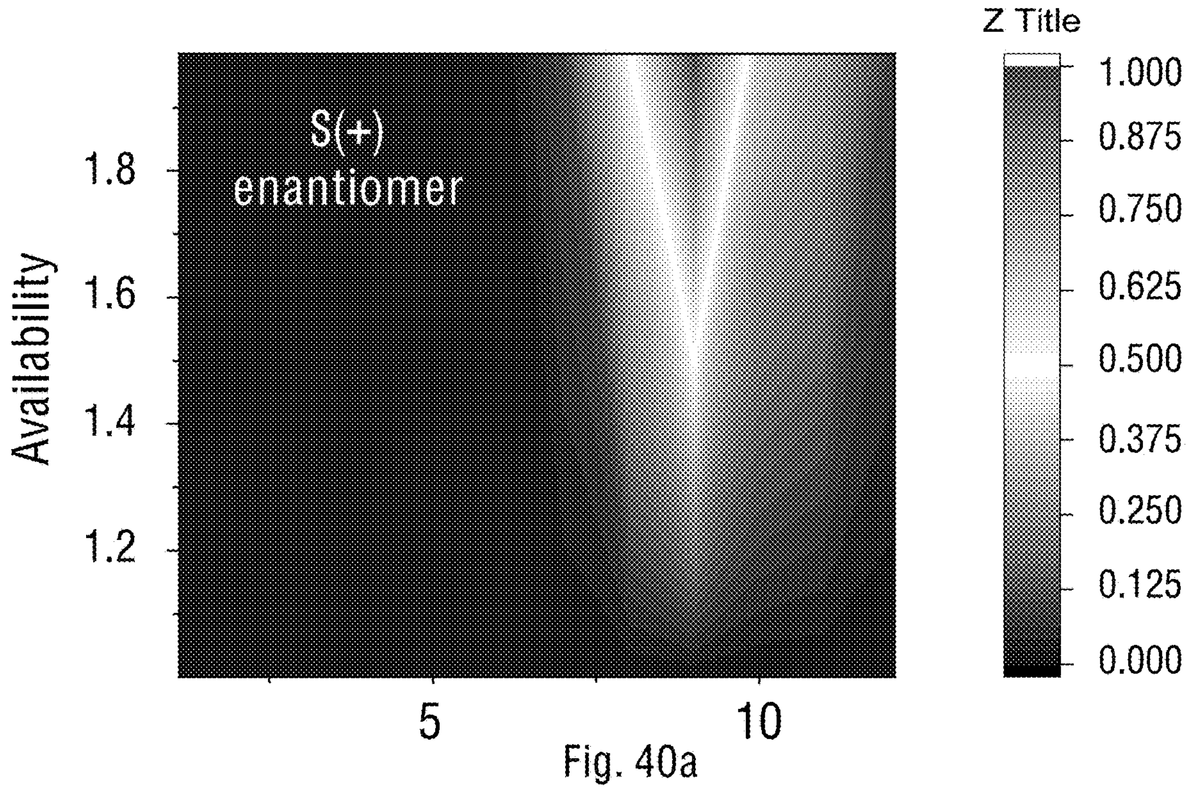
FIGS. 40*a*-40*d* show the output maximum availability of the predicted isomers for single S (+) and R (−) enantiomers of the compound 2-butanol, for its 2:1 enantiomeric mixture, and the racemic (1:1) mixture, respectively.
Figure 40B:
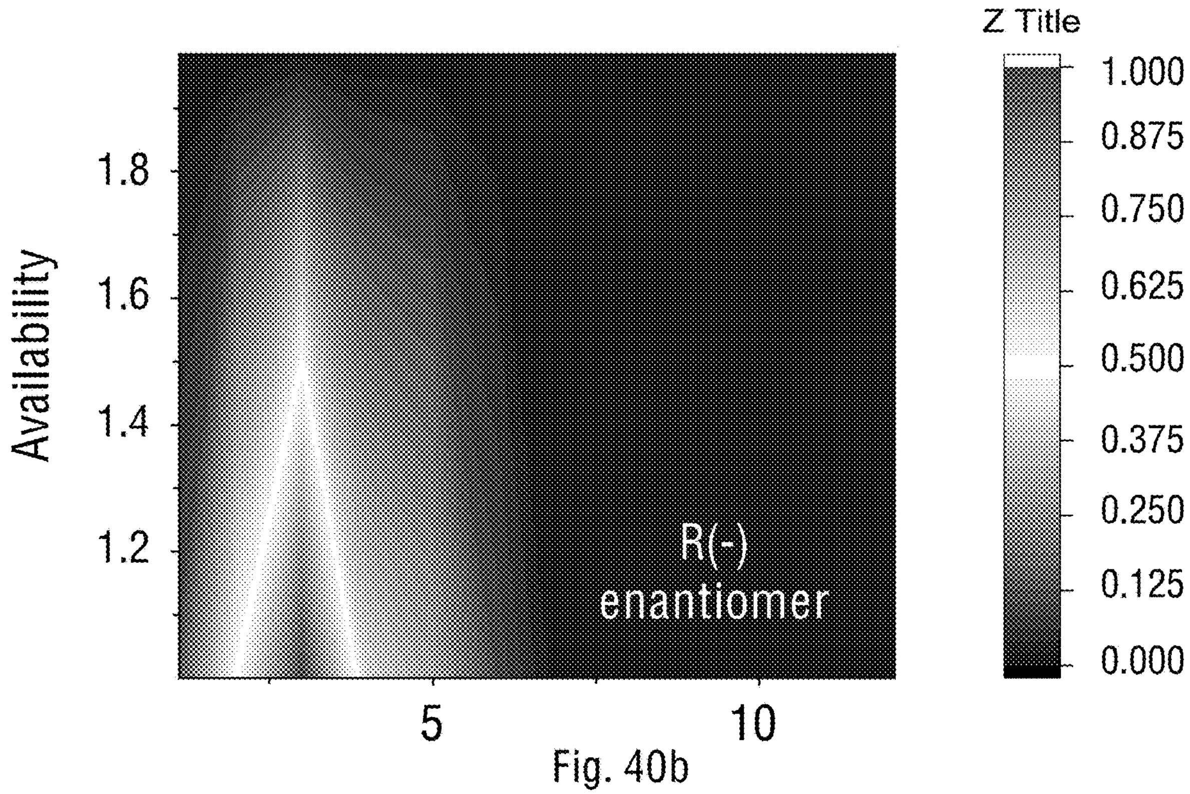
Figure 40C:
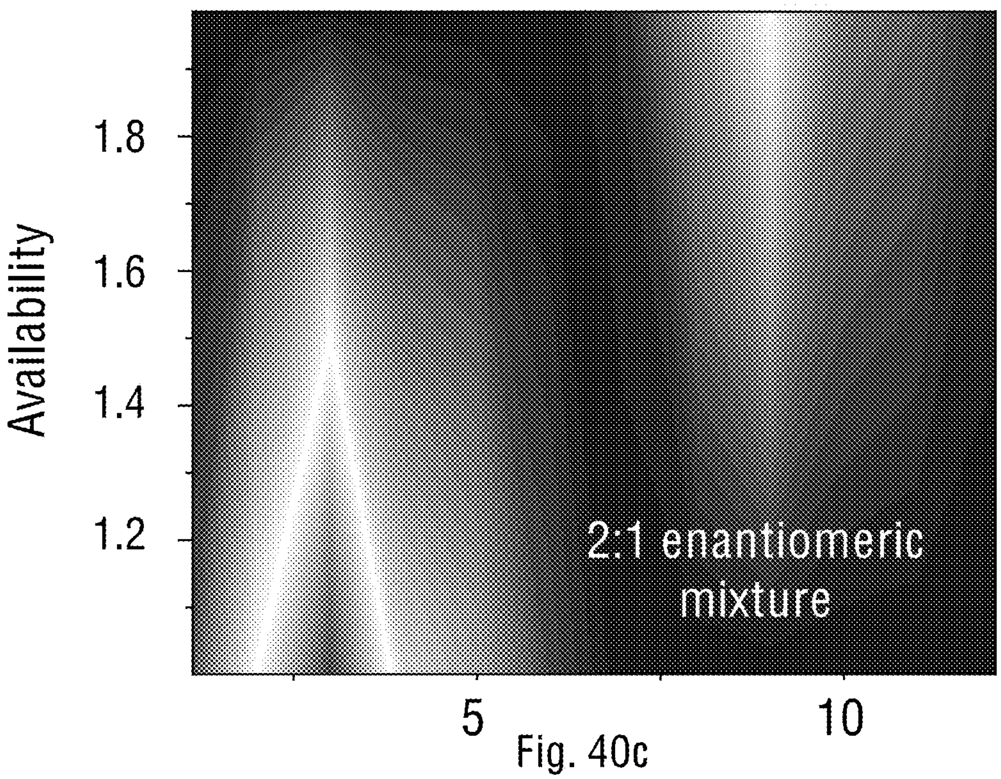
Figure 40D:
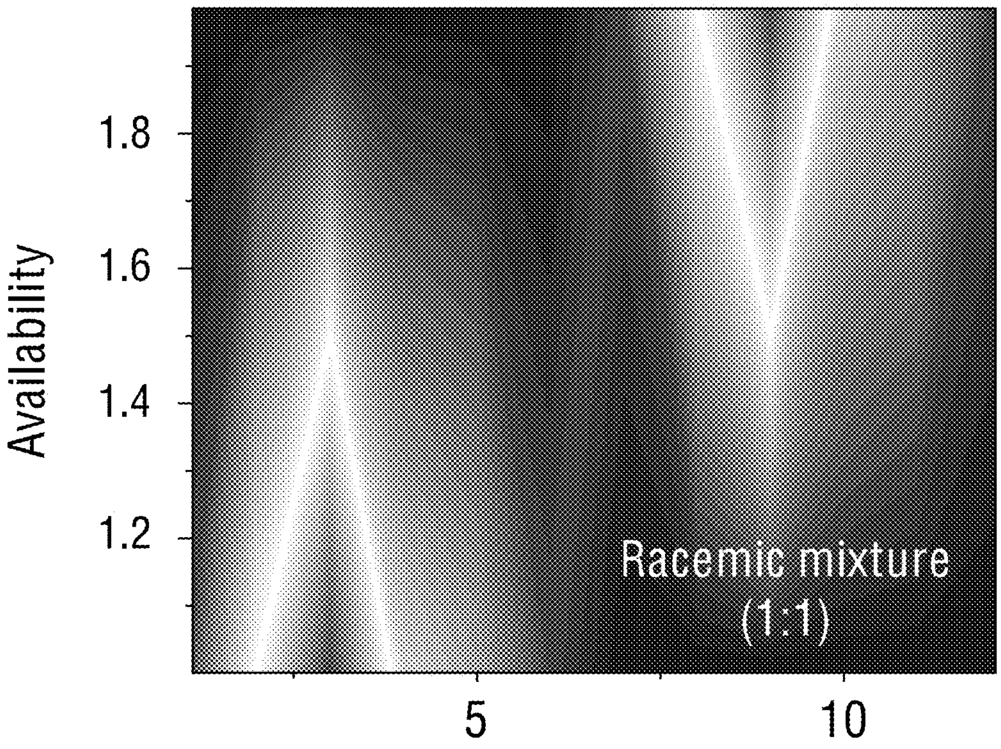

Reference is now made to FIGS. 39*a*-39*e* showing the input μGC composite images as a function of a sensor number on a time stamp for single S (+) and R (−) enantiomers of the compound 2-butanol, and for its 2:1 and 1:2 enantiomeric mixtures, and the racemic (1:1) mixture, respectively. FIGS. 40*a*-40*d* show the output maximum availability of the predicted isomers for single S (+) and R (−) enantiomers of the compound 2-butanol, for its 2:1 enantiomeric mixture, and the racemic (1:1) mixture, respectively. FIG. 40*e* shows the classification efficiency of each ratio with the accuracy of approximately 94% from the trained model.

Figure 41A:
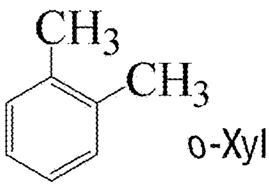
FIGS. 41*a*-41*g* show another example of chromatographic separation of individual and mixture of structural isomers from Layer 2 of the origami paper that generated unique μGC image chromatograms to distinguish individual components (structural isomers of xylene).
Figure 41A:
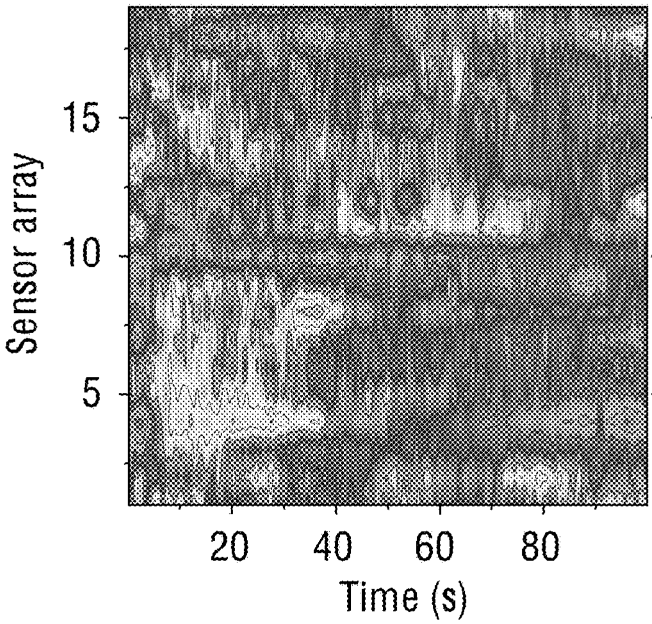
Figure 41B:
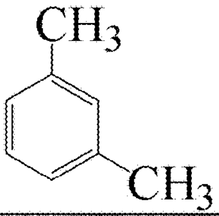
Figure 41B:
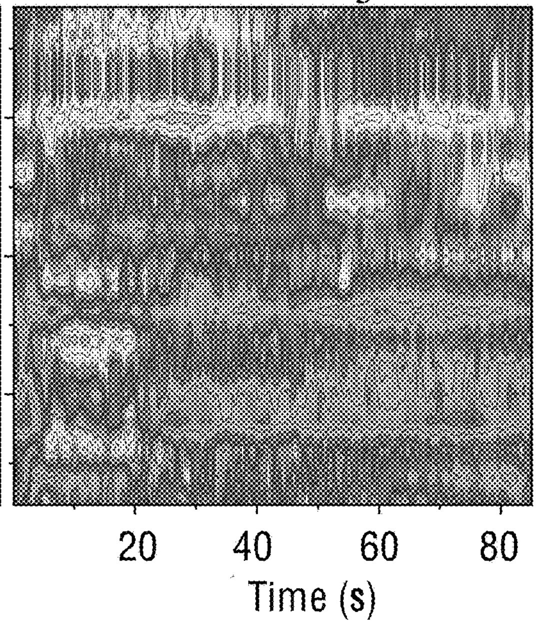
Figure 41C:
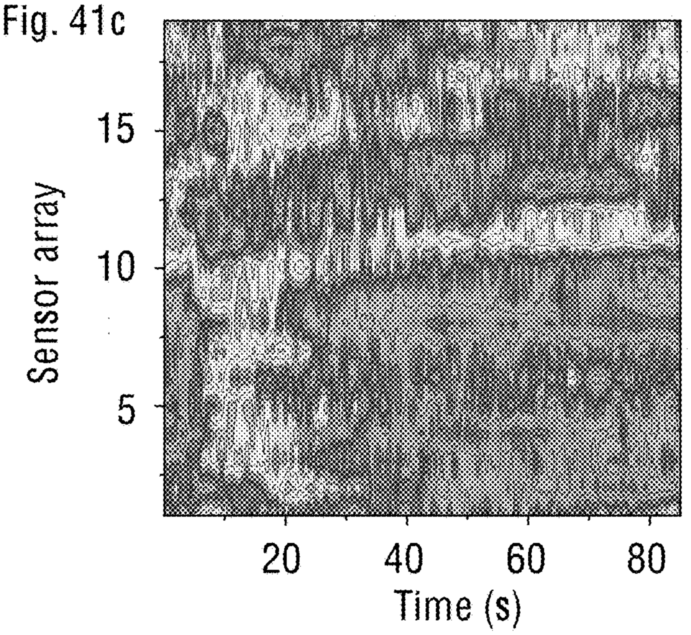
Figure 41C:
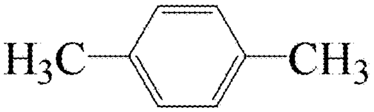
Figure 41D:
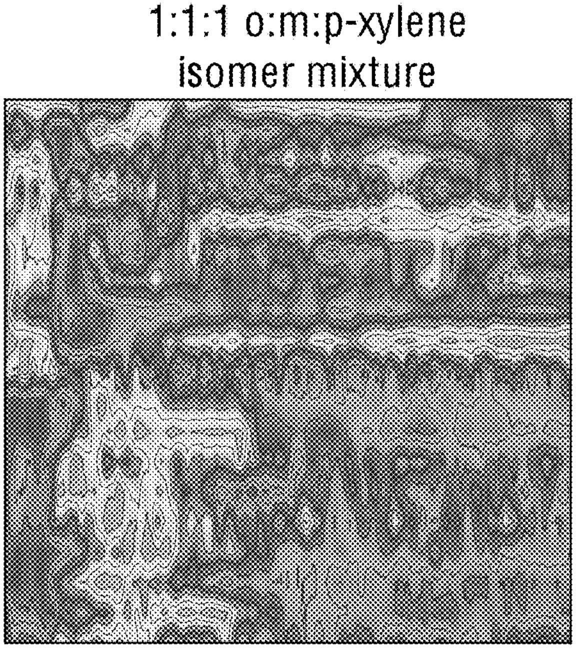
Figure 41E:
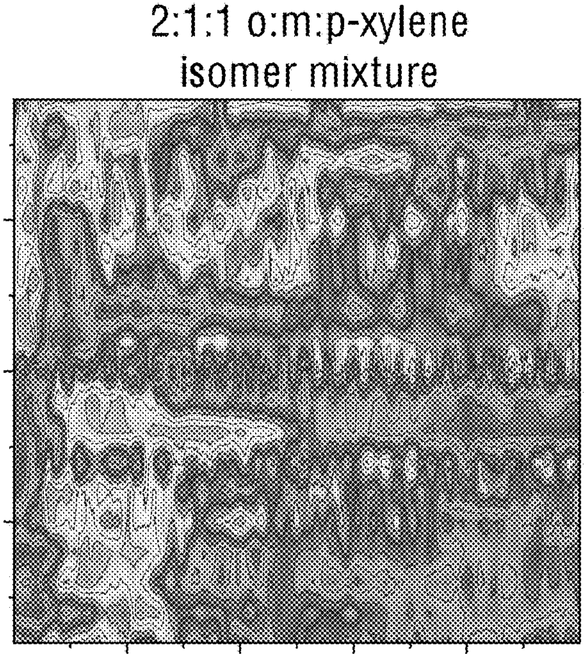
Figure 41F:
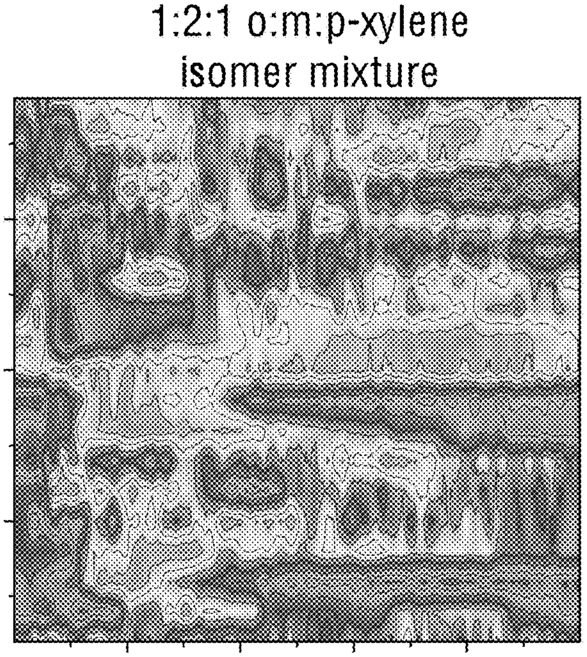
Figure 41G:
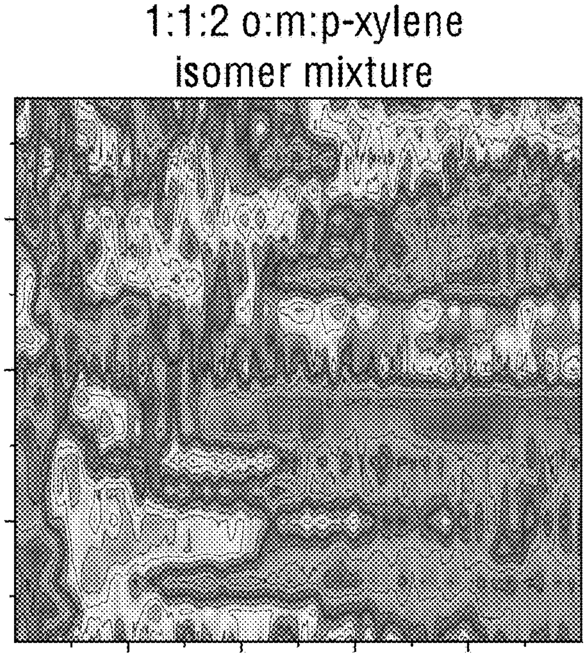

FIGS. 41*a*-41*g* show another example of chromatographic separation of individual and mixture of structural isomers from Layer 2 of the origami paper that generated unique μGC image chromatograms to distinguish individual components (structural isomers of xylene). The sensing pattern synthetic images (pure enantiomer/mixture) shown in the above figures are constructed to use as an input to self-learning architecture of the deep neural network shown in FIG. 38. In particular, FIGS. 41*a*-41*c* show the synthetic image colormaps of three structural isomers of xylene (ortho, meta and para), respectively. FIGS. 41*d*-41*g* show the images of xylene different isomer mixtures. As seen in FIG. 41*h*, the obtained results demonstrate the excellent classification efficiency from the trained model, with an advantage of integrating temporal-information, sensor-chemistry, separation and inter-sensor dependency in a one single image. This strategy is used for xylene isomers' recognition with more than 95% classification efficiency and 93% accuracy in prediction.

In another aspect of the present invention, the inventors developed all the smart paper e-card when connected in a layered medium format, specifically in a folded origami format. In this case each layer communicates with 2 wires I2C protocol. One "master" card communicates in each layer with each "slave" card in the layer. In this way, it is possible to communicate with all the sensors with minimum number of wire lines. The inventors developed and designed a program externally for communicating all 128-sensor device using I2C communication in 1 second interval. It is also possible to increase the layer numbers (or more sensors) if needed. All software programs and algorithms have been developed in ATMEL MEGA 2560 micro-processor in C language.

In some embodiments, the method and system of the present invention are suitable for use in discriminating various isomers and enantiomers in various mixing conditions by utilising the chiral chemical ligands, such as chiral organic acids, functionalized on graphene network. That allows excellent separation and detection of structurally similar and identical compounds, such as enantiomers.

The obtained results can be seen as a strong indication that the machine-learning methods are actually the methods of choice when analysing the data, for example μGC data in a variety of scenarios and in a variety of applications, including real-time molecular analysis. The present invention clearly shows that machine-learning methods can effectively learn the physical spectroscopic and chromatographic models taking into account various kinetic and thermodynamic parameters and by that constitute an advantageous alternative to modern spectroscopic and chromatographic methods, such as GC-MS, MALDI-TOF and NMR, which are time-consuming, cumbersome, require sophisticated and bulky equipment and trained personnel to carry out the tests.

EXAMPLES

Methods

Synthesis and Binder-Free Inkjet Printing Recipe of Hybrid Graphene Ink

In a typical synthesis, 100 mg of GO and 50 mg of dopamine hydrochloride (Sigma) were added into 200 mL of 10 mM Tris-solution (PH~8.6) and sonicated for 15 min in an ice cool water bath for dispersion. The reaction mixture was stirred at 400 rpm at 65° C. for 24 h for reduction (rGO) and subsequent encapsulation by polymerization (DrGO) through Michel addition or Schiff mechanism (see the current specification for details). The product (DrGO) was cooled to room temperature and washed several times with DI water (~10 times) and ethanol (~5 times) and collected by centrifuge. In each step of washing with water, pH of the suspension medium was checked until it reaches neutral (pH~7) to remove the alkaline by products. As prepared, cleaned and dried DrGO powder (5 mg) is dispersed in 20 mL DI water (pH (~8.6) has been then adjusted with trometamol (Trizma®, Sigma) and mixed with 10 mg of amino-terminated or 20 mg of thiol-terminated chiral/achiral ligand (please see the list in Table 1).

In case of water insoluble ligand, the mixture of water: ethanol (1:1 volume ratio) was used as dispersion reaction medium. The reaction mixtures are gently stirred for ~15 h at room temperature. After that, mixtures are washed several times with water (10 times) and alcohol (5 times) and centrifugally collected and dried in reduced pressure. In each step of washing pH of the solution was checked until it washes out all alkalinities from the suspension. The dried functionalized powder (FDrGO) is redispersed in DMF and sonicated at low power for dispersion of the ink for ~1-2 minutes and subsequently used for inkjet printing on paper.

The details of binder free print approach, printing on wide range substrate, reaction mechanism, list of bio-chemical ligands (thiols, amines, chiral) and its advantage over conventional printing from literature is discussed in the present specification).

Silver Nanowire Synthesis

One-dimensional silver nanowire using solvothermal seed mediumted method. Due to its photosensitivity, the AgCl seed solution was prepared in the dark condition. Typically, aqueous solution of silver nitrate (5 mL, 0.5 M) is mixed with aqueous solution of sodium chloride (5 mL, 1 M) and stirred at ~700 rpm for a minute. Within few moments white silver chloride immediately precipitated which is separated and washed with deionized water and kept under vacuum for 1 hr in dark. Next, 1.36 g of PVP (40000 MW) are separately dissolved into 160 mL of ethylene glycol in a round flask (with reflux) at 700 rpm at ~170° C. for 5 minutes. Then an excess (~50 mg) of dried fine AgCl powder is added in this hot solution and within 1-2 minute the transparent solution will change to light yellow which is an indication of the very fine silver NP. After 3-4 minutes, 0.22 g of silver nitrate $AgNO_3$ are added in this hot solution for grow at 300 rpm. The solution colour was changing in this sequence: light yellow, dark yellow, brown, green and finally grey. This indicates the formation of silver long nanowire.

After that, the solution is kept for cooling at room temperature and cleaned with centrifuge periodically by water and ethanol 10 times to remove extra PVP and EG. The fresh and cleaned silver nanowire is then dispersed in isopropyl alcohol with mild ultra-sonification for 30 s and is used for inkjet printing on paper.

Characterizations of GO, DrGO, FDrGO Inks

SEM Analysis

Morphological study using SEM (Sigma 500, Zeiss Ultra-Plus High-Resolution SEM, Germany) was taken to see the microscopic view of synthesized materials dispersed in alcohol and spin coat on silicon wafer ($Si/SiO_2$) to distribute flakes uniformly. FIGS. 12*a-d* show the typical SEM images of the micro-structure of GO, DrGO, thiol-FDrGO and amine-FDrGO respectively with an indication that the nano-structures maintain almost 2D flat structure after reduction (DrGO) and functionalisation (FDrGO). Images were acquired at ~5 kV electron acceleration and 4-8 mm working distances.

Raman Analysis

Raman spectra (recorded with Horiba Jobin Yvon Lab RAM HR Evolution Micro-Raman, Japan) was obtained with 532 nm laser. All samples dispersed in ethanol are spin coated on silicon wafer. FIG. 13*a* shows Raman spectrum plot of GO, DrGO and typical FDrGO samples with calculated $I_D/I_G$ values (G band~1571 $cm^{-1}$ and D band ~ 1346 $cm^{-1}$, which correspond to $E_{2g}$ phonon of $sp^2$ C atoms and breathing mode vibrations of K points phonons ($A_{1g}$ symmetry)) that shows the increase of this values, suggesting effective reduction of GO.

FTIR Analysis

FTIR (recorded with Bruker Vertex 70V KBr BS vertical ATR-FTIR) measurements (in the range of 300-4000 $cm^{-1}$) are done by mixing cleaned and dried (overnight) sample powder with KBr to form pellets. Typical spectrum (see FIG. 13*b*) shows emergence of intense absorption peaks at ~1096-1100 $cm^{-1}$ (C—O—C stretching) after functionalisation that suggests successful integration of ligands.

$^1$H NMR Analysis $^1$H NMR analysis was done with Bruker ARX 300 MHz spectrometer using d-DMSO (Sigma) as the solvent, in 1000 scans at a relaxation time of 2 s.

Figure 42:
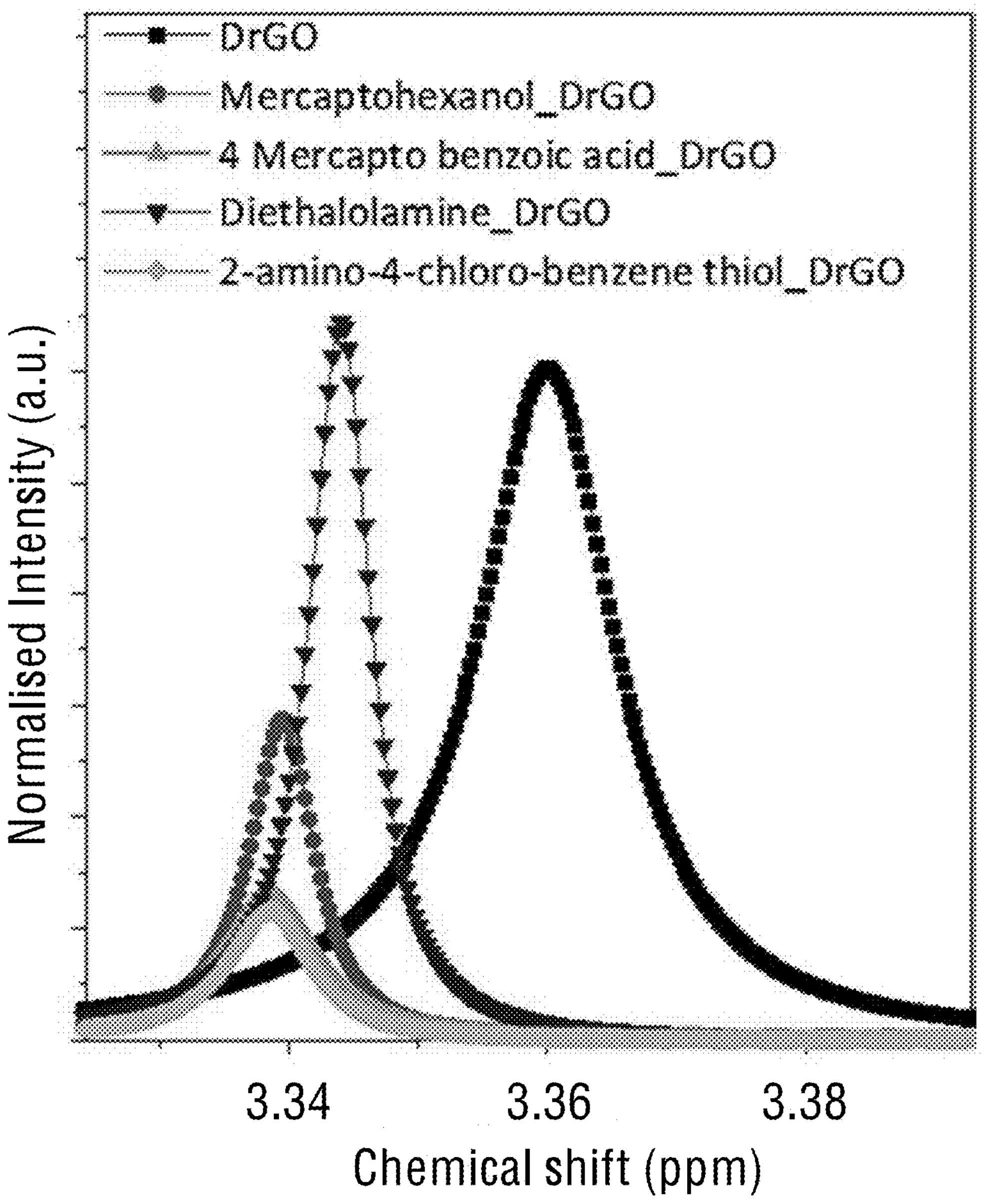
FIG. 42 shows the comparison of the $^{1}H$ NMR spectra of DrGO with FDrGO samples to show the difference between the thiol and amine ligands.
Figure 43A:
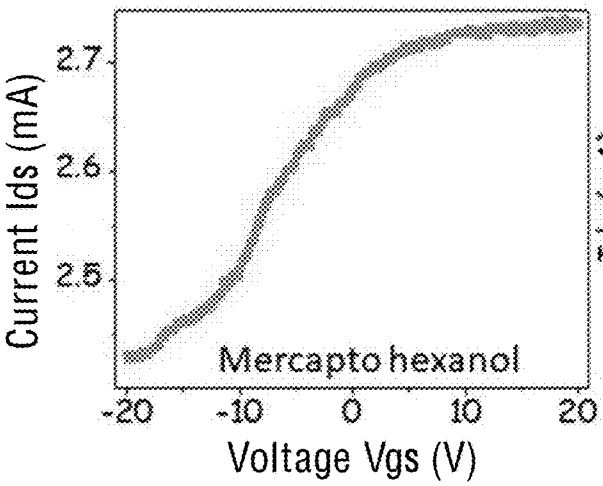
FIGS. 43*a*-43*d* show the comparison of FET and I-V characteristics of DrGO with various FDrGO samples, respectively, to show the difference between thiol and amine ligands.
Figure 43C:
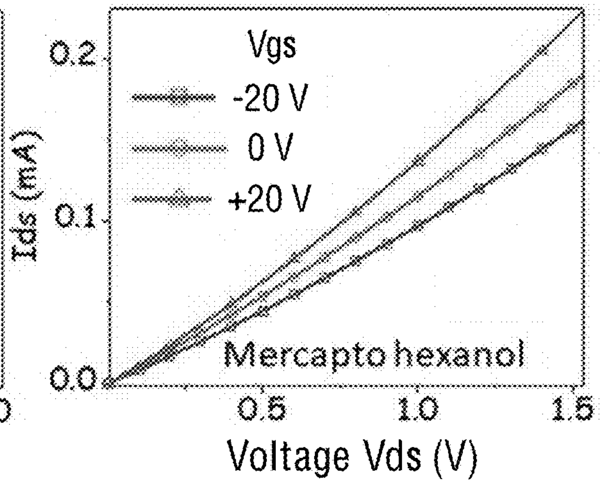
Figure 43B:
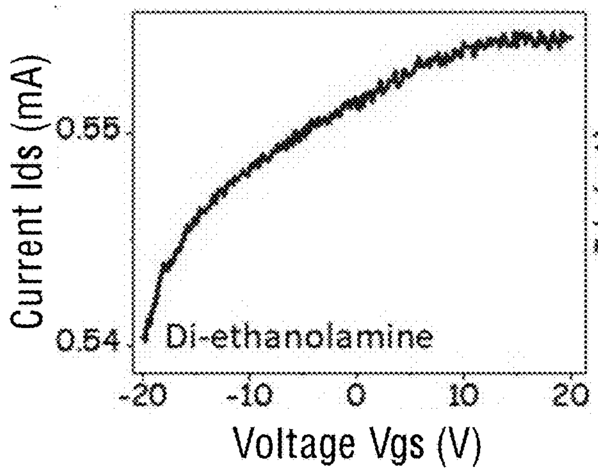
Figure 43D:
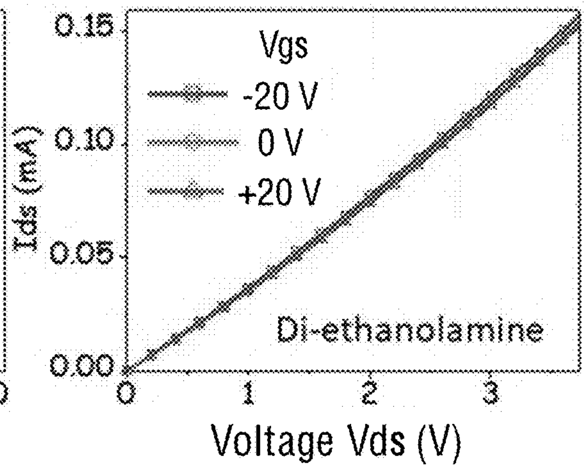

FIG. 42 shows the comparative $^1$H NMR spectrum for all samples. A new peak appears around ~2.75 ppm for all FDrGO samples which suggests the successful grafting of these ligands. In the spectra in FIG. 42, the distinct peak shift is observed for typical thiol (3.338 ppm) and amine (3.344 ppm) based FDrGO from DrGO sample (~3.36 ppm).

Electrical Characterisation

Typical gate dependent FET properties for carrier type determination were done using spin coated samples on $Si/SiO_2$ wafer with electrometer (Keithley 2636A and 3706) interfaced with the Lab VIEW software. FIGS. 43*a*-43*d* show the comparison of FET transfer characteristic, as well as the I-V characteristics of DrGO with various FDrGO samples, respectively, to show the difference between thiol and amine ligands. The I-V and FET transfer characteristics show the ohmic nature of the contact and n-type conductivity for all measured samples, which may be due to the integration of $N_2$ adatom at graphitic plane from polydopamine polymerisation (reduction+encapsulation) on graphitic lattice.

Cytotoxic Assessments of FDrGO Inks

Cytotoxic assessments are performed for human epithelial lung cells (see FIG. 15*a*) using various FDrGO inks (thiol, amine and chiral group) for 10-100 μg/ml dosage for 24 hrs treatment time (see FIGS. 15*b*-15*k*).

FIG. 151 shows the plot of the calculated live cells % (marginal or negligible cell death occurs) that suggests suitability for working with these materials in continuous synthesis, production, printing line in industrial arrangement. Details of the cell culture, FDrGO treatments and assay preparation for imaging are provided below.

Cell Culture Treatment

Human epithelial lung cells (BEAS-2B, ATCC, CRL-9609, produced in Israel) were seeded at $96\times10^3$ cells per well into 24-wells plates and culture with 0.5 mL full RPMI-1640 medium (Sigma-Aldrich, Israel) at 370 C with 5% CO2. After 24 hours of recovery, cells were washed with the PBS $Ca^{2+}$/Mg2+ (Phosphate Buffered Saline, Sigma-Aldrich, Israel), and treated for 24 hours. All treatments were performed in the cell culture full medium. Graphene was vortexed shortly before making final dilutions for the treatment in the cell culture medium. Cells were then exposed to 10 and 100 μg/ml graphene.

Annexin V-FITC/PI Assay

After 24 hours of the treatment at the indicated concentrations, cells were gently washed with PBS. Annexin-V and propidium iodide (PI) staining was performed according to the manufacturer's instructions (Bio Legend, California, US) in 0.2 mL full RPMI-1640 medium per well. Cells were gently washed again with PBS, and Hoechst 33342 (Invitrogen by Thermo-Fisher Scientific, Israel) 0.2 μg/mL solution was added to the cells. Cells were observed and analysed by an In-Cell Analyzer 2000 System (Technion Life Sciences and Engineering Infrastructure Centre, Technion, Israel).

Preparation of Breast Cancer and Normal Breast Tissue Samples

Frozen tumorous and healthy breast tissues, of no specific type, from different patients were purchased from the Israeli Biorepository Network for Research MIDGAM (Haifa, Israel). Both tumorous and non-cancerous tissues from patients that did not undergo through chemotherapy, were collected after surgery. The frozen tissues were transported inside their plastic cryovials in dried ice and kept in a −80° C. freezer until experiment performance. All tissue samples were thawed in their plastic cryovials to room temperature for 10-20 minutes and 50-100 mg tissue were prepared to be inserted in (500 [μL]-$m_{tissue}$ [mg]) μL 0.9% NaCl solution in double-distilled water, and EPA 524 internal standard mix with 2000 μg/mL 1,4-dichlorobenzene-d4 in methanol, purchased from Sigma-Aldrich, was used as internal standard with concentration of 40 ppb. Tissues from samples were analysed with GC-MS and with the μGC detector on an origami paper-based system of the present invention.

Measurements of Malignant/Non-Malignant Tissues

Chromatographic analyses involved a GC-7890B/MS-5977A instrument (Agilent) equipped with an SLB-5 ms capillary column (30 m length; 0.25 mm internal diameter; 1 μm thickness; Sigma-Aldrich) combined with the ITEX PAL RSI 120 headspace autosampler system. Trap preclean conditions were 180 seconds and 260° C. Incubation of samples was set at 55° C. for 15 minutes. Agitator speed was defined as 500 RPM. Desorption flow was 10 μL/sec at 250° C., while extraction strokes were set at 100, extraction volume at 1000 μL and aspirate and dispense flow rates at 100 μL/sec. Injection aspirate flow rate was defined as 10 μL/sec. The carrier gas was helium, the flow through the column was set at 1.5 mL/min and the temperature in the column ranged between 35° C. and 300° C. at a rate of 15° C./min. The GC-MS obtained chromatograms were analysed using Mass Hunter qualitative analysis version B.07.00, Agilent Technologies, and spectral library match NIST was used for compounds identification. The measurements performed with the system and method of the present invention was done with all clinical samples kept at 55° C. water bath and ultra-pure $N_2$ as baseline with ~10 Hz sampling frequency using Arduino Mega board and the I2C interconnected protocol.

Spectrogram Measurement of Tumorous/Healthy Tissue and Skin-Based Samples

Results obtained with the system and method of the present invention in time domain (see FIGS. 29*c* and 29*f*) from clinical samples are transformed in frequency domain using a short-time window-based FFT algorithm using Hanning. The largest difference in the generated spectrogram for the samples clearly exhibits the unique time position where a specific VOC appears that is/are unique for malignant/non-malignant samples. This robust technique (1-2 s) can be used during continuous data sampling and show real time identification through its colour-mapping or colour-band representation (see FIGS. 29*e* and 32*a*-32*d*).

REFERENCES

[1] Morad K. Nakhleh et al., "*Diagnosis and Classification of* 17 *Diseases from* 1404 *Subjects via Pattern Analysis of Exhaled Molecules*", ACS Nano 11 (1), 112-125 (2017).

[2] Yoav Y. Broza, Liat Zuri and Hossam Haick, "*Combined Volatolomics for Monitoring of Human Body Chemistry*", Scientific Reports 4, 4611 (2014).

[3] R. F. Hossain, I. G. Deaguero, T. Boland and A. B. Kaul, "*Biocompatible, large-format, inkjet printed heterostructure $MoS_2$-graphene photodetectors on conformable substrates*". *NPJ 2D Mater. Appl.* 1, 28 (2017). DOI: 10.1038/s41699-017-0034-2.

[4] S. Santra, G. Hu, R. C. T. Howe, A. De Luca, S. Z. Ali, F. Udrea, J. W. Gardner, S. K. Ray, P. K. Guha and T. Hasan, "*CMOS integration of inkjet-printed graphene for humidity sensing*". *Sci. Rep.*, 5, 17374 (2015). DOI: 10.1038/srep17374 (2015).

[5] C. Sriprachuabwong, C. Karuwan, A. Wisitsorrat, D. Phokharatkul, T. Lomas, P. Sritongkham and A. Tuantranont, "*Inkjet-printed graphene-PEDOT: PSS modified screen printed carbon electrode for biochemical sensing*". *J. Mater. Chem.*, 22, 5478 (2012). DOI: doi.org/10.1039/C2JM14005E.

[6] K. Arapov, R. Abbel, G. de With and H. Friedrich, "*Inkjet printing of graphene*". *Faraday Discuss.* 173, 323-336 (2014). DOI: 10.1039/C4FD00067F

[7] E. B. Secor, T. Z. Gao, A. E. Islam, R. Rao, S. G. Wallace, J. Zhu, K. W. Putz, B. Maruyama and M. C. Hersam, "*Enhanced Conductivity, Adhesion, and Environmental Stability of Printed Graphene Inks with Nitrocellulose*". *Chem. Mater.*, 29, 2332-2340 (2017). DOI: 10.1021/acs.chemmater.7b00029.

The invention claimed is:

1. A method for detection and analysis of chemical compounds in a sample, wherein said method comprises:

(1) subjecting the sample to chromatographic separation on a layered separating medium;

(2) detection of chemical compounds in the sample separated on the layers of said separating medium with a detector, said detector comprises an array of sensors printed on each layer of said separating medium and generates data, said data comprises a string or an array of measurement results from each said sensor on each said layer of the separating medium, said string or array of the measurement results is an input for an external memory; and (3) processing said data in the external memory by applying a machine-learning method on said measurement results to output a single bit whose value is '0' or '1', or an array of bits, or an array of integers, or an array of complex numbers, wherein said single bit, or said array of bits, or said array of integers, or said array of complex numbers corresponds to an estimated frequency, voltage, sensor conductance, electrical resistance, time of chromatographic elution, or mass-to-charge ratio, and to maximum availability or amplitude of the input, thereby providing information on the presence and properties of said compounds in the sample.

2. The method of claim 1, wherein said layered separating medium is:

1) a layered cellulose paper or layered nitrocellulose film, or 2) patterned, or 3) in a form of origami or kirigami, or 4) a cellulose paper in a flexible and foldable origami or kirigami format, or 5) a folded layer-by-layer paper or film architecture with embedded electronics.

3. The method of claim 1, wherein said sensors are screen-printed or inkjet-printed on each layer of said separating medium.

4. The method of claim 1, wherein said detector is a micro-gas chromatograph, miniaturised dispersive optical spectrometer, fibre-coupled optical spectrometer, micro-electromechanical system (MEMS)-based spectrometer, plasmon-enhanced Raman spectrometer, on-chip plasmonic spectrometer, piezoelectric crystal detector, or spin-induced mass spectrometer.

5. The method of claim 1, wherein said detector further comprises one or more microfabricated components, or hardware and software for instrument control, data acquisition and analysis.

6. The method of claim 5, wherein said microfabricated components are selected from capillary or chip-based micro-capillary separation columns, a source of carrier gas, pre-concentrator-injector, micro- and/or nano-optical components, micro-electromechanical system (MEMS) components, microfluidics components, pumps, filters, and valves.

7. The method of claim 1, wherein said sensors are selected from:

(a) thermal conductivity sensors;

(b) surface acoustic wave (SAW) sensors;

(c) chemiresistor array sensors;

(d) chemicapacitive array sensors; and (e) nanocantilever sensors.

8. The method of claim 1, wherein said sensors further comprise at least one chemical or biomolecular layer immobilised on top of said sensors and capable of binding or adsorbing said compounds from the sample.

9. The method of claim 8, wherein said at least one chemical or biochemical layer comprises:

1) chemical functional groups selected from amines, alkenes, alkynes, phosphines, azides, cycloalkenes, cycloalkynes, cyclopropanes, isonitriles, vinyl boronic acid, tetrazine, maleimide, alcohols, thiols, conjugated dienes, copper acetylide, nitrones, aldehydes, ketones, alkoxyamines, hydroxylamine, hydrazine, hydrazide, isothiocyanate, carbodiimide, and carboxylic acids or derivative thereof, esters, anhydrides, N-hydrosuccinimide (NHS), tosyl and acyl halides, or
2) cyclodextrin, 2,2,3,3-tetrafluoropropyloxy-substituted phthalocyanine or derivatives thereof, or
3) capturing biological molecules, primary, secondary antibodies or fragments thereof against certain proteins to be detected, or their corresponding antigens, enzymes or their substrates, short peptides, specific polynucleotide sequences, which are complimentary to the sequences of DNA to be detected, aptamers, receptor proteins or molecularly imprinted polymers.

10. The method of claim 9, wherein selectivity of the sensors is altered by changing the chemical identity of said at least one chemical or biomolecular layer.

11. The method of claim 1, wherein said compounds are selected from:
hydrocarbons;
alcohols;
enantiomers, spatial and structural isomers of organic compounds;
industrial solvents;
fuel oxygenates;
by-products produced by chlorination in water treatment;
petroleum fuels, hydraulic fluids, paint thinners, and dry-cleaning agents;
common ground-water contaminants;
isoprene, terpenes, pinene isomers and sesquiterpenes;
regulated ozone-depleting chlorinated hydrocarbons;
food toxins, aflatoxin, shellfish poisoning toxins, saxitoxin or microcystin;
neurotoxic compounds, methanol, manganese glutamate, nitrix oxide, tetanus toxin or tetrodotoxin, Botox, oxybenzone, Bisphenol A, or butylated hydroxyanisole;
explosives, picrates, nitrates, trinitro derivatives, 2,4,6-trinitrotoluene (TNT), 1,3,5-trinitro-1,3,5-triazinane (RDX), trinitroglycerine, N-methyl-N-(2,4,6-trinitrophenyl) nitramide (nitramine or tetryl), pentaerythritol tetranitrate (PETN), nitric ester, azide, derivates of chloric and perchloric acids, fulminate, acetylide, and nitrogen rich compounds, tetrazene, octahydro-1,3,5,7-tetranitro-1,3,5,7-tetrazocine (HMX), peroxide, triacetone trioxide, C4 plastic explosive and ozonidesor, or an associated compound of said explosives, decomposition gases or taggants, and
biological pathogens, a respiratory viral or bacterial pathogen, an airborne pathogen, a plant pathogen, a pathogen from infected animals or a human viral pathogen.

12. The method of claim 1, wherein said external memory is a mobile device, wearable gadget, smartphone, smartwatch, desktop computer, server, remote storage, internet storage or internet cloud, or said external memory comprises a processor, a microcontroller or a memory-storing controller suitable for storing executable instructions, which when executed by the processor cause the processor to perform the machine-learning method on the measurement results.

13. The method of claim 1, wherein said string or said array of measurements from each said sensor on each said layer of the layered separating medium are generated from a spectrogram or chromatogram of the sample.

14. The method of claim 1, wherein said machine-learning method is suitable for employing a neural network selected from a fully connected neural network, a convolutional neural network, a recurrent neural network, a ResNet neural network and a neural network with attention heads, or said machine-learning method further comprises training of a neural network, on which said method is employed.

15. The method of claim 1, wherein said input is further treated with a wavelet transform with the different number of hidden long short-term memory layers (LSTM) of a neural network.

16. A system for detection and analysis of chemical compounds in a sample subjected to a chromatographic separation on a layered separating medium, said system comprising:
(a) said layered separating medium for chromatographic separation of the compounds contained in the sample and for providing physical support for an embedded electronics and detector;
(b) said detector comprising an array of sensors printed on each layer of said separating medium, and providing information on the presence and properties of said compounds in the sample;
(c) said embedded electronics printed on each layer of said separating medium and comprising at least one of the following:
(1) a voltage source connected to said detector and said chemical sensors via a microelectronic circuit for supplying electric current to said detector and sensors;
(2) an integrated or CMOS current amplifier connected to said voltage source for amplification of an electric current obtained from said detector and said sensors;
(3) an analogue-to-digital converter (ADC) with inbuilt digital input/output card connected to said current amplifier for outputting the converted signal to the external memory; and
(4) a wired or wireless connection module for connecting said system to said external memory;
and
(d) an external memory.

17. The system of claim 16, wherein the connection module is a wireless connection module for wireless connection of said system with the external memory, and wherein said external memory comprises another wireless connection module connecting said system to a user interface via a digital-to-analogue converter (DAC).

18. The system of claim 16, wherein communication between the sensors and the external memory is either:
passive, and the system is configured to perform a spectral encoding of information using a single radiative structure with multiple resonators each of which is dedicated either to a bit encoding or to a sensor readout, or
active, and the system is configured to carry out a parallel route for powering and communicating between the sensors and external memory using a semiconductor device,
or combination thereof.

19. The system of claim 16, further comprising at least one of the following:
(i) a feedback control microcontroller unit (MCU) for energy level adjustment and de-trapping via an external or integrated gate electrode;
(ii) a harvester for harvesting energy of the system;
(iii) a power management unit (PMU) for transforming said harvested energy and powering an analogue readout of the sensors;

(iv) an analogue front-end;

(v) a gate electrode for discharging parasitic electric current;

(vi) a remote powering with miniaturised receiver antenna;

(vii) at least one radio-frequency identification (RFID) out-input tag for remote readout and zero-power operation, each RFID tag connected to said embedded electronics via an electric circuit for receiving or transmitting a signal;

(viii) a diode input-output separator to separate polarities in the electric circuit; and (ix) an integrated circuit for storing and processing the signal, and for modulating and demodulating radio-frequency (RF) signals.

20. The system of claim 16, wherein the external memory is a mobile device, wearable gadget, smartphone, smartwatch, desktop computer, server, remote storage, internet storage or internet cloud, or the external memory comprises a processor, a microcontroller or a memory-storing controller suitable for storing executable instructions, which when executed by the processor cause the processor to perform the machine-learning method on the measurement results.

* * * * *